United States Patent
Mi et al.

(10) Patent No.: US 9,240,516 B2
(45) Date of Patent: Jan. 19, 2016

(54) HIGH EFFICIENCY BROADBAND SEMICONDUCTOR NANOWIRE DEVICES

(71) Applicant: THE ROYAL INSTITUTION FOR THE ADVANCEMENT OF LEARNING/MCGILL UNIVERSITY, Montreal (CA)

(72) Inventors: Zetian Mi, Quebec (CA); Md Golam Kibria, Quebec (CA)

(73) Assignee: The Royal Institution for the Advancement of Learning/McGill University, Montreal, Quebec (CA)

(*) Notice: Subject to any disclaimer, the term of this patent is extended or adjusted under 35 U.S.C. 154(b) by 0 days.

(21) Appl. No.: 14/798,860

(22) Filed: Jul. 14, 2015

(65) Prior Publication Data

US 2015/0325743 A1    Nov. 12, 2015

Related U.S. Application Data

(63) Continuation of application No. 13/866,155, filed on Apr. 19, 2013, now Pat. No. 9,112,085, which is a continuation-in-part of application No. 13/370,449, filed on Feb. 10, 2012, now Pat. No. 8,669,544, and a (Continued)

(51) Int. Cl.
*H01L 29/08* (2006.01)
*H01L 33/06* (2010.01)
(Continued)

(52) U.S. Cl.
CPC .............. *H01L 33/06* (2013.01); *H01L 27/153* (2013.01); *H01L 31/03044* (2013.01); *H01L 31/035218* (2013.01); *H01L 31/0735* (2013.01); *H01L 33/0025* (2013.01); *H01L 33/14* (2013.01); *H01L 33/18* (2013.01); *H01L 33/32* (2013.01); *H01S 5/34333* (2013.01); *H01S 5/34346* (2013.01); *H01S 5/4025* (2013.01)

(58) Field of Classification Search
CPC .......................... H01L 29/0665; B28Y 10/00
USPC .................. 257/9, E29.005, E21.09; 438/478
See application file for complete search history.

(56) References Cited

U.S. PATENT DOCUMENTS 7,335,908 B2 * 2/2008 Samuelson ............ B82Y 10/00
                                                                   257/12
7,432,522 B2 * 10/2008 Samuelson ............ B82Y 10/00
                                                                   257/12

(Continued)

*Primary Examiner* — Jami M Valentine
(74) *Attorney, Agent, or Firm* — Rosenberg, Klein & Lee

(57) ABSTRACT

Amongst the candidates for very high efficiency electronics, solid state light sources, photovoltaics, and photoelectrochemical devices, and photobiological devices are those based upon metal-nitride nanowires. Enhanced nanowire performance typically require heterostructures, quantum dots, etc which requirement that these structures are grown with relatively few defects and in a controllable reproducible manner. Additionally flexibility according to the device design requires that the nanowire at the substrate may be either InN or GaN. Methods of growing relatively defect free nanowires and associated structures for group IIIA-nitrides are presented without the requirement for foreign metal catalysts, overcoming the non-uniform growth of prior art techniques and allowing self-organizing quantum dot, quantum well and quantum dot-in-a-dot structures to be formed. Such metal-nitride nanowires and quantum structure embedded nanowires support a variety of devices including but not limited to very high efficiency electronics, solid state light sources, photovoltaics, and photoelectrochemical devices, and photobiological devices.

15 Claims, 48 Drawing Sheets

Related U.S. Application Data continuation-in-part of application No. 12/956,039, filed on Nov. 30, 2010, now Pat. No. 8,563,395.

(60) Provisional application No. 61/767,840, filed on Feb. 22, 2013, provisional application No. 61/728,310, filed on Nov. 20, 2012, provisional application No. 61/635,965, filed on Apr. 20, 2012, provisional application No. 61/558,483, filed on Nov. 11, 2011, provisional application No. 61/441,310, filed on Feb. 10, 2011, provisional application No. 61/264,905, filed on Nov. 30, 2009.

(51) Int. Cl.

| | |
|---|---|
| *H01L 33/32* | (2010.01) |
| *H01L 33/00* | (2010.01) |
| *H01L 33/14* | (2010.01) |
| *H01S 5/343* | (2006.01) |
| *H01L 33/18* | (2010.01) |
| *H01S 5/40* | (2006.01) |
| *H01L 27/15* | (2006.01) |
| *H01L 31/0735* | (2012.01) |
| *H01L 31/0304* | (2006.01) |
| *H01L 31/0352* | (2006.01) |

(56) References Cited

U.S. PATENT DOCUMENTS

| | | | | |
|---|---|---|---|---|
| 7,569,847 | B2 * | 8/2009 | Majumdar | B82Y 10/00 257/12 |
| 7,608,147 | B2 * | 10/2009 | Samuelson | B82Y 10/00 117/12 |
| 7,829,443 | B2 * | 11/2010 | Seifert | B82Y 10/00 257/E21.09 |
| 8,563,395 | B2 * | 10/2013 | Mi | B82Y 10/00 257/E21.108 |
| 8,565,281 | B2 * | 10/2013 | Kambhampati | B82Y 20/00 372/69 |
| 2004/0213307 | A1 * | 10/2004 | Lieber | B82Y 10/00 372/39 |
| 2006/0125056 | A1 * | 6/2006 | Samuelson | C30B 11/12 257/613 |
| 2006/0273328 | A1 * | 12/2006 | Niu | H01L 33/20 257/79 |
| 2007/0037414 | A1 * | 2/2007 | Yamauchi | B82Y 10/00 438/800 |
| 2010/0006817 | A1 * | 1/2010 | Ohlsson | B82Y 20/00 257/13 |
| 2011/0146774 | A1 * | 6/2011 | Kim | H01L 27/1446 136/255 |

* cited by examiner

PRIOR ART

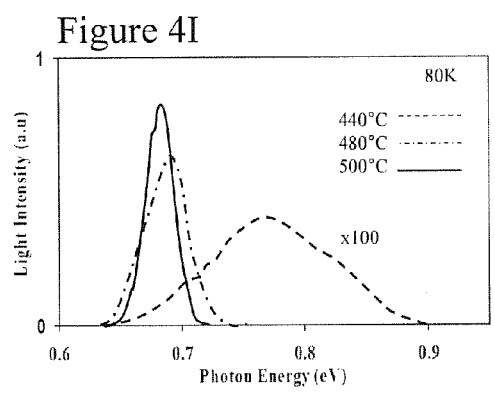
Figure 4I
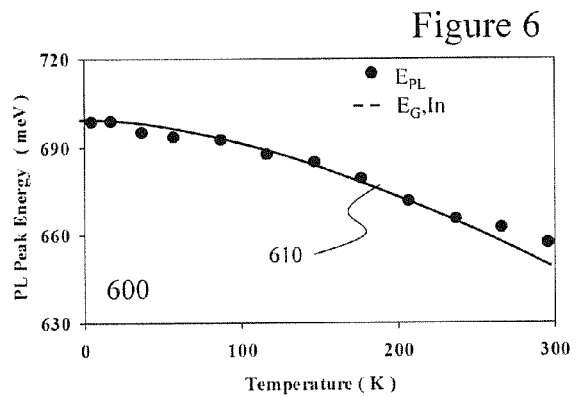
Figure 6
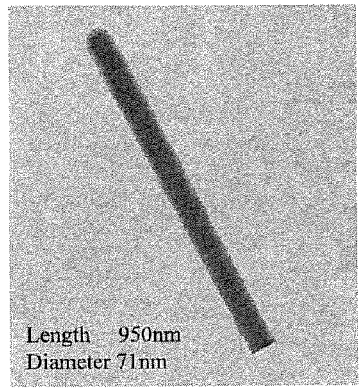
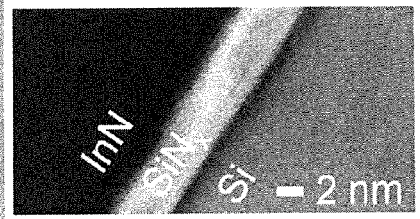
Figure 4K
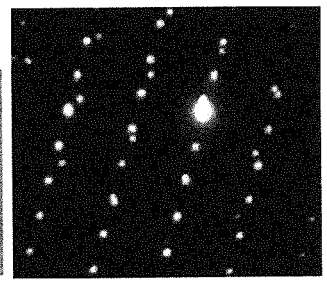
Figure 4L
Figure 4J

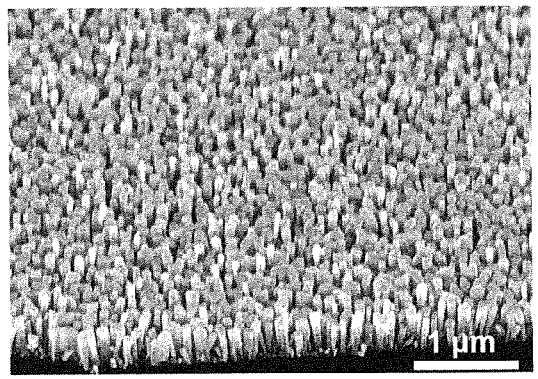
Figure 20A
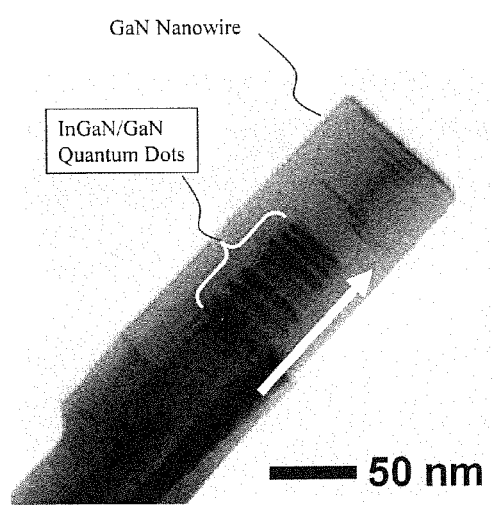
Figure 20B
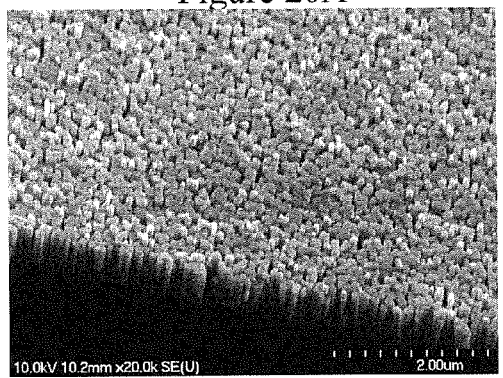

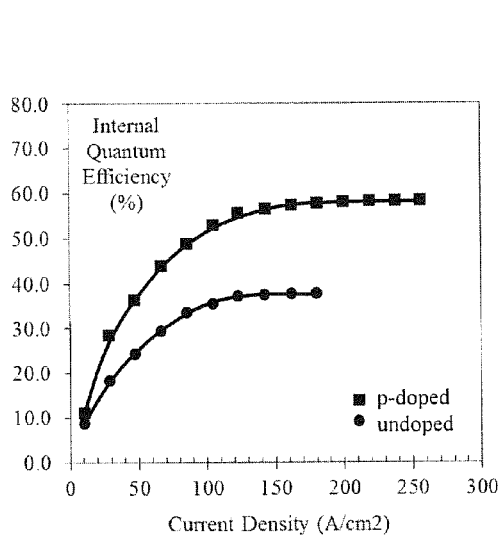
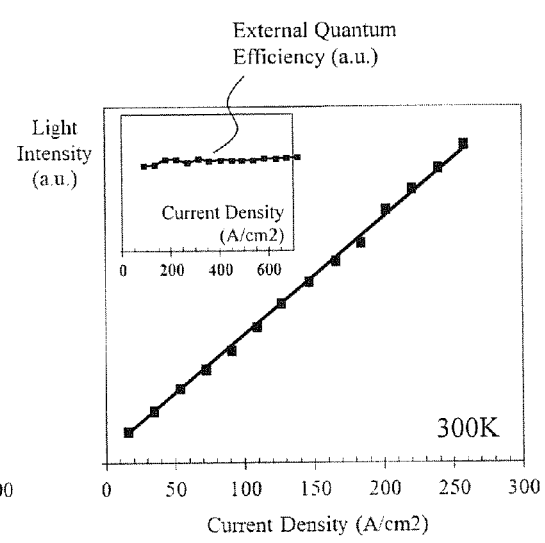
Figure 28
Figure 29

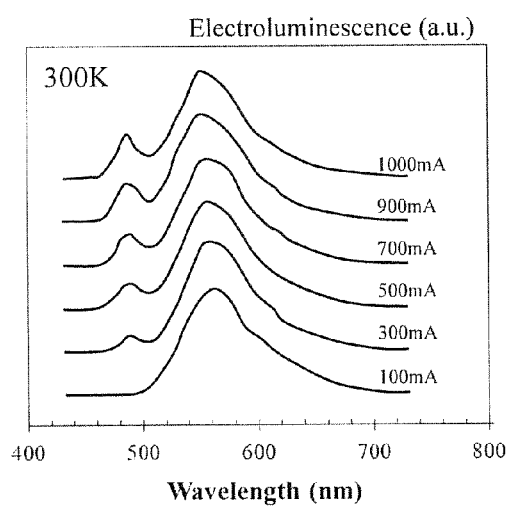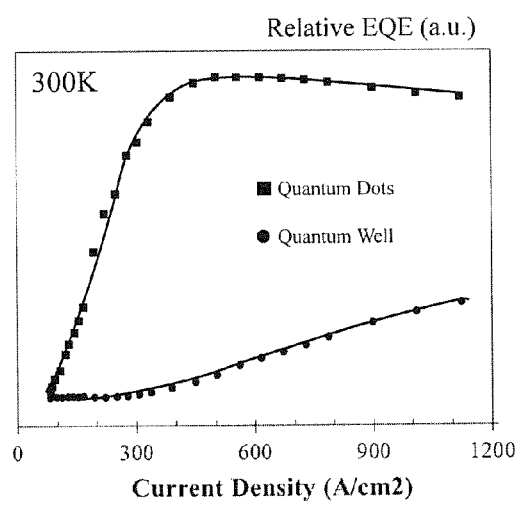
Figure 34
Figure 35

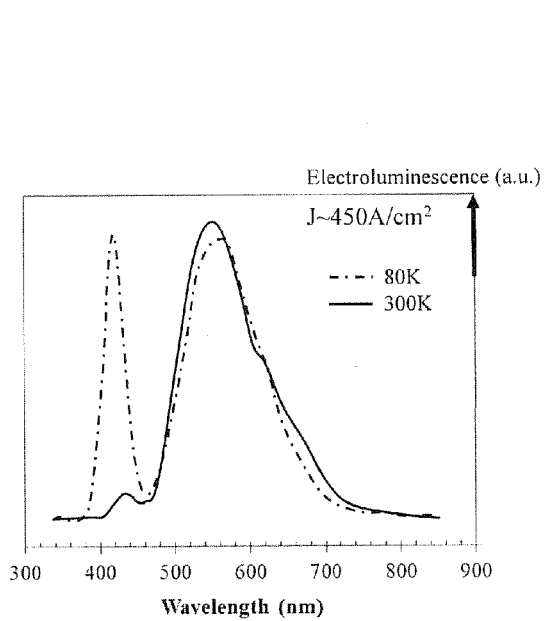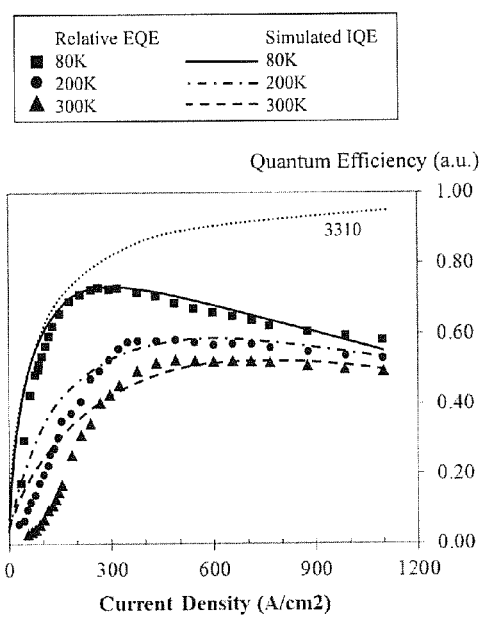
Figure 36
Figure 37

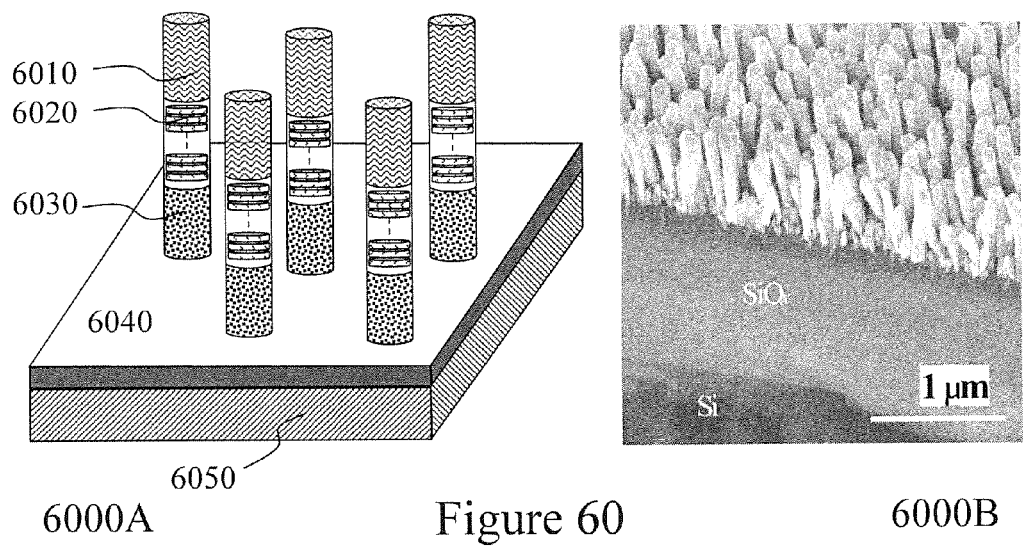
Figure 60
Figure 61
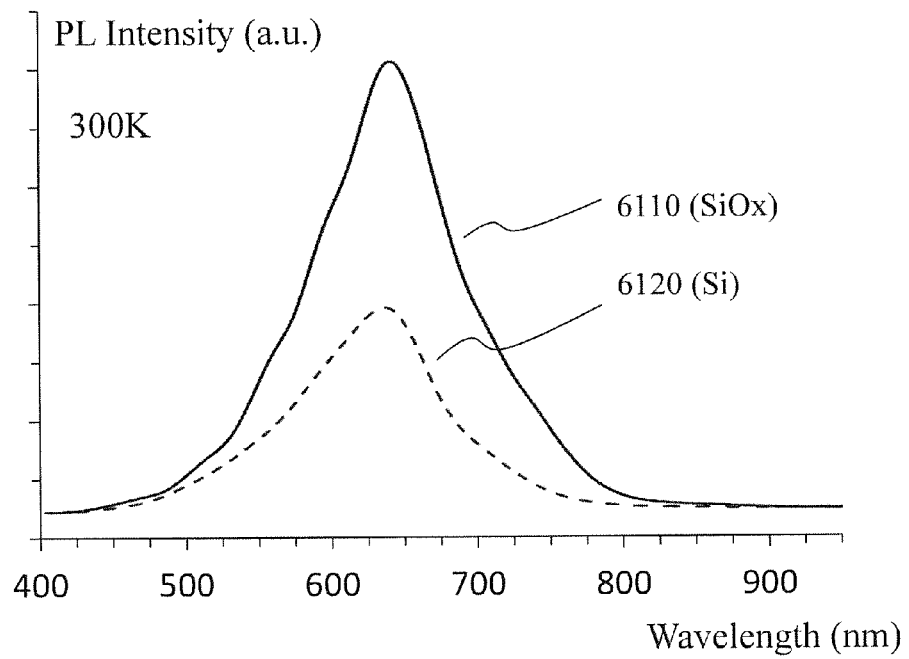

HIGH EFFICIENCY BROADBAND SEMICONDUCTOR NANOWIRE DEVICES

CROSS-REFERENCE TO RELATED APPLICATIONS

This patent application is being filed as a Continuation Application of U.S. patent application Ser. No. 13/866,155 filed Apr. 19, 2013 entitled "High Efficiency Broadband Semiconductor Nanowire Devices", currently pending.

Patent application Ser. No. 13/866,155 claims the benefit of U.S. Provisional Patent Application 61/767,840 filed Feb. 22, 2013 entitled "One Step Overall Water Splitting under Visible Light using Multiband InGaN/GaN Nanowire Heterostructures."

Patent application Ser. No. 13/866,155 claims the benefit of U.S. Provisional Patent Application 61/728,310 filed Nov. 20, 2012 entitled "GaN Nanowires on Silicon Oxide."

Patent application Ser. No. 13/866,155 claims the benefit of U.S. Provisional Patent Application 61/635,965 filed Apr. 20, 2012 entitled "Photocatalytic Water Splitting Nanowire Devices and Methods of Fabricating Arrays."

Patent application Ser. No. 13/866,155 is a continuation-in-part of U.S. patent application Ser. No. 13/370,449 filed Feb. 10, 2012 entitled "High Efficiency Broadband Semiconductor Nanowire Devices and Methods of Fabricating without Foreign Metal Catalysis", issued as U.S. Pat. No. 8,669,544 on 11 Mar. 2014, which itself claims priority from U.S. Provisional Patent Application 61/441,310 filed on Feb. 10, 2011 entitled "High Efficiency Broadband Semiconductor Nanowire Devices and Methods of Fabricating without Foreign Metal Catalysts" and U.S. Provisional Patent Application 61/558,483 filed on Nov. 11, 2011 entitled "High Efficiency Broadband Semiconductor Nanowire Devices and Methods of Fabricating without Foreign Metal Catalysts".

Patent application Ser. No. 13/866,155 is a continuation-in-part of U.S. patent application Ser. No. 12/956,039 filed Nov. 30, 2010 entitled "Method of Growing Uniform Semiconductor Nanowires without Foreign Metal Catalyst and Devices Thereof", issued as U.S. Pat. No. 8,563,395 on 22 Oct. 2013, which itself claims priority from U.S. Provisional Patent Application 61/264,905 filed Nov. 30, 2009 entitled "Method of Growing Semiconductor Nanowires without Foreign Metal Catalyst and Devices Thereof".

Each of these prior patent applications and provisional patent applications being included within the instant patent application in their entirety by the applicable cross-reference.

FIELD OF THE INVENTION

This invention relates to semiconductor nanowire devices and more specifically to nanowires grown without foreign metal catalysis, nanowires with self-aligned quantum structures, nanowire based photonic devices, and nanowire based chemical and biologically active devices.

BACKGROUND OF THE INVENTION

The ability to generate and manipulate light with electricity by Sir Humphrey Davy 200 years ago sparked a century of development by the likes of Thomas Edison, Joseph Swan, Sandor Just (tungsten filaments), and Irving Langmuir (inert gas instead of vacuum) leading to the establishment 100 years ago of tungsten filament lamps, which as the dominant light source have fundamentally shifted how people live, work, play. However, the efficiency of such light sources is woefully low. For example a 60 W incandescent light is only 2.1% efficient, a quartz halogen only 3.5%, in terms of generating light within the visible spectrum of the human eye. Accordingly today there is a massive worldwide campaign to have incandescent lights replaced wherever possible by compact fluorescent lights (CFL) which have an efficiency of approximately 22% thereby reducing energy consumption significantly.

However, whilst CFLs provide an immediate and visible statement by Governments and other organizations worldwide that they are addressing global climate change, environmental issues etc they are not a panacea. Amongst the disadvantages of fluorescent lights are frequent switching limiting lifetime, health and safety from the mercury content, UV emissions which affect some materials, flicker affecting individuals with autism, epilepsy, lupus, chronic fatigue syndrome, and vertigo, radio interference, operating temperature where efficiency drops with increasing/decreasing temperature from room temperature, non-operation at below freezing, low-luminance requiring long tubes and limiting power output, dimming, and recycling through the phosphor and mercury.

However, a monochromatic solid state light source within the visible wavelength range can achieve in principle an efficiency approaching 100%. Additional to energy consumption such solid state light sources should also reduce consumption of precious metals, reduce recycling as well as address health and safety issues. Beneficially solid state light sources by virtue of their small size, low weight, and low voltage operation can also be employed in a wide range of situations where incandescent or CFL lights cannot. At present niche applications such as holiday decorations in conjunction with indicator lighting in panels, back lighting in LCD displays etc mean that solid state lighting sales today account for only approximately 2% of the current lighting market and will grow to only approximately 3% in 2011.

Despite this solid state lighting is a massive market which according to NextGen Research ("LEDs and Laser Diodes: Solid State Lighting Applications, Technologies, and Market Opportunities", February 2009, http://www.nextgenresearch.com/research/1001995-LEDs_and_Laser_Diodes) forecasts the overall solid-state lighting (SSL) market will achieve worldwide revenues topping $33 billion by 2013. The illumination segment of the LED market will see compound annual growth rate (CAGR) of nearly 22% in the 2009-2013 timeframe as cities worldwide shift their streetlights to these more energy-efficient and ecologically friendly solutions. However, the majority of this growth will be generated from niche lighting applications including architectural, task lighting, medical and off-grid lighting applications rather than the residential lighting market according to The Strategy Analytics ("LED Device and Material Market Trends", June 2009, http://www.strategyanalytics.com/default.aspx?mod=ReportAbstract Viewer&a0=4788).

As such the majority of the lighting market remains inaccessible despite the considerable research effort and investment have been expended. This arises due to the challenges in realizing suitable LED technologies and devices using conventional quantum well structures, these including the relatively low internal quantum efficiency of these structures, the low light extraction efficiency realized, and relatively high device fabrication costs. Additionally to achieve a "white" LED today the devices will generally employ a phosphor-conversion scheme, which sets the ultimate quantum efficiency of white LEDs to below 65%. In this regard, the high luminescence efficiencies, low fabrication costs, and processability of semiconductor nanostructures, including quantum dots and nanowires, have made them promising candidates for future lighting devices and the subject of considerable research and development.

With the recent discovery that the band gap of indium nitride (InN) at approximately 0.7-0.8 eV, see for example J. Yu et al in "Unusual Properties of the Fundamental Band Gap of InN," (Appl. Phys. Lett., Vol. 80, p. 4741, 2002) and T. Matsuoka in "Optical Bandgap Energy of Wurtzite InN" (Appl. Phys. Lett., Vol. 81, p. 1246, 2002), the epitaxial growth and characterization of InN nanowires and whiskers has become the focus of significant research, including for example T. Stoica et al in "MBE Growth Optimization of InN Nanowires" (J. Crystal Growth, Vol. 290, p. 241, 2006), R. Calarco et al in "GaN and InN Nanowires Grown by MBE: A Comparison" (Appl. Phys. A, Vol. 87, p. 499, 2007), C-Y Chang et al in "Electrical Transport Properties of Single GaN and InN Nanowires" (J. Elect. Materials, Vol. 35, No. 4, p. 738, 2006), F. Werner et al "Electrical Conductivity of InN Nanowires and the Influence of the Native Indium Oxide Formed at Their Surface" (Nano. Lett., Vol. 9, p. 1567, 2009) and J. Grandal et al "Accommodation Mechanism of InN Nanocolumns Grown on Si (111) Substrates by Molecular Beam Epitaxy" (Appl. Phys. Lett., Vol. 91, 021902, 2007).

When compared to other nitrides with group IIIA elements including aluminum, gallium and boron, InN exhibits the highest electron mobility (4400 $cm^2V^{-1} s^{-1}$ at 300 K), the smallest effective mass, and the highest saturation velocity. These properties make InN an excellent candidate for next generation of nanophotonic and nanoelectronic devices, including chip level nanoscale lasers and high-speed field effect transistors. Additionally, the band gap of InN at approximately 0.7 eV (1750 nm) when compared with GaN at approximately 3.3 eV (370 nm) means that the ternary alloy InGaN can be continuously tuned from approximately 0.7 to 3.3 eV, matching almost perfectly to the solar spectrum. Therefore, InGaN has also emerged as a promising material for future high-efficiency full solar spectrum solar cells, E. Trybus et al "InN: A Material with Photovoltaic Promise and Challenges" (*J. Crystal Growth*, Vol. 288, p. 218, 2006) as well as for broadband light sources (e.g. white LEDs or UV/visible and visible/IR LEDs).

It should be apparent to one skilled in the art that in order to provide broadband spectrum photonic devices that it should be structured so that the material at the front of the device emits/absorbs the shortest wavelengths and progressively longer wavelengths are emitted/absorbed by layers within the solar cell towards the lower most surface. As such, the material within a broadband device may grade from $In_xGa_{1-x}N$ where x≈1 to $In_yGa_{1-y}N$ where y≈0, or a limited range therein. As such it is necessary to grow $In_xGa_{1-x}N$ nanowires onto the substrate of the photonic device.

Within the prior art $In_xGa_{1-x}N$ nanowires have been predominantly grown using the conventional approach of a foreign metal catalyst via the vapor-liquid-solid growth mechanism, see for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, p. 22, (2002) and X. Cai et al in "Straight and Helical InGaN Core-shell Nanowires with a High In Core Content" (Nanotechnology, Vol. 17, p. 2330, 2006). They have also been formed spontaneously under nitrogen rich conditions; see for example C-K Chao et al "Catalyst Free Growth of Indium Nitride Nanorods by Chemical Beam Epitaxy" (Appl. Phys. Lett., Vol. 88, p. 233111, 2006) and S. Hersee et al in U.S. Pat. No. 7,521,274 entitled "Pulsed Growth of Catalyst-Free Growth of GaN Nanowires and Application in Group IIIA Nitride Semiconductor Bulk Material."

Whilst the influence of growth parameters on the structural and optical properties of $In_xGa_{1-x}N$ nanowires has also been extensively studied, epitaxial InN nanowires grown according to the prior art exhibit tapered morphology, with a large variation in the wire diameter along the wire length, see for example T. Stoica et al in "MBE Growth Optimization of InN Nanowires" (J. Crystal Growth, Vol. 290, p. 241, 2006) and J. Grandal et al "Accommodation Mechanism of InN Nanocolumns Grown on Si (111) Substrates by Molecular Beam Epitaxy" (Appl. Phys. Lett., Vol. 91, p. 021902, 2007), and demonstrated spectral linewidths for these InN nanowires are commonly in the range of 60-100 meV. The extremely large inhomogeneous broadening observed makes it difficult to study the fundamental properties of InN, including the temperature dependence of the band gap and the electron concentration. Additionally, the poorly defined wire geometry leads to uncontrolled electrical and optical properties, severely limiting their device applications.

Further the direct growth of $In_xGa_{1-x}N$ on silicon, the most suitable substrate for $In_xGa_{1-x}N$ in terms of lattice and thermal mismatches, has been further complicated by the development of an amorphous $SiN_x$ layer during the initial stage of growth, see J. Grandal et al. Attempts to adjust these growth techniques, either by the intentional introduction of hydrogen or buffer layers, such as GaN or AlN, have met with limited success.

The prior art whilst demonstrating $In_xGa_{1-x}N$ nanowires can be grown has not yet demonstrated them with high quality and constant cross-section nor have they been grown on suitable substrates for low cost semiconductor processing. These developments to date being hindered to a large extent by the relatively low decomposition temperature of InN (approximately 500° C.-550° C.) as well as the very high migration rate of indium. Additionally, the prior art does not provide an effective means to control the growth and properties of InN nanowires spontaneously formed under nitrogen rich conditions.

Accordingly it would be beneficial to provide a means of growing high quality, uniform $In_xGa_{1-x}N$ nanowires directly upon silicon substrates without the requirement for predeposition of a catalyst. It would be of further benefit for the growth rate and properties of the $In_xGa_{1-x}N$ nanowires to be controlled through the parameters of the growth process and for the growth to continue despite the growth of the $SiN_x$ layer.

It would be of further benefit for the growth rate and properties of InN and InGaN nanowires to be controlled through the parameters of the growth process and for the growth to continue despite the growth of the $SiN_x$ layer. As discussed supra graded InGaN nanowire structures would allow full solar spectrum solar cells to be implemented with a single growth process thereby greatly increasing the efficiency of solar cells and reducing their costs.

As discussed supra graded InGaN nanowire structures would allow broad spectrum photonic devices to be implemented with a single growth process thereby greatly increasing the efficiency of solar cells, white LEDs etc and reducing their costs. In solid state lighting applications the ultimate goal is a high efficiency white LED, typically operating from approximately 400 nm to approximately 750 nm. However, according to the prior art simple LED structures whilst offering a fairly broad wavelength range operate at relatively low efficiencies and typically employ three LED devices are required to even cover a substantial portion of the wavelength range to which the human eye responds, the so-called visible wavelength range, which is 380 nm to 750 nm. As such red, green and blue centered LED devices are typically used to create the impression of white. Blue LEDs were the last to be developed based upon InGaN structures. These blue LEDs also form the basis of phosphor based white LEDs. However, increasing the efficiency of LEDs by the introduction of quantum confined structures, such as quantum wells, multi-quantum wells etc also results in a narrowing of the optical emission from the source thereby requiring that number of sources required to "blend" together for the desired white light increases, along with the cost and complexity of the devices overall.

It is within this context that semiconductor quantum dots, nanometer sized semiconductor particles which act as a very small "box" for electrons, and potentially the most efficient light sources ever developed have formed the subject of significant research. A specific class of quantum dot is the colloidal quantum dot created by solution phase chemistry. Much of the appeal of the colloidal quantum dot is that it can be readily integrated with other technology platforms at very low cost and that by varying the physical dimensions of the quantum dots they can be made to emit at points across the entire visible spectrum. Accordingly providing colloidal quantum dots with a range of dimensions within the same localized region acts to provide the required multiple sources to "blend" together to provide the illusion of a white light source. Recent work by R. R. Cooney et al entitled "Gain Control in Semiconductor Quantum Dots via State-Resolved Optical Pumping" (Phys. Rev. Lett., Vol. 102, 127404, 2009) has shown that quantum dots are in fact the most efficient material for generating gain ever measured. The use of quantum dots as white light emitters and in LEDs has also been proposed and demonstrated, see for example S. Sapra et al (Adv. Mater., Vol. 19, p. 569, 2007), M. J. Bowers et al (J. Am. Chem. Soc., Vol. 127, p. 15378, 2005), S. Coe et al (Nature, Vol. 420, p. 800, 2002), N. Tessler et al (Science, Vol. 295, p. 1506, 2002), and M. C. Schlamp et al (J. Appl. Phys., Vol. 82, p. 5837, 1997).

However, whilst colloidal quantum dots are themselves efficient an optical emitter employing them can only be efficient if the colloidal quantum dots are optically pumped with an efficient emitter at the appropriate wavelength. As noted supra InGaN nanowire structures can form the basis for very high efficiency emitters that cover the wavelength range from near UV (370 nm) to the near infra-red (1750 nm).

Accordingly it would be beneficial to provide a combination of colloidal quantum dots with high quality, uniform InGaN nanowires that can be grown directly upon silicon substrates without the requirement for predeposition of a catalyst. Such a combination beneficially combines high efficiency InGaN based nanowire LEDs for pumping highly efficient colloidal quantum dot emitters which when formed from multiple dimensions yield emission across the visible spectrum, thereby providing a high efficiency "white" LED.

To date significant progress has been made in demonstrating blue and blue-green LEDs using InGaN to create the third LED within a red-green-blue combination (RGB) approach in forming a white LED. LEDs for the remainder of the RGB combination being manufactured typically from AlGaInP and GaAsP based quaternary semiconductor systems for yellow-orange LEDs and GaAsP and AlGaAs for red LEDs. However, as noted supra InGaN allows bandgap tuning across the visible spectrum and into the UV/infrared. Within the prior art InGaN/GaN LEDs have exhibited very low internal quantum efficiencies in the green, yellow and red wavelength ranges, see for example P. T. Barletta et al (Appl. Phys. Lett., Vol. 90, p. 151109, 2007) and C. Wetzel et al (MRS Internet J. Nitride Semicond. Res., Vol. 10, p. 2, 2005). One of the primary causes for this low efficiency is the strain-induced polarization field in InGaN/GaN quantum wells and the resulting quantum confined Stark effect, which leads to a spatial charge separation.

In this regard, InGaN/GaN quantum dot heterostructures have drawn considerable attention; see for example K. Tachibana et al (IEEE J. Sel. Top. Quantum., Vol. 6, p. 475, 2000), N. Grandjean et al (Proc. IEEE, Vol. 95, p. 1853, 2007) and Q. Wang et al (Appl. Phys. Lett., Vol. 93, p. 081915, 2008). This is based upon their providing strong carrier confinement and being identified, although with some debate, as the emission mechanism for the high efficiency InGaN blue and blue-green LEDs and lasers. However, to date three-dimensional InGaN/GaN quantum dot heterostructures obtained by self-organization using Stranski-Krastanow growth or phase segregation induced In-rich clusters have yielded similar results to bulk planar InGaN/GaN quantum well heterostructures. As such high efficiency long wavelength (>550 nm) emission has been severely limited by the presence of large densities of misfit-dislocations related to the large lattice mismatch (approximately 11%) between InN and GaN. However, significantly reduced defect densities can be achieved in InGaN nanowire heterostructures, due to the effective lateral strain relaxation, see Y. Chang et al in "Molecular Beam Epitaxial Growth and Characterization of Non-Tapered InN Nanowires on Si(111)" (Nanotechnology, Vol. 20, p. 345203, 2009). This reduced strain distribution also leads to a weaker piezoelectric polarization field.

As noted supra InGaN nanowires offer advantages for LED manufacturing, including high light extraction efficiency and the compatibility with low cost, large area Si substrates, see Y. Chang et al (Appl. Phys. Lett., Vol. 96, p. 013106, 2010), and can form the basis of either discrete LEDs or LED based white LEDs in combination with colloidal quantum dots. However, to date such nanowire structures have reported extremely low internal quantum efficiency (<10%), due to the lack of effective carrier confinement in the wire axial direction as well as the nonradiative recombination associated with the presence of surface states. However, with the ability to form nearly defect-free InGaN nanowires as discussed supra then it is proposed that InGaN quantum dots directly embedded in InGaN nanowires would provide a route to realizing high efficiency green and red emission sources. Within the prior art no such nanoscale heterostructures have been reported.

According to embodiments of the invention based upon the ability to form defect-free InGaN nanowires directly onto silicon substrates without foreign metal catalysts it would be beneficial to modify the growth process such that nearly defect-free InGaN/GaN dot-in-a-wire heterostructures on silicon could be implemented. Further, by varying the growth parameters to adjust the In composition within the InGaN quantum dots these high efficiency optical emitters (approximately 45%) may be beneficially tuned to emit within the green, yellow, and amber/red regions of the visible spectrum to compliment the already existing blue and blue-green emission sources. Beneficially the nearly defect-free growth permits the formation of In-rich nanoclusters to form through phase separation within the InGaN quantum dot, such that these high efficiency optical emitters are further implemented by a unique dot-within-a-dot-in-a-wire structure rather than a prior art dot-in-a-wire approach.

Additionally, if multiple quantum dots are incorporated with high quality, uniform InGaN nanowire geometries vertically such that the InGaN nanowire device actually monolithically stacks multiple, for example blue, green and red, emitters in a single device which can then be realised with a single epitaxial growth sequence. Beneficially embodiments of the invention therefore allow for phosphor-free white LEDs that can be fabricated on low cost, large area substrates with high luminous flux.

Although progress has been made for InGaN/GaN quantum well LEDs, the performance of such devices in the green, yellow, and red wavelength ranges has been plagued by the very low efficiency, as outlined supra, and "efficiency droop", i.e. the decrease of the external quantum efficiency with increasing current. The underlying mechanism has been extensively investigated and includes factor such as defects and carrier delocalization, polarization field, Auger recombination, carrier leakage, and poor hole transport. To this end, intensive studies have been performed with the use of various nanostructures, including quantum dots and nanowires, which can exhibit significantly reduced dislocation densities and polarization field and provide a greater degree of flexibility for sophisticated device engineering, compared to conventional planar heterostructures. Multi-color emission has been realized by using InGaN/GaN core-multi-shell and well/disk-in-a-wire structures and by exploring various hybrid nanowire heterostructures, see for example "Fabrication of a High-Brightness Blue-Light-Emitting Diode Using a ZnO-Nanowire Array Grown on p-GaN Thin Film" by X. M. Zhang et al (Adv. Mater. 2009, Vol. 21, p. 2767, 2009) and "GaN/In$_x$Ga$_{1-x}$N//ZnO Nanoarchitecture Light Emitting Diode Microarrays" by C-H Lee et al (Appl. Phys. Lett., Vol. 94, p. 213101, 2009).

More recently, white light emission has been demonstrated in LEDs consisting of compositionally graded InGaN nanowires (see for example "Catalyst-Free InGaN/GaN Nanowire Light Emitting Diodes Grown on (001) Silicon by Molecular Beam Epitaxy" by W. Guo et al, Nano Lett., Vol. 10, p. 3355, 2010), InGaN/GaN nanodisks (see for example "InGaN/GaN Nanorod Array White Light-Emitting Diode" by H-W Lin et al, Appl. Phys. Lett. Vol. 97, p. 073101, 2010), and etched InGaN quantum wells ("High Performance InGaN/GaN Nanorod Light Emitting Diode Arrays Fabricated by Nanosphere Lithography and Chemical Mechanical Polishing Processes" by Y-L Chen, Opt. Express, Vol. 18, p. 7664, 2010).

However, a significant roadblock for the development of nanowire LEDs is the very low quantum efficiency, and the fact that to date, there has been no report on the internal quantum efficiency of GaN-based nanowire LEDs under electrical injection. Direct electrical injection being beneficial for high efficiency to avoid cascading efficiencies of photon generation and then optically pumping the quantum heterostructures. Due to the lack of 3-dimensional carrier confinement, the radiative electron-hole recombination in commonly reported GaN nanowire LED heterostructures has been severely limited by the presence of unoccupied Ga dangling bond and/or large densities of surface defects along the nonpolar GaN surface (m-plane), which can lead to a Fermi-level pinning on the nanowire lateral surfaces. Additionally, the device performance is adversely affected by the poor hole injection and transport processes in InGaN/GaN nanoscale heterostructures, caused by the heavy effective mass, small mobility, and low concentration of holes. While electrons can exhibit a relatively uniform distribution across the entire active region, injected holes largely reside in the small region close to the p-doped GaN layer. The highly non-uniform carrier distribution also lead to significantly enhanced Auger recombination and increased electron overflow, further limiting the optical emission efficiency at high injection levels In this regard, special techniques, including p-doped active region, electron blocking layer, and thin InGaN barriers, have been implemented with the prior art to improve the performance of conventional InGaN/GaN quantum well LEDs. However, such phenomena have not been addressed for nanowire LEDs. Accordingly, in this context, it would be beneficial for there to be a method of growing and fabricating dot-in-a-wire LED heterostructures grown on Si(111) substrates that remove the efficiency bottleneck of nanowire devices. It would be further advantageous if through varying the epitaxial growth process that the superior carrier confinement provided by the dots could be combined with a significantly enhanced hole transport, and that this be achieved in a single epitaxial growth sequence.

Whilst the discussions above have centered to the benefits of high quality uniform nanowires grown without foreign metal catalysts have centered to broadband optical emitters, detectors, and solar cells these benefits of monolithically integrated high quality optical emitters, electrodes, PIN diodes, heterostructures, etc also allow such structures to be exploited in photoelectrochemical processes as well as photocatalysis, for example the generation of hydrogen and oxygen from water through solar energy, as well as other areas including for example electrobiological devices for sensing.

Accordingly it would be beneficial to provide method of combining multiple quantum dots with the high quality, uniform InGaN nanowires that are grown directly upon silicon substrates without the requirement for predeposition of a catalyst. Such a combination beneficially provides for InGaN/GaN dot-within-a-dot based nanowire photonic devices including photodetectors, solar cells, and optical emitters allowing device with high efficiency to be implemented across the entire visible spectrum.

According to embodiments of the invention therefore high efficiency photonic devices for generating high efficiency solid state white light sources or high efficiency solid state broad spectrum photodetectors can be manufactured based upon forming nanowires using a nearly-defect free InN, GaN, or AlN process upon silicon and other substrates that does not require a foreign metal catalyst to be introduced or complex precursor gas control processes to achieve growth which would be incompatible with forming either quantum dot in a wire structures or the quantum dot within a quantum dot within a wire structures for increased efficiency.

Hydrogen production is a large and growing industry where today primary demands from the refinery and ammonia industries have out global production at approximately 53 million metric tons in 2010. The global hydrogen generation market is anticipated to grow from approximately $88 billion in 2011 to approximately $118 billion by 2016 (see ADR Reports "Hydrogen Generation Market—by Merchant & Captive Type, Distributed & Centralized Generation, Application & Technology—Trends & Global Forecasts (2011-2016)", December 2011). Within the ammonia industry the hydrogen is used in the Haber process to produce ammonia ($NH_3$), which is then used directly or indirectly as fertilizer. Within the refinery industry the hydrogen is used to convert heavy petroleum sources into lighter fractions suitable for use as fuels through hydrocracking. However, hydrogen also forms the basis of the so-called "hydrogen economy" which is proposed as a solution to the problems that the current fossil fuel economy generates as well as addressing the post-fossil fuel era where economically viable fossil fuel reserves have been exhausted.

Within the hydrogen economy the exploitation of hydrogen based fuel cells provides for the generation of electricity in either stationary or portable applications via the oxidation of hydrogen. Accordingly, the only byproduct is water. Further, where the hydrogen is generated by electrolysis then the generation of the hydrogen adds no greenhouse gases to the environment. There is a so-called "perfect cycle" in that electrolysis produces hydrogen from water, and the hydrogen recombines with oxygen to create water and electrical power in a fuel cell. As such hydrogen based fuel cells in conjunction with electrolytic hydrogen generation provide for a hydrocarbon free electrical generation process and further when used in conjunction with electrical motors a hydrocarbon free mechanical motion generation process. Further, as hydrogen can be produced anywhere that you have electricity and water then electricity generation can be distributed reducing infrastructure demands and losses in electrical transmission.

Despite the attractiveness of this approach one of the key obstacles is the availability of hydrogen. Currently, global hydrogen production is 48% from natural gas, 30% from oil, and 18% from coal; water electrolysis accounts for only 4%. Clearly using fossil fuel sources negates any environmental benefits of hydrogen as an energy source and even if the hydrogen economy never materializes, the production of hydrogen for industrial consumptions still consumes large amounts of energy. Accordingly, it would be highly beneficial to produce hydrogen using a clean, renewable energy source and hence exploiting broad spectrum high efficiency nanowire based photodetectors/solar cells has significant benefit to hydrogen generation economics and logistics.

Splitting water directly from solar irradiation further allows this to be achieved without the consumption of electric power and accordingly since the initial reporting of the Honda-Fujishima effect using a $TiO_2$/Pt photoelectrochemical cell in the early 1970's the use of semiconductors for photocatalytic water splitting has attracted tremendous interest, see Fujishima et al in "Electrochemical photolysis of water at a semiconductor electrode" (Nature, Vol. 238, pp. 37-38). Semiconductor photocatalytic water splitting generally involves three fundamental processes, these being the band gap absorption of photons and excitation of electron-hole pairs, the separation and migration of these photo-generated charge carriers, and the used of the photo-generated electrons and holes within surface redox reactions Thermodynamically, if the conduction band minimum is more negative than the reduction potential of $H^+/H_2$ (0V versus normal hydrogen electrode (NHE)) and the valence band maximum is more positive than the oxidation potential of $O_2/H_2O$ (1.23V vs. NHE), then water molecules can be reduced by electrons to form $H_2$ and oxidized by holes to form $O_2$ to achieve overall water splitting. Accordingly, in the intervening 40 years the development of photocatalysis for water splitting has primarily focused upon large bandgap metal oxides involving ions with filled or empty d-shell bonding configurations, e.g. $Ti^{4+}$, $Zr^{4+}$, $Nb^{5+}$, $Ta^{5+}$, $W^{6+}$, $Ga^{3+}$, $I^{3+}$, $Ge^{4+}$, $Sn^{4+}$ and $Sb^{5+}$, and oxynitrides such as $(Ga_{1-x}Zn_x)(N_{1-y}O_y)$.

Since the work by Fujishima photocatalytic water splitting has attracted considerable attention, see for example Tachibana et al in "Artificial photosynthesis for solar water-splitting" (Nature Photon., Vol. 6, pp 511-518) and Maeda et al in "Photocatalytic Water Splitting: Recent Progress and Future Challenges" (J. Phys. Chem. Lett., Vol. 1, Iss. 18, pp 2655-2661), as it allows direct conversion of solar energy into hydrogen. During the intervening 40 years research has largely focused upon metal-oxide based photocatalyst materials, see for example Kudo et al in "Heterogeneous Photocatalyst Materials for Water Splitting" (Chem. Soc. Rev., Vol. 38, pp. 253-278) and Guo et al in "Solar Hydrogen Generation: Transition Metal Oxides in Water Photoelectrolysis" (McGraw Hill, 2012) which are responsive to ultraviolet (UV) light, which accounts for approximately 4% of the solar spectrum at Earth's surface. Success in finding an abundant visible light active material, however, has been very limited, see for example Maeda in "Photocatalytic Water Splitting using Semiconductor Particles: History and Recent Developments" (J. Photochem. Photobiol. C: Photochem. Rev., Vol. 12, Iss. 4, pp. 237-268). Visible light being preferable for solar based water-splitting as it accounts for approximately 43% of the solar spectrum at the Earth's surface.

This is attributed to the lack of a known single photocatalyst material, one-step system, which has sufficiently narrow bandgap (<3 eV) to harness visible photons, suitable band-edge potentials for overall water splitting (i.e. simultaneous production of $H_2$ and $O_2$), and has a high level of stability against photocorrosion. In this regard, various energy band engineering methods have been explored to transform UV-active materials into visible-light active photocatalyst, see for example Tong et al. in "Nano-Photocatalytic Materials: Possibilities and Challenges" (Adv. Mater., Vol. 24, No. 2, pp. 229-251), including modulation techniques of the valence band. Such techniques including doping with 3d-transition metal cations, see for example Zou et al in "Direct Splitting of Water under Visible Light Irradiation with an Oxide Semiconductor Photocatalyst" (Nature, Vol. 414, pp. 625-627, hereinafter Zoul), cations with $d^{10}$ or $d^{10}s^2$ configurations, see Kim et al in "An Undoped, Single-Phase Oxide Photocatalyst Working under Visible Light" (J. Am. Chem. Soc., Vol. 126, pp. 8912-8913), and various anions, see for example Khan et al in "Efficient Photochemical Water Splitting by a Chemically Modified n-$TiO_2$" (Science, Vol. 297, pp. 2243-2245), Asahi et al in "Visible-Light Photocatalysts in Nitrogen-doped Titanium Oxides" (Science, Vol. 293, pp. 269-271), and Chen et al in "The Electronic Origin of Visible Light Absorption Properties of C-, N-, and S-doped $TiO_2$ Nanomaterials" (J. Am. Che. Soc., Vol. 130, pp. 5018-5019).

Other approaches have included adjustment of conduction band, e.g. incorporation of p-block cations with $d^{10}$ configuration, see for example Zou et al in "Substitution Effects of $In^{3+}$ by $Al^{3+}$ and $Ga^{3+}$ on the Photocatalytic and Structural Properties of the $Bi_2InNbO7$ Photocatalyst" (Chem. Mater., Vol. 13, pp. 1765-1769), and continuous modulation of valence and/or conduction band, e.g. by solid solution, see for example Maeda et al. in "GaN:ZnO Solid Solution as a Photocatalyst for Visible-Light-Driven Overall Water Splitting" (J. Am. Chem. Soc., Vol. 127, pp. 8286-8287), and disorder engineering, see for example Chen et al in "Increasing Solar Absorption for Photocatalysis with Black Hydrogenated Titanium Dioxide Nanocrystals" (Science, Vol. 331, pp. 746-750). However, most of these approaches cannot drive stable overall pure water splitting beyond the blue wavelength range, see for example Zoul and Maeda et al. in "Photocatalyst Releasing Hydrogen from Water" (Nature, Vol. 440, pp. 295).

However, more recently, the use of group-III nitride semiconductors for water splitting has attracted considerable attention due to the more negative potential of the nitrogen 2p-orbital compared to that of oxygen 2p-orbital and that metal-nitrides often possess a narrow bandgap resulting in narrowband absorption. In contrast group-III nitride semiconductors could potentially encompass nearly the entire solar spectrum at the Earth's surface. Moreover, the inherent chemical stability of nitrides also favors the harsh photocatalysis reaction environment. Indeed, recent first-principles calculations suggest that a single $H_2O$ molecule can be efficiently cleaved in an exothermic reaction to form $H_2$ under photo-excitation at Ga-terminated surface sites. Ab initio molecular dynamic simulations further show that the overall water oxidation reaction at GaN surfaces can be energetically driven by photogenerated holes.

Within the prior art it is known that the size, morphology, surface chemistry, and crystal structure of photocatalysts often play a crucial role in determining their photophysical and photocatalytic properties. Further within the prior art photocatalysts are typically employed in the form of powders to provide large surface area within a small volume. However, photocatalysts in the form of one-dimensional (1-D) nanostructures, such as nanowires, nanobelts, and nanotubes, are highly desired as these exhibit extremely large surface-to-volume ratios and significantly enhanced light absorption. More importantly, in 1-D nanostructured single crystals charge carriers are delocalized and therefore free to transport throughout the whole length dimension. Consequently, significantly enhanced photocatalytic activity is expected from 1-D nanoscale materials.

To date, such semiconductor nanowire based devices, such as those exploiting InN, GaN, and AlN, have generally been achieved on single crystalline substrates. However, it would be beneficial in many applications to reduce the device fabrication cost and achieve seamless integration with other device components. Accordingly, with the current availability of lower cost large area amorphous substrates and the emergence of high perfoiinance flexible photonics and electronics it would be beneficial for high-quality semiconductor nanowires and nanowire based devices to act as the building blocks for future photonic and electronic devices on amorphous and/or flexible substrates. Further, flexibility in substrate allows wider design aspects, e.g. thermal management, chemical resistance, and high speed electronics for example, as well as tailoring the substrate to the device design and application for example for enhanced performance.

According to embodiments of the invention therefore high efficiency LEDs for generating high efficiency solid state white light sources can be manufactured based upon forming nanowires, in conjunction with the carrier confinement enabled by the dot-in-a-wire structures and the enhanced carrier transport by the modulation p-doping technique, using a nearly-defect free InGaN nanowire growth process upon silicon substrates that does not require a foreign metal catalyst to be introduced or complex precursor gas control processes to achieve growth which would be incompatible with forming either quantum dot in a wire structures or the quantum dot within a quantum dot within a wire structures for increased efficiency. The process further allow single epitaxial growth and enhanced hole transport through controlled doping of the structures.

SUMMARY OF THE INVENTION

It is an object of the present invention to obviate or mitigate at least one disadvantage of the prior art.

In accordance with an embodiment of the invention there is provided a method comprising:
providing a first source of a plurality of sources, the first source of the plurality of sources for providing a source of a group III element;
providing a second source of the plurality of sources, the second source of the plurality of sources for providing a source of nitrogen;
providing a substrate within a reaction chamber, the reaction chamber comprising at least controllable inlets for at least the first and second sources of the plurality of sources;
establishing operation of the reaction chamber at a first predetermined set of operating conditions;
introducing the first source of the plurality of sources into the reaction chamber in the absence of the second source for a first predetermined period of time, the introduction being at least one of at a predetermined flow rate and predetermined pressure;
establishing operation of the reaction chamber at a second predetermined set of operating conditions after the predetermined period of time has elapsed;
introducing into the reaction chamber in addition to the first source of the plurality of sources at least the second source of the plurality of sources, each of the first and second sources of the plurality of sources being introduced at least one of at a predetermined flow rate and a predetermined pressure; operating the reaction chamber at the second predetermined set of operating conditions for a second predetermined period of time.

In accordance with another embodiment of the invention there is provided a method comprising initiating the growth of a wurtzite semiconductor onto a substrate, the initiation being achieved through providing nanoscale droplets of a group III element constituent of the wurtzite semiconductor on the surface of the substrate and absent both a foreign catalyst and other constituent elements of the wurtzite semiconductor.

In accordance with another embodiment of the invention there is provided a device comprising a substrate having at least one semiconductor structure of a plurality of semiconductor structures formed thereupon, the at least one semiconductor structure comprising a first predetermined portion formed from a wurtzite semiconductor whose growth was initiated by providing nanoscale droplets of a group III element constituent of the wurtzite semiconductor on the surface of the substrate and absent both a foreign catalyst and other constituent elements of the wurtzite semiconductor.

In accordance with another embodiment of the invention there is provided a device comprising a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth.

In accordance with another embodiment of the invention there is provided a device comprising a substrate having at least one semiconductor nanowire of a plurality of semiconductor nanowires formed thereupon, the at least one semiconductor nanowire comprising at least one first quantum dot disposed within a first quantum well within a predetermined portion of the at least one semiconductor nanowire and formed by a self-organization of the at least one semiconductor nanowire during its growth.

In accordance with another embodiment of the invention there is provided a device comprising:
initiating the growth of at least one wurtzite semiconductor structure of a plurality of wurtzite semiconductor structures on a substrate, the initiation achieved by providing for the at least one wurtzite semiconductor structure at least one nanoscale droplet of a plurality of nanoscale droplets of a first predetermined group IIIA element constituent of the wurtzite semiconductor on the surface of the substrate and absent both a foreign catalyst and other constituent elements of the wurtzite semiconductor;
growing from the at least one wurtzite semiconductor structure a nanowire by growing a series of semiconductor materials in a predetermined sequence atop the wurtzite semiconductor wherein a predetermined portion of the series of semiconductor materials includes at least of a predetermined second group IIIA element and a predetermined group five A (VA) element; wherein growing the nanowire comprises forming at least one first quantum dot disposed within a first quantum well by a process of self-organization within a predetermined portion of the nanowire.

In accordance with another embodiment of the invention there is provided a device comprising a substrate having at least one semiconductor structure of a plurality of semiconductor structures formed thereupon, the at least one semiconductor structure comprising a first predetermined portion formed from a wurtzite semiconductor whose growth was initiated by providing nanoscale droplets of a group III element constituent of the wurtzite semiconductor on the surface of the substrate and absent both a foreign catalyst and other constituent elements of the wurtzite semiconductor, and the at least one semiconductor structure of the plurality of semiconductor structures having formed on its surface at least one nanostructure of a plurality of nanostructures.

In accordance with another embodiment of the invention there is provided a device comprising a substrate having at least one semiconductor structure of a plurality of semiconductor structures formed thereupon, the at least one semiconductor structure comprising at least one quantum structure of a plurality of quantum structures, each quantum structure disposed within a predetermined portion of the at least one semiconductor structure of the plurality of semiconductor structures and formed by a self-organization of the at least one semiconductor structure of the plurality of semiconductor structures during its growth; and the at least one semiconductor structure of the plurality of semiconductor structures having formed on its surface at least one nanostructure of a plurality of nanostructures.

In accordance with another embodiment of the invention there is provided a method of generating a gas comprising providing a device comprising at least a substrate having at least one semiconductor structure of a plurality of semiconductor structures formed thereupon, the at least one semiconductor structure comprising a first predetermined portion formed from a wurtzite semiconductor whose growth was initiated by providing nanoscale droplets of a group III element constituent of the wurtzite semiconductor on the surface of the substrate and absent both a foreign catalyst and other constituent elements of the wurtzite semiconductor, and illuminating the device with solar radiation within a predetermined wavelength range to generate the gas via a photoelectrochemical process.

In accordance with another embodiment of the invention there is provided a device comprising a predetermined portion of a photoelectrochemical device wherein the device comprises a substrate having at least one semiconductor structure of a plurality of semiconductor structures formed thereupon.

In accordance with another embodiment of the invention there is provided a device comprising a predetermined portion of a photoelectrochemical device wherein the device comprises a substrate having at least one semiconductor structure of a plurality of semiconductor structures formed thereupon and generates at least one of hydrogen and oxygen under illumination with optical radiation within a predetermined wavelength range.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 4I shows the photoluminescence emission spectra for samples at varying growth temperature according to an embodiment of the invention;

FIG. 4J shows an TEM micrograph of single InN nanowire grown according to an embodiment of the invention;

FIG. 4K shows a cross-sectional TEM image of InN/Si interface region for an InN nanowire grown on a silicon substrate according to an embodiment of the invention;

FIG. 4L shows a selected area electron diffraction measured for the InN nanowire and Si substrate interface of the nanowires within FIGS. 4A through 4K according to embodiments of the invention;

FIG. 6 depicts the variation of photoluminescence peak wavelength versus temperature for InN nanowires grown according to an embodiment of the invention;

FIG. 20A depicts an SEM image showing the morphology of InGaN/GaN dot-in-a-wire heterostructures grown on Si(111) according to an embodiment of the invention;

FIG. 20B depicts a low magnification bright field TEM showing the position and alignment of the InGaN dots in a GaN nanowire;

FIG. 28 depicts room temperature internal quantum efficiency of the undoped and p-doped dot-in-a-wire LEDs versus injection currents;

FIG. 29 electroluminescence intensity versus current density for a p-doped dot-in-a-wire LED measured at room temperature;

FIG. 34 depicts normalized electroluminescence spectra of a dot-in-the-wire LED according to an embodiment of the invention under various injection currents;

FIG. 35 depicts the relative external quantum efficiency (EQE) with injection current for the emission from the quantum dot active region and the test well of a dot-in-the-wire LED according to an embodiment of the invention;

FIG. 36 depicts normalized electroluminescence spectra of a dot-in-the-wire LED according to an embodiment of the invention at different temperatures under constant injection current;

FIG. 37 depicts the relative EQE and simulated internal quantum efficiency (IQE) for a dot-in-the-wire LED according to an embodiment of the invention at varying temperature;

FIG. 60 depicts schematically and in an SEM image InGaN/GaN dot-in-a-wire LED heterostructures on $SiO_X$ substrate;

FIG. 61 depicts PL spectra for LED heterostructures on $SiO_X$ and Si substrates according to embodiments of the invention.

DETAILED DESCRIPTION

The present invention is directed to semiconductor nanowire devices and more specifically to broadband optical emitters and detectors formed without foreign metal catalysis.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Nanowire Growth

Figure 1:
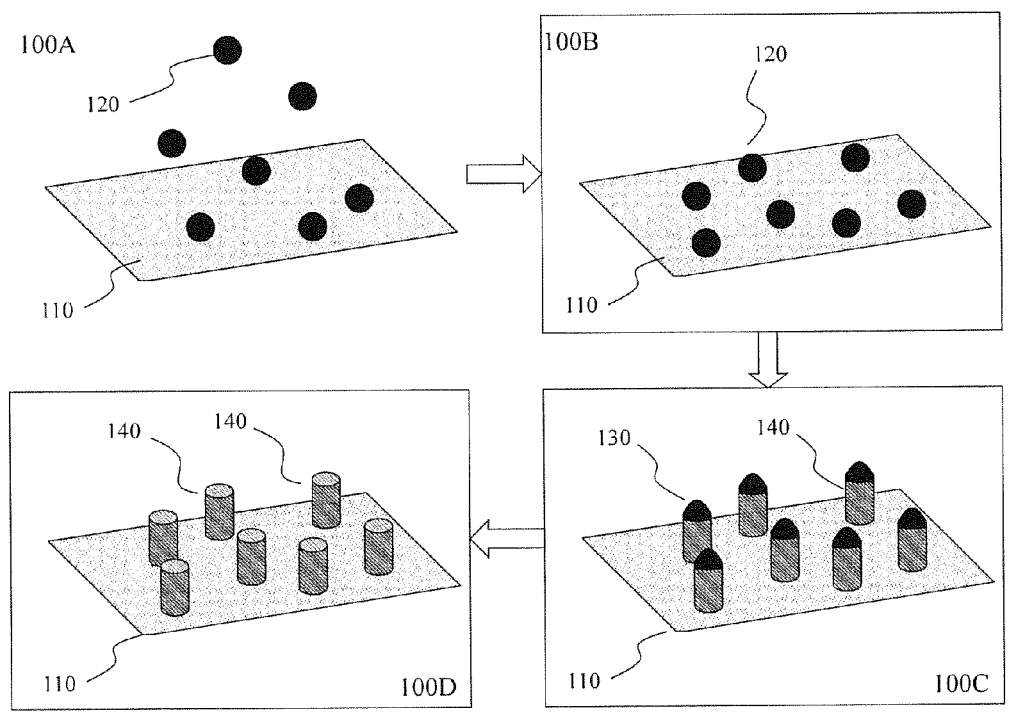
FIG. 1 is schematic sequence of growing nanowires according to the prior art with a foreign metal catalyst.

Referring to FIG. 1 there is shown a sequence of growing nanowires according to the prior art with a foreign metal catalyst. Such prior art using the vapor-liquid-solid (VLS) growth mechanism including for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, p. 22, 2002) and X. Cai et al in "Straight and Helical InGaN Core-shell Nanowires with a High In Core Content" (Nanotechnology, Vol. 17, p. 2330, 2006).

As shown in first step 100A a substrate 110 is disposed within a deposition environment wherein catalyst microparticles 120 are present, for example gold microparticles. Accordingly at second step 100B some of these catalyst microparticles 120 have deposited onto the substrate 110. The resultant combination of substrate 110 and microparticles 120 are then placed within a semiconductor growth reactor, for example a molecular beam epitaxy reactor (MBE), wherein the requisite precursor gases are introduced under conditions of predetermined power, temperature, pressure etc. The result is these precursors are disassociated within the semiconductor growth reactor and the active species of interest, for example indium (In), gallium (Ga) and nitrogen (N) are then present in a vapor state. These active species then condense onto the substrate 110 in the presence of the gold microparticles 120 forming a liquid phase which subsequently solidifies with the gold migrating to the upper surface of the structure as it solidifies so-called vapour-liquid-solid (VLS) growth. Accordingly a nanowire grows at the locations of the original gold microparticles 120 as shown in third step 100C wherein nanowires 140 are formed beneath gold 130 upon the substrate 110. Upon expiration of a predetermined period of time, governed by nanowire growth rate and desired nanowire length, the reaction is terminated. Then at fourth step 100D the gold 130 is etched away leaving the nanowires 140 upon the substrate.

Within the prior art other approaches for providing the metal catalyst, other than depositing gold microparticles 120 have been described, see for example J. Li et al in U.S. Pat.

No. 6,831,017 entitled "Catalyst Patterning for Nanowire Devices", which include metallization and etching after photolithography, metallization onto substrates with predefined photolithographic pattern and subsequent lift-off, melting deposited metallization, evaporating through porous spheres etc. Alternative catalysts within the prior art also include iron (Fe) and nickel (Ni).

Figure 2A:
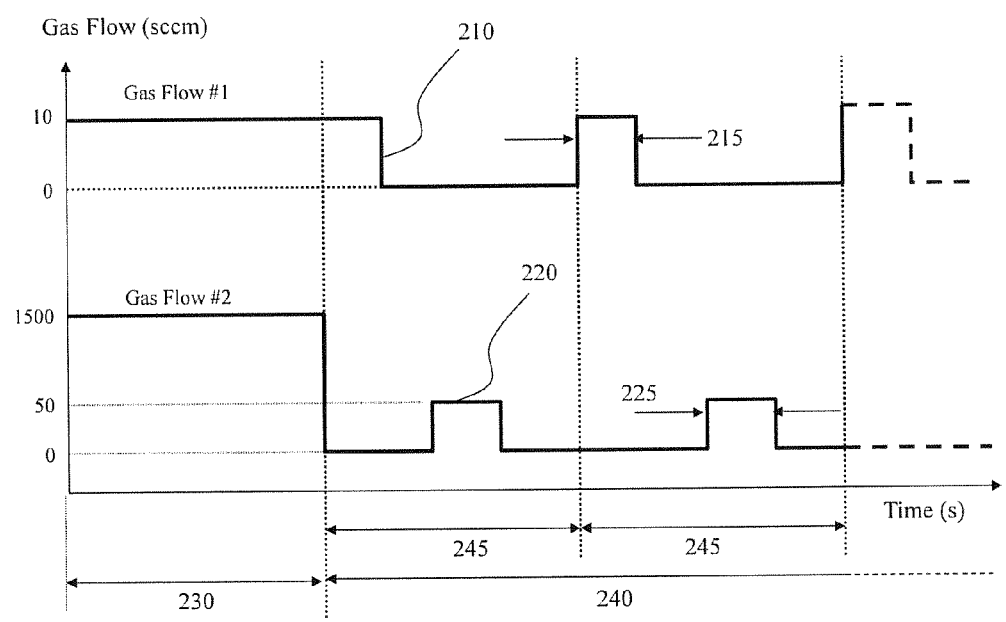
FIG. 2A is a schematic of the gas flows for growing nanowires according to the prior art without a foreign metal catalyst.

However, these prior art VLS growth based nanowires exhibit problems as the catalytic processes cannot control the uniformity of the resulting nanowires and the catalyst is inevitably incorporated into the nanowires to some degree, thereby degrading the crystalline quality of the nanowires, wherein the introduced defects result in limits to their performance and applications. Accordingly within the prior art there are also approaches to growing nanowires that relate to the spontaneous formation of growth points for nanowires under nitrogen rich environments, thereby removing the requirement for a foreign metal catalyst. Such an example of the gas control for such a prior art growth approach is shown in FIG. 2A according to the prior art of S. Hersee et al in U.S. Pat. No. 7,521,274 entitled "Pulsed Growth of Catalyst-Free Growth of GaN Nanowires and Application in Group IIIA Nitride Semiconductor Bulk Material.".

Accordingly there are shown gas flow curves for two gases in the growth of a nanowire, for example gallium nitride (GaN). Accordingly first curve 210 plots the gas flow of the first precursor gas for Ga, namely trimethylgallium (TMGa), versus time. Second curve 220 plots the gas flow of the second precursor gas, ammonia ($NH_3$). During a first continuous growth regime 230 both precursor gases are present within the reactor with an effective N:Ga ratio of 150. During this continuous growth period 230 nanowires are spontaneously formed upon a buffer layer on the substrate, the buffer layer for example being a group IIIA-N alloy including for example GaN, AlN, InN, InGaN. Subsequently the growth enters a pulsed growth regime 240 wherein the gases are intermittently introduced into the reaction chamber with a periodic sequence 245. For example Hersee teaches that the first duration 215 for the first precursor gas TMGa is typically 10-20 seconds whilst second duration 225 for the second precursor gas $NH_3$ is typically 15-30 s. Accordingly typical duration for the periodic sequence is 60-90 seconds. Further as evident from second curve 220 the N:Ga ratio is reduced to about 50 within this example. Accordingly continuous growth regime 230 corresponds to a nitrogen rich atmosphere in comparison to the pulsed growth regime 240.

However, Hersee notes that the growth behavior of the nanowire is changed significantly for even small molecular fractions of an additional precursor gas, such as trimethylaluminum (TMAl) for aluminum and trimethlyindium (TMIn) for indium, at even percentages as low as 1%, such that nanowire cross-sections change, growth rates shift, etc. Given that the growth of full solar spectrum solar cells would require the $In_xGa_{1-x}N$ composition within a nanowire to change from approximately x=0.00 to approximately x=1.00, namely a molecular fraction change of 100%, and even shifting from a blue light source (x=0.30) to a green light source (x=0.43) requires a molecular fraction change of approximately 13% it is evident that significant issues arise in forming nanowires with varying composition as required for graded nanowires or nanowires with embedded quantum wells. Additionally these varying growths during formation of a nanowire result in increased defects thereby reducing their efficiency and applications. Similarly Hersee teaches that the nanowires are grown with a cross-section determined by the selective area mask patterned onto the buffer layer rather than being determined from the process conditions of the reactor. It is also important to note that the growth mode of Hersee was based upon GaN nanowires and not InN nanowires that are the focus of this invention as the rapid lateral growth variations evident from even minor compositional changes would significantly impact the growth of InN nanowires.

Figure 2B:
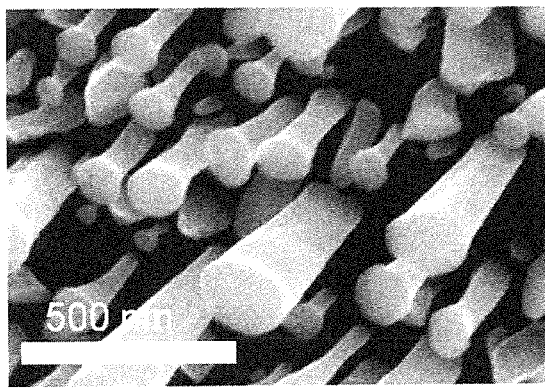
FIG. 2B is a SEM micrograph of InN nanowires grown according to the prior art.

Referring to FIG. 2B there is shown an SEM micrograph of InN nanowires grown using a continuous growth upon a silicon substrate without application of a selective area growth mask. As is evident the InN wires have grown not only at different rates, implying that nucleation occurred at different times within the process but that their geometries are not uniform. Accordingly it is believed that the approach of Hersee demonstrated with patterning of the buffer layer at dimensions of approximately 150 nm would not work at smaller dimensions as nucleation may or may not occur within the short continuous mode growth before pulsed growth mode is required to maintain the nanowire growth process.

Figure 3:
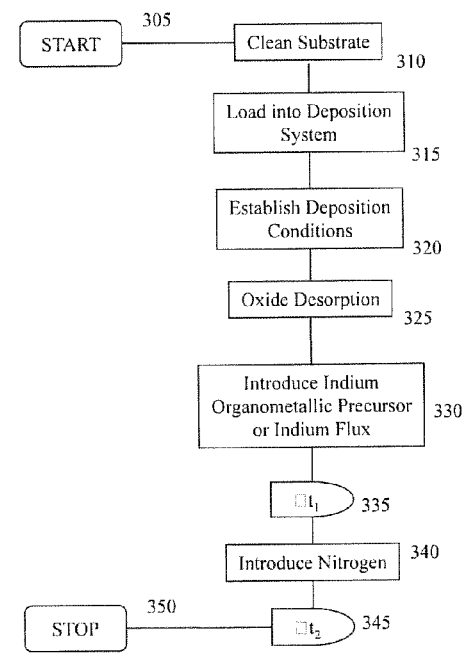
FIG. 3 is an exemplary process flow for growing InN nanowires according to an embodiment of the invention.

Referring to FIG. 3 there is shown an exemplary process according to an embodiment of the invention for growing InN nanowires onto silicon (of orientation<111>) substrates using a Veeco Gen II MBE system equipped with a radio frequency (RF) plasma source. The process starts at step 305 and moves to step 310 wherein the silicon (Si) wafer is cleaned, in this case by an ex-situ clean using standard solvent and buffer hydrofluoric acid solution, before the process moves to step 315 and the Si wafer is loaded into the MBE chamber. Next, in step 320, the deposition parameters for the nanowire growth are established, determined by the composition of the nanowire, inclusion of quantum dots, quantum wells, etc as well as physical parameters such as nanowire length. Subsequently in step 325 an in situ oxide desorption at elevated temperatures (approximately 770° C.) is performed together with a degassing procedure (approximately 850° C. for 10 minutes), the result of which is that a 7×7 reflection high energy electron diffraction (RHEED) pattern can be clearly observed as evident from first insert 370.

Next in step 330 the substrate temperature is lowered, typically between 430° C. and 520° C. for the growth of InN nanowires and the indium organometallic precursor or indium beam flux is introduced, i.e. TMIn or In respectively, and the reactor operates for a first predetermined period of time $\Delta t_1$ in step 335 in order to deposit a thin In layer, of thickness typically between 0.5 nm and 1.6 nm (representing typically 10 to 30 seconds of processing). Next in step 340 the nitrogen precursor, ammonia, is introduced and the process moves to step 345, wherein the substrate temperature is raised to 480° C. and the process continues to execute for a second predetermined period of time $\Delta t_2$ before the process terminates at step 350. The growth period $\Delta t_2$ ranged from 30 minutes to 10 hours within experiments performed.

Additionally, the formation and properties of InN nanowires under different growth conditions have been evaluated. Typical process ranges for InN nanowires include nitrogen flow rates between 1.0 sccm and 2.0 sccm, In partial pressure between $0.3-1.0\times10^{-7}$ Torr, growth temperature between 430° C. and 520° C., and RF plasma forward power between 300 W and 450 W.

Referring to FIGS. 4A through 4D there are shown SEM images taken at tilt angles of 45° for samples grown at 440° C., 460° C., 480° C., and 500° C., respectively are shown. The In flux was fixed at $1\times10^{-7}$ Torr for the four samples, and a 0.5 nm In seeding layer was deposited in situ prior to the growth initiation. It is evident that both the wire density and size vary considerably with the change in the growth temperature. At a relatively low growth temperature (approximately 440° C.), the nanowires are generally coalesced together and exhibit a bimodal distribution in both height and diameter, shown in FIG. 4A. A further reduction in the growth temperature will lead to compact InN layers due to the reduced In thermal desorption. With the increase in the growth temperature, the wires become well spaced, the wire densities decrease considerably from approximately 100 $\mu m^{-2}$ to approximately 1 $\mu m^{-2}$, and the wire diameters increase from approximately 50 nm to approximately 200 nm, or larger in the temperature range of 440-500° C. The wire density and size are determined, to a large degree, by both the nucleation sites as well as the subsequent thermal-driven convalescence process during the initial stage of the wire formation. The properties of the nucleation sites, or In islands, are also strongly temperature dependent. At elevated substrate temperatures, conventional InN nanowires generally exhibit a severe enlargement of diameter toward the top due to a very high In migration rate. In contrast, InN nanowires grown at high temperatures approximately 460-500° C. according to embodiments of the invention are well faceted and highly homogeneous in height and, more importantly, exhibit completely suppressed tapering or broadening effect along the entire wire length, as shown in FIGS. 4A through 4D.

It can be seen that these wires are remarkably straight, with identical top and bottom sizes. They also exhibit homogeneous height. The wires are of wurtzite structure and well-separated, with the c-axis oriented vertically to the Si(111) substrate as commonly observed for IIIA-nitride nanowires grown on Si(111), see for example C. Shen et al (Appl. Phys. Lett., Vol. 88, p. 253104, 2006) and Y. Lu et al (Appl. Phys. Lett., Vol. 91, p. 202109, 2007).

Figure 4A:
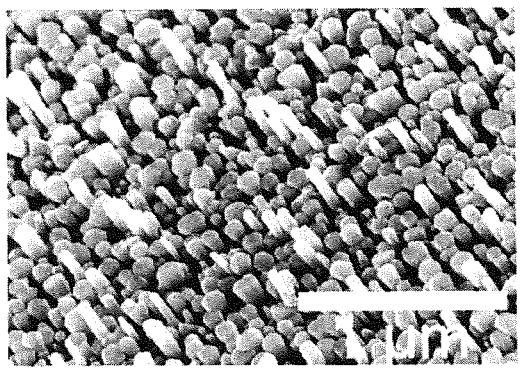
FIGS. 4A through 4D show SEM micrographs of InN nanowires grown according to an embodiment of the invention at varying growth temperature.
Figure 4B:
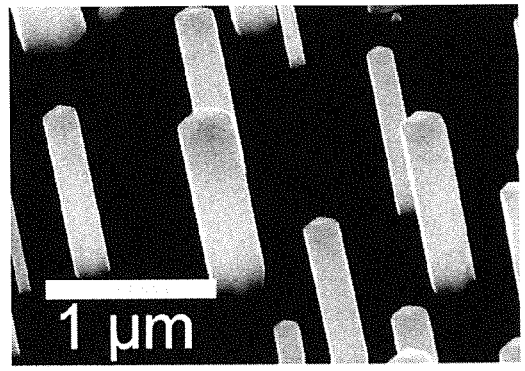
Figure 4C:
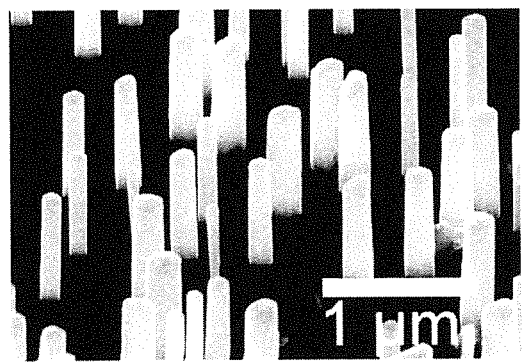
Figure 4D:
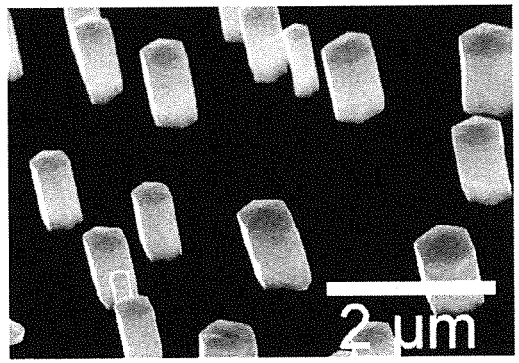

These should be compared with the InN nanowires of FIG. 2B which were grown in the same reactor without the thin In layer with the same substrate temperature of 480° C., In partial pressure of $1.0\times10^{-7}$, flow rate of 1.5 sccm, and growth time of approximately 2.5 hours. Referring to FIG. 4D the SEM image of an InN nanowires grown on Si at a slightly higher substrate temperature of approximately 500° C. is shown. These InN nanowires are also non-tapered, with a further reduced density but larger diameter. For comparison, conventional InN nanowires grown at such temperatures generally exhibit an inverse pyramid-like shape, with the wire top 2-5 times larger than the root; see for example T. Stoica et al in "MBE Growth Optimization of InN Nanowires" (J. Crystal Growth, Vol. 290, p. 241, 2006).

To understand the role of the pre-deposited In layer on the achievement of non-tapered InN nanowires, it is important to note that the formation of InN nanowires may involve a self-catalytic process, as suggested by recent experiments including for example T. Kang et al (Appl. Phys. Lett, Vol. 89, p. 023103, 2006) and M. He et al (J. Vac. Sci. Technol. B, Vol. 25, p. 940, 2007). However, unlike the prior processes within the embodiments of the invention the InN nanowires nucleate and grow from nanoscale In droplets created on the growing surface. During prior art spontaneous growth of InN nanowires, there are no well-defined nucleation centers, and, consequently, the continuously random nucleation of nanowires leads to InN nanowires on Si with a large variation in height and diameter. Also due to the large diffusion rate of In adatom and their preferential incorporation near the wire top, conventional InN nanowires generally exhibit severely tapered morphology, see for example T. Stoica et al in "MBE Growth Optimization of InN Nanowires" (J. Crystal Growth, Vol. 290, p. 241, 2006). On the other hand, according to the invention, the in situ deposited In layer prior to growth initiation forms nanoscale liquid droplets on the Si surface at elevated temperatures, which can therefore act as seeds to promote the nucleation of InN nanowires. As a result, the nanowire density is largely pre-determined, and the size uniformity is significantly enhanced.

Nanowire growth is controlled by the quasi-equilibrium among the various dynamic processes, including adatom diffusion, desorption, and incorporation, as well as adatom impinging on the wire top. With well-defined wire densities, these dynamic processes can be tailored by optimizing the growth conditions, including In and nitrogen flux and RF plasma power, thereby leading to perfectly straight InN nanowires on Si, as illustrated in FIGS. 4A and 4B, that were not possible before according to the prior art. To achieve a better control over the properties of InN nanowires on Si and also further elucidate the role of the In seeding layer, InN nanowires on Si were grown using predeposited In layers with different thicknesses. It has been consistently observed that, with the increase of the In layer thickness from 0.5 nm to 1.6 nm, that the density of InN nanowires increases from approximately 4 $\mu m^{-2}$ to approximately 15 $\mu m^{-2}$, or higher. This can be explained by the presence of a larger density of nucleation centers related to a thicker In layer, In the prior art growth of spontaneously formed nanowires, control over the wire density is largely achieved by varying the growth temperature, which often makes it extremely difficult to optimize other properties of the wires, as they are directly related to the growth temperature as well. The use of an in situ deposited In seeding layer can therefore provide an additional dimension to effectively control the growth and properties of InN nanowires.

Figure 4E:
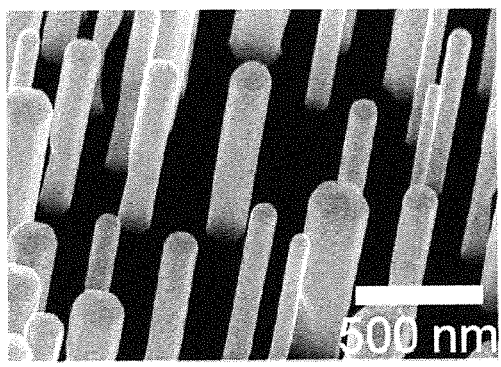
FIGS. 4E through 4G show SEM micrographs of InN nanowires grown according to an embodiment of the invention at varying In fluxes for constant growth temperature.
Figure 4F:
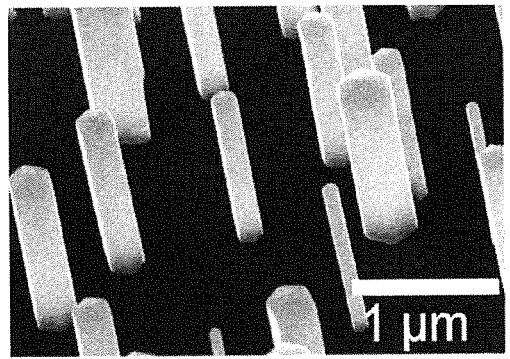
Figure 4G:
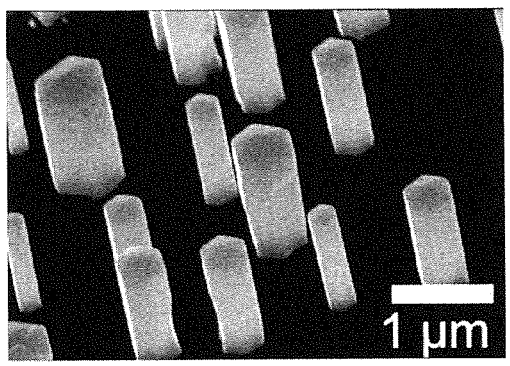

Next the effect of In flux on the structural properties of InN Nanowires is shown with reference to FIGS. 4E through 4G. The growth temperature was fixed at approximately 470° C., which is sufficiently high to yield well-separated nanowires. FIGS. 4E to 4G being SEM images taken at tilt angles of 45° for samples grown at In beam equivalent pressures (BEPs) of approximately $2\times10^{-8}$, $7\times10^{-8}$, and $1.8\times10^{-7}$ Torr, respectively, which are well within the nitrogen-rich regime. It is observed that the wire diameters increase from approximately 100 nm to approximately 250 nm, or larger, with the increase in the In deposition rate, which is attributed to the enhanced In adatom migration and the subsequent incorporation on the wire lateral surfaces. Further increase in the In flux may eventually lead to the formation of compact InN layers. The wire densities are also reduced with the increase in the In deposition rate potentially due to the enhanced coalescence of smaller wires during the initial stage of wire growth when the nitrogen/In flux ratio is reduced. According to embodiments of the invention, with the variation in the In deposition rate, InN nanowires also exhibit completely non-tapered morphology, which is in direct contrast to conventionally grown InN nanowires wherein variations in the In flux commonly induce a significant change in the ratio between the top and the bottom wire diameters.

Figure 4H:
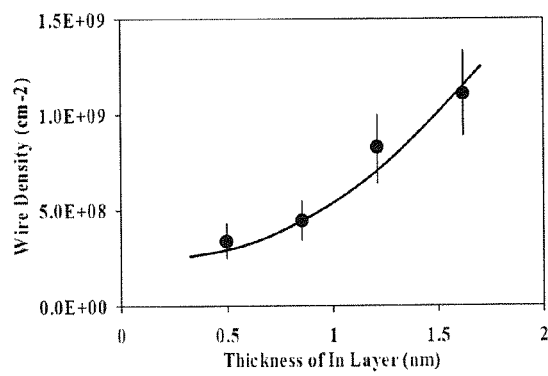
FIG. 4H shows the variation in InN nanowire density versus In seeding layer thickness according to an embodiment of the invention.

Referring to FIG. 4H there is shown the variation in InN nanowire density versus In seeding layer thickness according to an embodiment of the invention. With the use of a thicker In seeding layer, higher densities of In islands can be formed on the substrate. Consequently, the presence of more In nucleation centers may potentially lead to the formation of a larger density of nanowires. Shown in FIG. 4H, with the increase in the In layer thickness from approximately 0.5 nm to approximately 1.6 nm, the wire density is increased from approximately $4\times10^8$ to approximately $1.3\times10^9$ $cm^{-2}$, accordingly. The growth temperature and In flux were kept at 470° C. and $7\times10^{-8}$ Torr, respectively. However, it is also important to note that the nucleation, formation, and evolution of InN nanowires are extremely complicated processes and may involve various dynamic processes that can be strongly influenced by other growth parameters as well. As a result, the presence of In islands and the subsequently grown InN nanowires may exhibit a highly nonlinear relationship, which can potentially be utilized to yield electronically pure InN nanowires with well controlled properties.

Referring to FIG. 4I there is shown photoluminescence emission spectra for samples at varying growth temperature according to an embodiment of the invention. FIG. 4H shows the PL emission spectra of samples grown at approximately 440° C., approximately 480° C., and approximately 500° C. at 80K under an excitation power of approximately 1.5 mW. The sample grown at approximately 440° C. exhibits a very low PL efficiency and a large spectral Linewidth (full width at half maximum (FWHM) of approximately 100 meV), with a PL peak position at approximately 0.75 eV. On the other hand, the samples grown at approximately 480° C. and approximately 500° C., respectively, display considerably higher PL efficiencies, significantly narrower spectral linewidths (FWHM of approximately 20 meV), and much smaller PL peak energies (approximately 0.67 eV). We have further measured a very narrow spectral linewidth of approximately 14 meV for samples grown at approximately 500° C. at 5K.

It is also seen, see inventors paper with Y-L. Chang et al entitled "Optimization of the Structural and Optical Quality of InN Nanowires on Si(111) by Molecular Beam Epitaxy" (J. Vac. Sci. Tech. B 28(3) May/June 2010, Paper C3B7), that the samples grown at a higher temperature, e.g. approximately 500° C., exhibits substantially higher, approximately a factor of 100, PL intensity, compared to that grown at lower temperatures suggesting that a higher crystal quality can be achieved at relatively high growth temperatures due to the increased adatom mobility and the resulting optimal bonding.

The structural properties of InN nanowires on Si were also studied by high resolution transmission electron microscopy (TEM). Shown in FIG. 4J is the TEM image of a non-tapered InN nanowire transferred on a carbon membrane on a TEM grid. It is evident that the nanowire is structurally uniform, with a constant diameter of approximately 71 nm along the wire of approximately 0.95 μm. By varying growth time, non-tapered InN nanowires with lengths in the range of 0.1 μm to 5 μm have been achieved. The high resolution TEM images and selected area electron diffraction patterns reveal that the wires exhibit a wurtzite crystal structure and have an interlunar spacing of 0.308 nm. Detailed studies confirm that the entire wire is of single crystal and relatively free of dislocations. It is also noted that no excess In droplets at the ends of the nanowires occur as evident from energy dispersive spectroscopy (EDS) measurements. This is due to the possible nitridation of the In droplets during and/or after the nanowire growth.

During the growth of InN on Si, an amorphous $SiN_x$ layer also develops at the misfit interface, which can be clearly identified from the cross-sectional TEM image of InN/Si interface region, shown in FIG. 4K. The presence of such an amorphous layer can severely limit the formation and properties of InN on Si. According to the prior art for thick (>2 nm-3 nm) SiNx amorphous layers, vertically oriented InN nanowires cannot be grown, see J. Grandal et al "Accommodation Mechanism of InN Nanocolumns Grown on Si (111) Substrates by Molecular Beam Epitaxy" (Appl. Phys. Lett., Vol. 91, 021902, 2007). With the use of an In seeding layer, however, single crystalline InN nanowires, that are relatively free of dislocations and stacking faults, can be achieved on Si even with the presence of a relatively thick (>4 nm-5 nm) $SiN_x$ layer, illustrated in FIG. 4K. The selected area electron diffraction measured for the InN nanowire and Si substrate interface region is shown in FIG. 4L, which consists of diffraction patterns for both the InN nanowire and the Si substrate. The perfect epitaxial alignment between Si(111) and InN(0001) is attributed to the pre-deposited In droplets, which act as seeds for the nucleation and growth of InN nanowires.

Figure 5A:
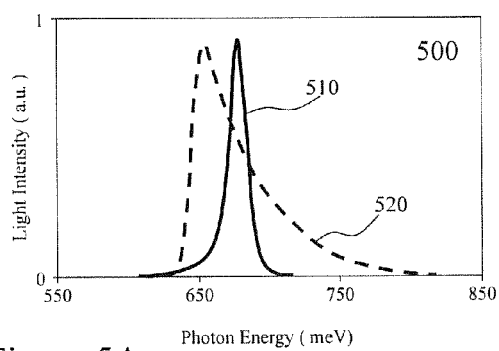
FIGS. 5A and 5B depict photoluminescence spectra and intensity versus temperature for InN nanowires grown according to an embodiment of the invention.

Referring to FIG. 5 the photoluminescence (PL) spectra 500 of InN nanowires grown without a foreign element catalyst were measured at 5K and 300K under excitation powers of 5μW and 200μW, respectively being shown as first curve 510 and second curve 520 respectively. The PL spectra are predominantly characterized by a single peak, and emission at higher energies is not observed. The measured spectral linewidths of 14 and 40 meV are significantly smaller than the commonly reported values of 60-120 meV for InN nanowire ensembles. The significantly reduced inhomogeneous broadening is attributed to the minimized, or completely eliminated, size variation along the wire axial direction and amongst the wires.

Figure 5B:
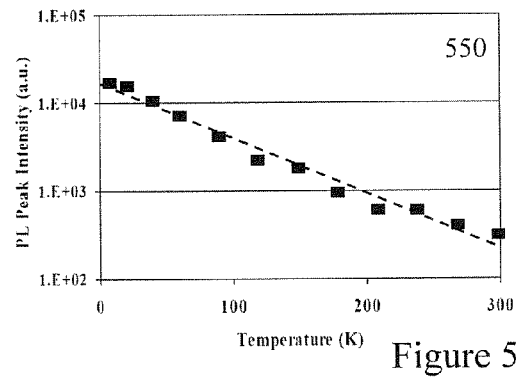

The PL spectra of conventional InN nanowires generally exhibit high energy tails that can be described by approximately $\exp(-E_{ph}/E_0)$ where $E_{ph}$ is the photon energy and $E_0$ is the specific energy corresponding to both the thermal distribution of carriers as well as the nanowire inhomogeneity. The values of $E_0$ are typically smaller for nanowires with better quality. As evident from first curve 510 in FIG. 5 there is no high energy tail in the PL spectra at 5K, suggesting the high quality of non-tapered InN nanowires. Additionally, the high energy tail shown in the 300K PL spectrum, second curve 520 in FIG. 5, is characterized by a specific energy of $E_0 \approx 30$ meV which corresponds well to the thermal energy kT, further confirming the extreme homogeneity of the non-tapered nanowires grown according to embodiments of the invention. To evaluate the nonradiative recombination processes in InN nanowires the thermal quenching behavior of the PL emission was measured and is shown as quenching curve 550 in FIG. 5B under an excitation power of approximately 1.5 mW. The intensity decreases exponentially increasing temperature, with an activation energy of $E_\alpha \approx 6.4$ meV over the temperature range of 5-300K. One of the major non-radiative recombination processes in InN is Auger recombination where recent studies suggested that Auger recombination in InN is a phonon assisted process, which is weakly dependent on temperature, with activation energy in the range of 4-9 meV, see D. Jang et al "Auger recombination in InN thin films" (Appl. Phys. Lett., Vol. 92, 042101, 2008). Therefore, the thermal quenching of PL emission can be well explained by non-radiative Auger recombination in InN nanowires.

One of the fundamental properties of InN, the direct band gap, is still a subject under debate. To date, the temperature dependence of the band gap has not been reliably obtained from InN nanowires, due to the large inhomogeneous broadening and very poor structural and optical quality. Shown in FIG. 6 is a graph 600 of the measured PL peak position of non-tapered InN nanowires grown according to an embodiment of the invention as a function of temperature under an excitation power of 1.5 mW. Solid line 610 plots the variation of the band gap of InN with temperature, calculated using the Varshni's equation $E_g(T)=E_h(0)-\gamma T^2/(T+\beta)$, where $E_g(0)$ =0.70 eV, γ=0.41 meVK$^{-1}$, and β454K, see J. Wu et al "Superior Radiation Resistance of $In_{1-x}Ga_xN$ Alloys: A Full-Solar-Spectrum Photovoltaic Materials System" (J. Appl. Phys., Vol. 94, p. 6477, 2003). The agreement is excellent, which further confirms the extremely high quality and homogeneity of the non-tapered InN nanowires grown using an In seeding layer deposited during the InN nanowire growth process.

Figure 7:
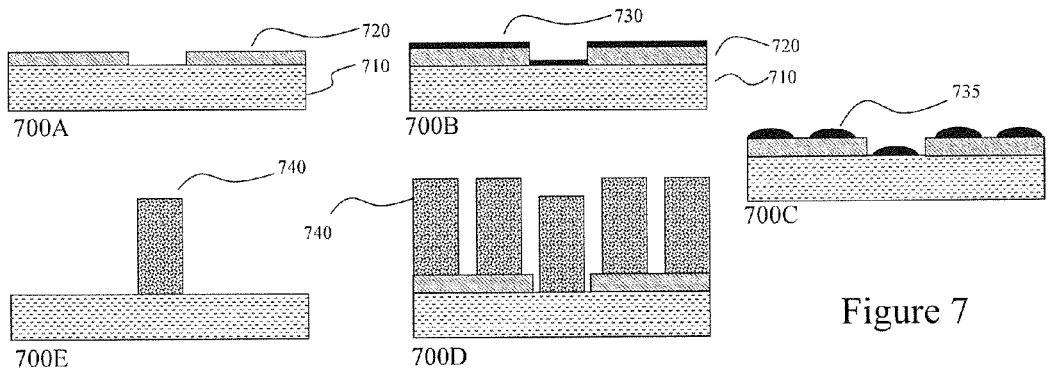
FIG. 7 depicts an exemplary process for growing InN nanowires according to an embodiment of the invention at predetermined locations upon a substrate.

Referring to FIG. 7 there is shown an embodiment of the invention for providing InN nanowires at predetermined locations upon a substrate 710. In first step 700A the substrate 710 has patterned a buffer material 720 that has been patterned with apertures where it is intended for InN nanowires to be formed. The buffer material should be capable of withstanding in situ oxide desorption at elevated temperatures (approximately 770° C.) as described supra in respect of FIG. 3. Next at step 700B the substrate 710 and buffer material 720 are shown at an early stage within the growth process wherein the organometallic precursor trimethlyindium, TMIn, is introduced without nitrogen forming an initial thin layer. As the thickness increases the In nucleates and forms liquid droplets 735 as shown in step 700C. The process continues as shown in step 700D, as presented supra in FIG. 3, with the introduction of the second precursor, ammonia, such that InN growth occurs and the InN nanowires 740 are formed where the In droplet 735 existed which as the thickness increases. The growth process is then terminated after the predetermined period of time such that the InN nanowires 740 are the required height. Subsequently the wafer is removed from the growth reactor and the buffer layer 720 is removed leaving free standing InN nanowires 740 where the openings within the buffer layer 720 existed.

Whilst the embodiments presented supra have been presented in respect of InN nanowires it would be evident to one skilled in the art that the principle applies to other group IIIA-nitrides where the group IIIA material nucleates and forms a liquid droplet upon the substrate during the initial phase of the nanowires growth where the nitrogen has not been admitted into the reaction chamber. These group IIIA elements all form a wurtzite crystalline structure in their nitrides. Accordingly the invention applies to structures formed with GaN deposited onto the substrate as well as the previously described InN deposited onto the substrate. It would also be apparent to one skilled in the art that alternate approaches to patterning the nanowires are feasible without departing from the scope of the invention.

Nanowire Devices and Quantum Structures

Figure 8:
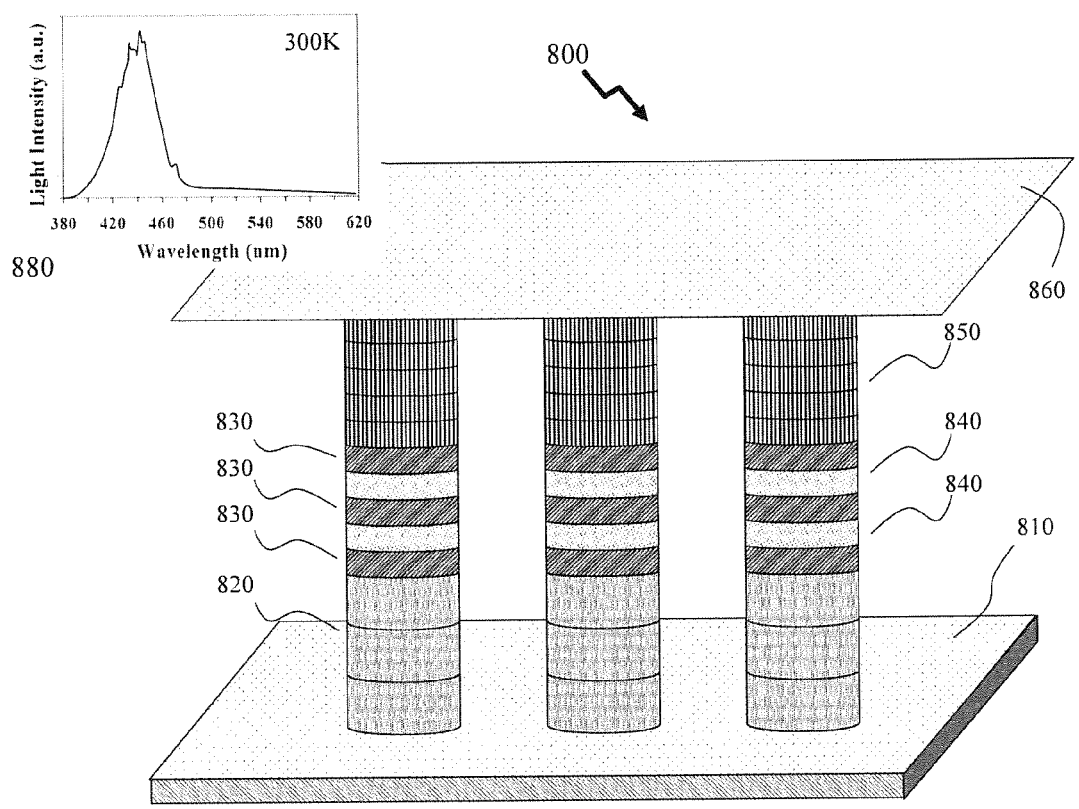
FIG. 8 depicts a nanowire based light source according to an embodiment of the invention.

Now referring to FIG. 8 there is depicted a nanowire light source 800 comprising InGaN/GaN well-in-a-wire nanowires LEDs formed according to embodiments of the invention. The substrate 810 for the nanowire light source 800 is an n-type silicon substrate upon which are grown 0.5 μm GaN nanowires doped with silicon to provide the lower n-type GaN material 820. The device active region consists of three InGaN quantum wells 830 separated by GaN spacers 840. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation. Atop the three InGaN/GaN quantum wells magnesium (Mg) doped GaN is grown to form the p-type GaN 850. The upper electrode for the InGaN/GaN well-in-a-wire nanowires LEDs forming the nanowires light source 800 is formed from indium tin oxide (ITO) 860, this being a transparent conductor. The nanowires light source 800 as fabricated and tested emits at 440 nm at 300K with high efficiency as evident from insert 880 showing the emission spectrum for such a GaN LED with InGaN/GaN quantum wells.

Figure 9:
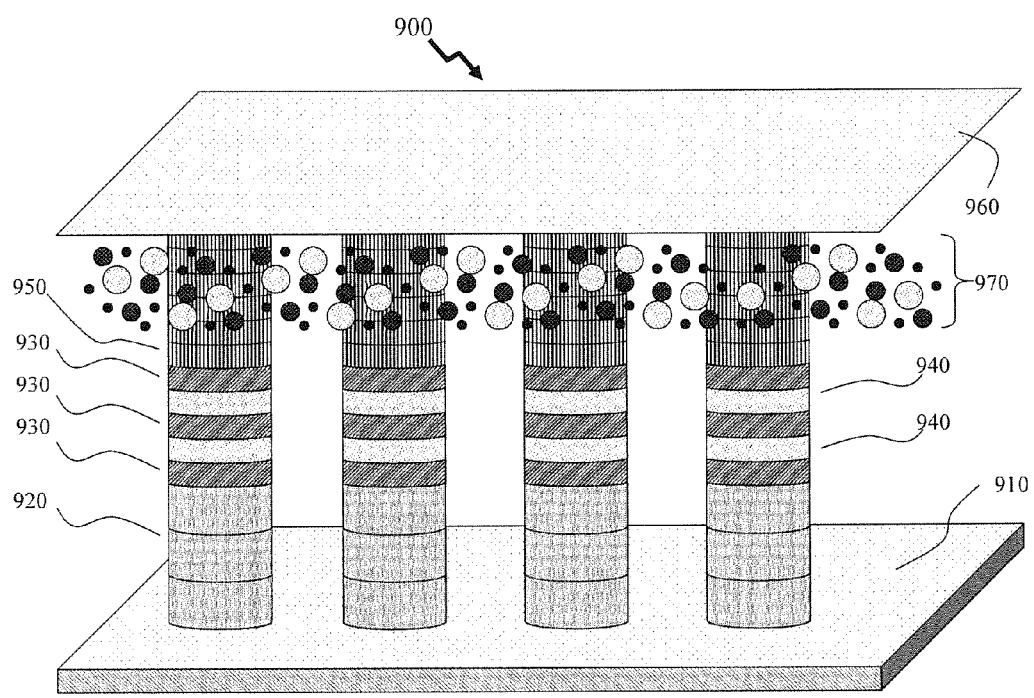
FIG. 9 depicts a nanowire and colloidal quantum dot based light source according to an embodiment of the invention.

FIG. 9 depicts a nanowire dot source 900 according to an embodiment of the invention. In common with nanowire light source 800 the substrate 910 is an n-type silicon substrate upon which are grown 0.4 μm GaN nanowires doped with silicon to provide the lower n-type GaN material 920. The device active region consists of three InGaN quantum wells 930 separated by GaN spacers 940. Atop the three InGaN/GaN quantum wells magnesium (Mg) doped GaN is grown to form the p-type GaN 850. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation.

Next colloidal quantum dots 970 have been spin-coated onto the surface after a planarization process to infill around the nanowires. The upper surfaces of the nanowires are then exposed using a selective etching process followed by the deposition of the ITO upper contact 960. As the colloidal quantum dots 970 largely reside above the InGaN/GaN quantum well regions their presence does not affect significantly the current flow, contact resistance or recombination process within the InGaN/GaN quantum well heterostructures. A portion of the emitted photons from the InGaN/GaN nanowires will be absorbed by the colloidal quantum dots 970 and "down converted" to photons with colors determined by the size and composition of the colloidal quantum dots 970.

For example the colloidal quantum dots may be CdS, CdSe, and CdTe to cover the blue/green/red portions of the visible spectrum. Some overlap of emission ranges occurs for example by size tuning the quantum dots, for example large CdS dots emit close to that of small CdSe dots. As taught by R. Cooney et al entitled "Gain Control in Semiconductor Quantum Dots via State-Resolved Optical Pumping" (Phys. Rev. Lett., Vol. 102, p. 127404, 2009) at quantum dot diameters below 2.5 nm no optical gain had been demonstrated within the prior art thereby removing some of the expected value of confinement based tunability. However, R. Cooney et al demonstrated that optical gain in any quantum dot could be achieved if the quantum dots are pumped using state resolved optical pumping. Such state resolved optical pumping implying that potentially multiple InGaN/GaN quantum wire heterostructures may be required and/or the distribution of the colloidal quantum dots be controlled to ensure that dots requiring state resolved optical pumping have sources, be it the InGaN/GaN quantum wire heterostructures or other colloidal quantum dots.

It would be apparent to one skilled in the art that other energy transfer processes may occur, including Forster resonant energy transfer and Dexter electron transfer processes, and at small quantum dot—nanowire separations direct tunnel injection of carriers will occur, increasing efficiency.

Figure 10:
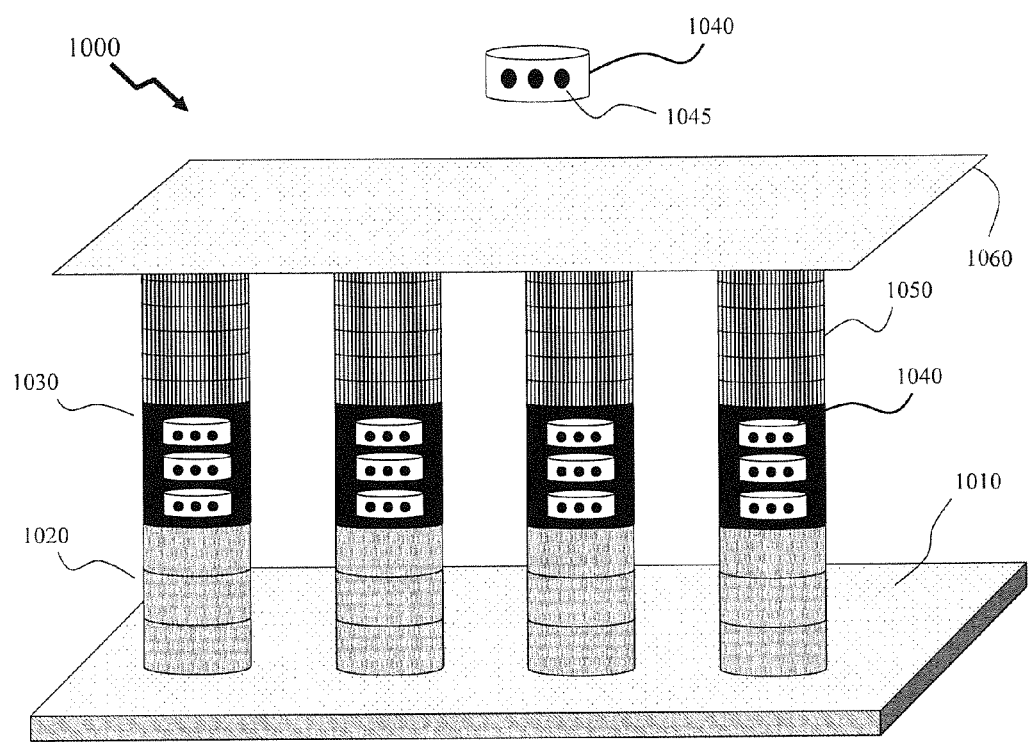
FIG. 10 depicts a nanowires light source employing nanowires featuring dot-within-a-dot-in-a-nanowire features for efficient optical sources according to an embodiment of the invention.

With the ability to form very high quality and uniform nanowires which are relatively defect free, as discussed supra in respect of FIGS. 3 through 7, it is feasible to consider growing so called dot-within-a-dot-in-a-nanowire heterostructures, employing quantum dots formed within the nanowires, for efficient photon generation. Such a dot-within-a-dot-in-a-nanowire light source 1000 is shown in FIG. 10 comprising a substrate 1010, for example n-type <111> silicon, upon which a GaN buffer 1020 is grown, followed by three vertically aligned large quantum dots 1040 within GaN barrier 1030, and a GaN capping layer 1050. An ITO electrode (with the incorporation of a thin metal layer in some cases) 1060 is formed on top of the GaN capping layer 1050 to provide the top electrode to the dot-within-a-dot-in-a-nanowire light source 1000. However, due to the very high quality, relatively defect free, and uniform growth provided by the invention within the quantum well and quantum dots localized In rich nanoclusters can form within each quantum dot as it is grown, thereby forming small quantum dots 1045 within each of the large quantum dots 1040. Such a dot-within-a-dot-in-a-nanowire has not been reported in the prior art and accordingly only feasible at this time using growth according to embodiments of the invention.

Such a dot-within-a-dot-in-a-nanowire heterostructure is shown in first SEM micrograph 1110. The InGaN/GaN dot-in-a-wire heterostructures consist of approximately 0.5 μm GaN buffer, three vertically aligned quantum dots separated by approximately 5 nm GaN barrier layers, and an approximately 0.3 μm GaN capping layer. The nanowire heterostructures were grown on silicon (<111>) substrates using a Veeco Gen II MBE system equipped with a radio frequency (RF) plasma source. According to this embodiment a thin layer of gallium is initially deposited forming nanoscale liquid droplets on the surface of the silicon wafer that form the nucleation sites for the growth of the GaN upon introduction of the ammonia precursor along with the trimethylgallium. Throughout the growth, the Ga flux and nitrogen flow rate were kept at approximately $5 \times 10^{-8}$ Torr and 1 sccm, respectively. The substrate temperature for GaN nanowires was approximately 800° C. that was lowered to approximately 550° C. during the growth of InGaN quantum dots. InGaN/GaN dot-within-a-dot-in-a-wire samples with different emission wavelengths were grown by varying the In/Ga flux ratios.

Figure 11:
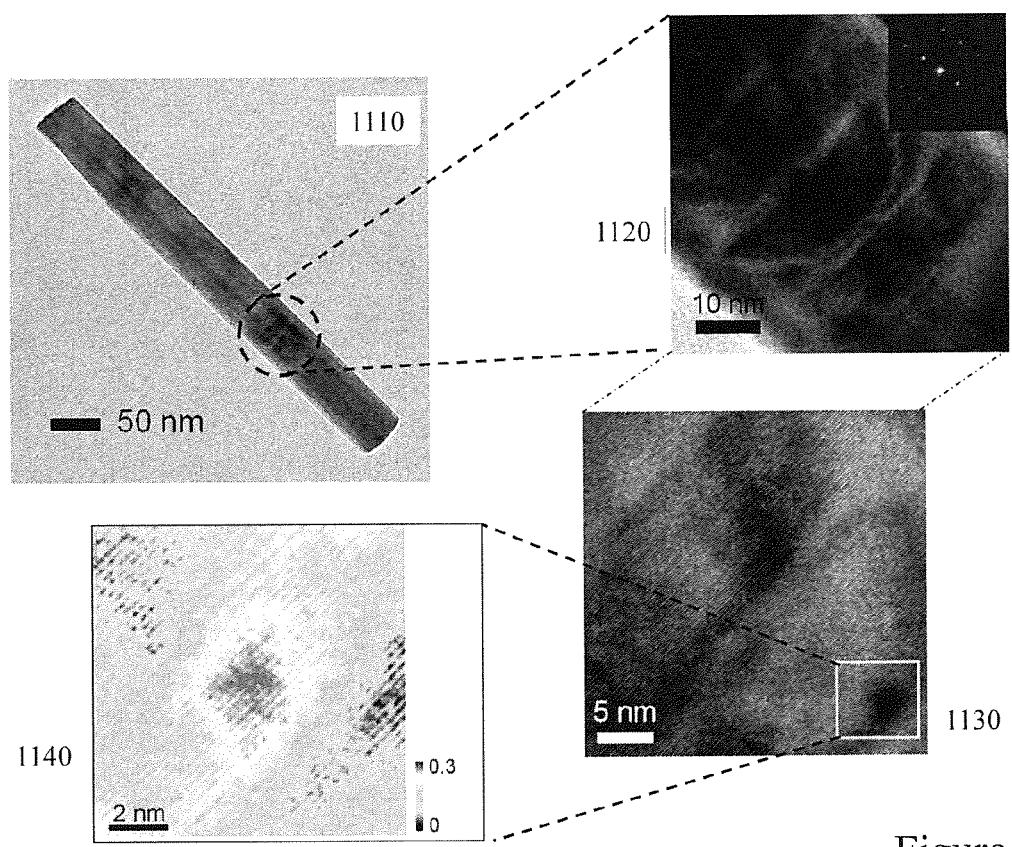
FIG. 11 depicts micrographs of a fabricated dot-within-a-dot-in-a-nanowire structure for a nanowires light source according to an embodiment of the invention.

It can be seen in first SEM micrograph 1110 that the nanowire as grown are vertically aligned and exhibit a diameter of approximately 50 nm. The nanowire densities can be varied from approximately $1 \times 10$ to $1 \times 10^{10}$ cm$^{-2}$ by changing the growth temperature and N/Ga flux ratios. It can also be seen in first SEM micrograph 1110 that the vertically aligned InGaN quantum dots can be identified. The InGaN/GaN nanowire is structurally uniform with a length of approximately 0.8 μm. Also shown in FIG. 11 is high resolution TEM image 1120 for the quantum dot active region as highlighted in first SEM micrograph 1110 for the three vertically aligned InGaN quantum dots, which are located at the center of the wire, and have been formed by the strain-induced self-organization. They exhibit a height of approximately 7 nm and a width of approximately 30 nm, which are larger than the commonly reported values for InGaN/GaN quantum dots embedded in planar heterostructures, see K. Tachibana et al (IEEE J. Sel. Top. Quantum., Vol. 6, p. 475, 2000). The InGaN quantum dots and surrounding GaN barrier layers are nearly free of dislocations, due to the reduced strain distribution in the nanowire heterostructures grown according to an embodiment of the invention.

The average In compositions in the dots are estimated to be in the range of approximately 15 to 25%, depending on the growth conditions, for green, yellow, and amber/red light emitting structures. It was also noted that a small amount (approximately 6%) of In atoms are incorporated in the GaN barrier layers. Also shown in FIG. 11 is detailed TEM image 1130 which shows the presence of the In-rich nanoclusters, small quantum dots 1045, thereby leading to the unique dot-in-a-dot heterostructures which due to their close spacing may be electronically coupled. These In-rich nanoclusters are formed by phase segregation, and their sizes vary from approximately 2 nm to approximately 5 nm from measurements on dot-within-a-dot-in-a-nanowires grown under varying conditions according to the embodiments of the invention. Also shown in FIG. 11 is an In composition distribution profile 1140, derived from the Vegard's law, for the selected region in detailed TEM image 1130. This shows an In-rich nanocluster with an In composition of approximately 28% and dimensions of approximately 3.5 nm.

Figure 12:
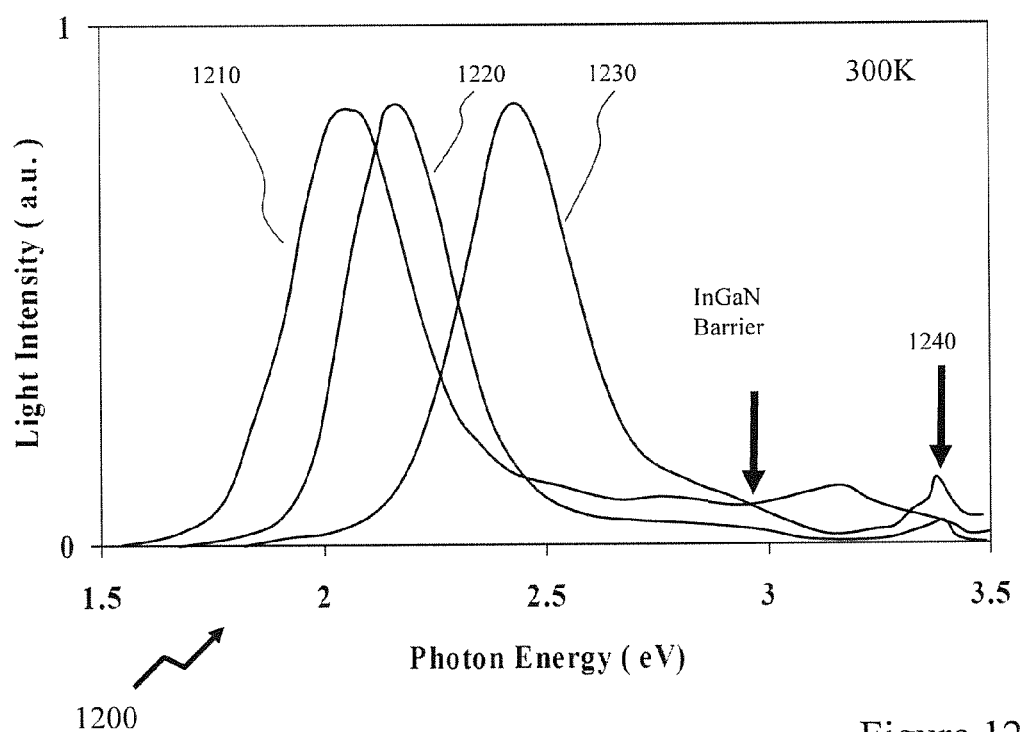
FIG. 12 depicts photoluminescence spectra for optical sources employing dot-within-a-dot-in-a-nanowire heterostructures with varying indium concentration according to embodiments of the invention.

Optical properties of InGaN/GaN dot-within-a-dot-in-a-nanowires nanoscale heterostructures were studied using temperature variable photoluminescence spectroscopy. FIG. 12 shows the normalized PL spectra 1200 measured under a pump power of approximately 100 W/cm² at room temperature for three InGaN/GaN dot-within-a-dot-in-a-nanowire heterostructures grown with different In/Ga flux ratios in first to third curves 1210 to 1230 respectively. The peak energy positions are at approximately 2.5 eV, approximately 2.2 eV, and approximately 2.0 eV, corresponding to green (approximately 495 nm), yellow (approximately 565 nm) and amber/red (approximately 620 nm) emission, respectively. The measured spectral linewidths are in the range of approximately 200 meV to 260 meV. For all three samples, luminescence emission from the GaN nanowires themselves can also be observed as peak 1240 at approximately 3.4 eV (approximately 365 nm) in FIG. 12. The intensity of this emission however is significantly smaller than that of the InGaN quantum dots, in spite of the thick GaN segments surrounding the dot layers. This further confirms the excellent optical quality of InGaN quantum dots. It may also be noted that a weak photoluminescence emission at approximately 3.0 eV (approximately 415 nm) can also be measured, which is likely from the portion of surrounding GaN barrier layers that incorporates the small (approximately 6%) amount of In atoms, due to phase segregation.

Figure 13:
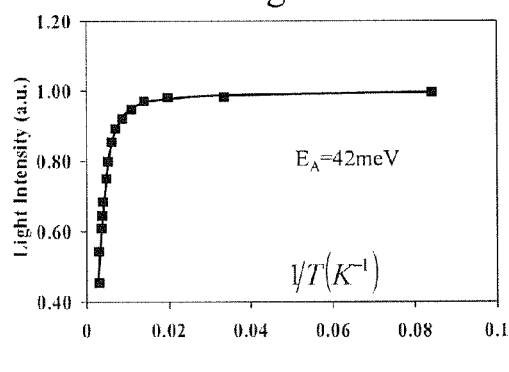
FIG. 13 depicts the variation of the integrated photoluminescence intensity with temperature for the yellow emitting InGaN/GaN dot-within-a-dot-in-a-nanowire heterostructures according to an embodiment of the invention.

The variation of the integrated photoluminescence intensity versus temperature is shown in FIG. 13 for the yellow emitting InGaN/GaN dot-within-a-dot-in-a-nanowire heterostructures ($\lambda_{pk} \approx 2.2$ eV (565 nm) measured under a pump power of approximately 100 W/cm². By modeling the data using an Arrhenius plot, activation energy $E_A \approx 42$ meV was derived based on the slope of the straight line in the high temperature range. The internal quantum efficiency at room temperature can be estimated by comparing the photoluminescence intensities measured at 300K and 10K respectively. Accordingly the InGaN/GaN dot-within-a-dot-in-a-nanowire heterostructures exhibit an internal quantum efficiency of approximately 45%, which is nearly a factor of 5 to 10 times larger than that measured in prior art InGaN ternary nanowires in the same wavelength range, see for example C. C. Hong et al (Optics. Exp., Vol. 17, p. 17227, 2009).

The emission mechanism of the unique InGaN/GaN dot-within-a-dot-in-a-nanowire heterostructures has also been investigated. Charge carriers are first incorporated in the vertically aligned InGaN quantum dots (large quantum dots 1040), which provides strong carrier confinement and therefore greatly reduce any nonradiative recombination associated with the nanowire surface states. The carriers subsequently drift to the localized deep potentials created by In-rich nanoclusters (small quantum dots 1045) and recombine radiatively. Further initial studies indicate that the large inhomogeneous broadening shown in the photoluminescence spectra is directly related to the size and compositional variations of these small quantum dots 1045 (I.e. the In-rich nanoclusters). The superior carrier confinement provided by both the self-organized InGaN quantum dots (large quantum dots 1040) and the In-rich nanoclusters (small quantum dots 1045) in conjunction with the nearly defect-free GaN nanowires grown according to an embodiment of the invention therefore explain the large internal quantum efficiency measured in the green, yellow, and amber/red wavelength ranges that was not previously possible using either InGaN nanowires, planar InGaN/GaN quantum dots, or well heterostructures according to the prior art.

Figure 14:
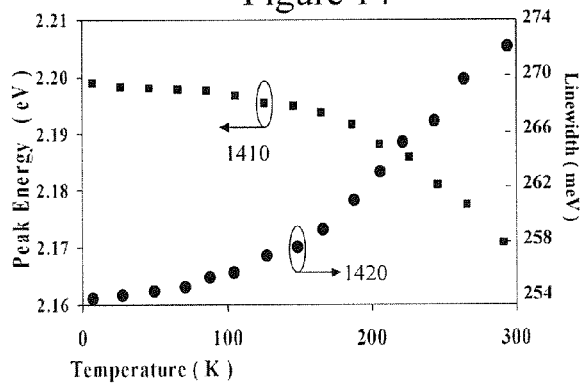
FIG. 14 depicts photoluminescence and spectral linewidth versus temperature for a yellow optical source employing nanowires with dot-within-a-dot-in-a-nanowire features.

Further studies indicate that these small quantum dots 1045 (In-rich nanoclusters) within the large quantum dots 1040 are electronically coupled. Shown in FIG. 14 is the variation of the photoluminescence peak energy 1410 and spectral linewidth 1420 measured for the yellow emitting InGaN/GaN dot-within-a-dot-in-a-nanowire heterostructure. It is seen that the photoluminescence peak energy 1420 decreases monotonically with the increase of temperature from 10K to 300K. The "S" shaped behavior, i.e. the initial increase of the peak energy with the increase of temperature, commonly observed for InGaN/GaN quantum wells and InGaN nanowires, see for example C. C. Hong et al (Optics. Exp., Vol. 17, p. 17227, 2009), due to the presence of localized states in the tail density of states, is absent in the InGaN/GaN dot-within-a-dot-in-a-nanowire heterostructures grown according to an embodiment of the invention. The unique carrier dynamics of emitting InGaN/GaN dot-within-a-dot-in-a-nanowire heterostructure can be well explained, if the small quantum dots 1045 in the large quantum dots 1040 are electronically coupled. Under this condition, they can be modeled as 3-dimensional superlattices with discrete energy levels such that confined carriers will relax into the lower energy states before recombining, since the InGaN/GaN dot-within-a-dot-in-a-nanowire heterostructures are nearly free of dislocations. It is therefore expected that the photoluminescence peak energy follows the typical temperature dependence of the energy bandgap, instead of the anomalous "S" shaped behavior. The equilibrium carrier distribution in a single wire is also evidenced by the variation of the spectral linewidth 1420 with temperature, shown in FIG. 14, which displays a small increase with the increase of temperature, due to phonon scattering.

To date, the realization of InN nanowire solar cells, as well as many other semiconductor devices, has been further limited by the difficulty in achieving p-type doping. In this regard, Mg-doped InN films and the formation of p-type carriers have been investigated both theoretically and experimentally, see for example J. H. Song et al in "Stabilization of Bulk p-Type and Surface n-Type Carriers in Mg-Doped InN {0001} Films" (Phys. Rev. Lett., Vol. 101, p. 186801, 2008). A Fermi level shift toward the valence band was measured in InN:Mg layers, see Kudrawiec et al in "Photoreflectance of InN and InN:Mg Layers—Evidence of a Fermi Level Shift Toward the Valence band upon Mg Doping in InN" (Appl. Phys. Lett., Vol. 93, p. 131917, 2008), and the possibility of p-type doping has also been further suggested by electrolyte capacitance-voltage measurements. In order to compensate the presence of large electron densities of nominally non-doped InN as well as the associated surface electron accumulation, a relatively high concentration of Mg dopant is required, which, however, may lead to the formation Mg-related, donor like defects. Additionally, the growth and characterization of InN:Mg nanowires, to the best knowledge of the inventors, has not been reported. It has been observed that the incorporation of Mg can significantly affect the formation and structural properties of GaN nanowires, see for example F. Furtmayr et al in "Nucleation and Growth of GaN Nanorods on Si {111} Surfaces by Plasma Assisted Molecular Beam Epitaxy—The Influence of Si and Mg Doping" (J. Appl. Phys. Lett., Vol 104, p 034309). The presence of Mg can greatly reduce the nanowire nucleation time and enhance the growth rate on the nonpolar surfaces, thereby leading to wires with increased diameters and reduced lengths. Additionally deteriorated crystal structures have been reported in the prior art at relatively high Mg concentrations. It is therefore of tremendous importance to develop nearly intrinsic InN nanowires as well as InN nanowire p-n junctions, in order to exploit the full potential of InN for third generation photovoltaics.

Electronically pure InN nanowires were grown on Si(111) substrates by plasma-assisted MBE under nitrogen-rich conditions according to an embodiment of the invention using conditions as described supra in respect of FIGS. 4A through 4D. Important for practical device applications such as optical sources, solar cells, etc is a precise control of the carrier concentration and conductivity of InN nanowires. The residual electron density of InN can be derived from a Hall-effect measurement or by analyzing the photoluminescence spectral linewidth measured at low temperatures. For conventional n-type degenerate InN, the measured photoluminescence linewidths are generally in the range of 50 to 100 meV, which correspond to residual electron densities of approximately $10^{18}$ cm$^{-3}$, or higher. Photoluminescence spectra for non-tapered InN nanowires measured under various laser powers at 5 K resulting in an extremely narrow spectral linewidth of 8 meV under low excitation conditions. Detailed analysis revealed that the electron density in the undoped InN nanowires was approximately $2 \times 10^{15}$ cm$^{-3}$, or less, which is nearly a factor of 500 times smaller than the commonly reported values, see for example T. Stoica in "Photoluminescence and Intrinsic Properties of MBE-grown InN Nanowires" (Nano. Lett., Vol. 6, p. 1541, 2006), suggesting for the first time that nearly intrinsic InN has been achieved, see also Y-L. Chang et al in "Photoluminescence Properties of Nearly Intrinsic Single InN Nanowire" (Adv. Funct. Mater, 2010, Vol. 20, p. 4146, 2010).

Figure 15A:
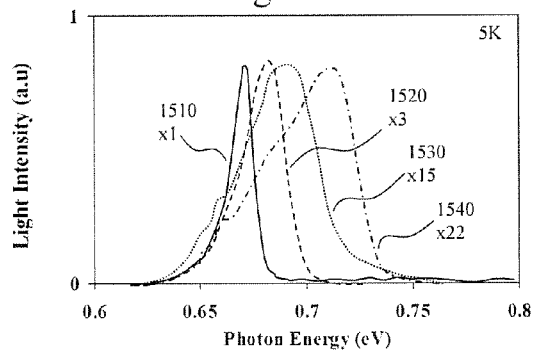
FIGS. 15A and 15B depict photoluminescence spectra for Si and Mg doped InN nanowires according to embodiments of the invention.

With the achievement of nearly intrinsic InN nanowires, the inventor(s) has(have) investigated the growth and optical properties of Si- and Mg-doped InN nanowires. These nanowires are grown by introducing the respective dopants during nanowire growth without any modifications to the previously described growth conditions. Due to the significantly enhanced In adatom surface migration and the preferred growth along the nanowire length direction, the resulting doping level is generally smaller, compared to that of planar heterostructures. The inventors believe that the local dopant fluctuation in the wires may also be negligible, due to the relatively large (>100 nm) wire diameters. For the Si doping concentrations considered (<approximately $1 \times 10^{18}$ cm$^{-3}$), no morphological changes to the InN nanowires were observed. However, the incorporation of Si-dopant can significantly modify the optical properties of InN nanowires. Referring to FIG. 15A there are shown the photoluminescence spectra of InN:Si nanowires measured at 5 K for various Si doping levels.

Figure 15B:
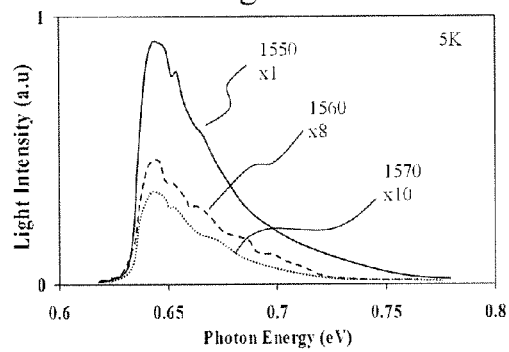

As shown first curve 1510 represents the spectra for Si doping at $1 \times 10^{18}$ cm$^{-3}$ magnified 22 times, second curve 1520 for $2 \times 10^{17}$ cm$^{-3}$ magnified 15 times, third curve 1530 for $5 \times 10^{16}$ cm$^{-3}$ magnified 3 times, and 1540 for non-doped nanowires without scaling, all measurements being made at 5K. It is seen that, with increasing Si-doping concentration, the InN nanowires exhibit a considerable blue shift in the photoluminescence peak energy, a drastic increase in the spectral linewidth, and a significant decrease in the luminescence efficiency Now considering Mg doping then it was determined from photoluminescence measurements of InN:Mg films, it was determined that the Mg acceptor activation energy was about 61 meV, see X. Q. Wang et al in "Growth and Properties of Mg-Doped In-Polar InN Films" (Appl. Phys. Lett., Vol. 90, p. 201913, 2007). However, to the best of the inventors' knowledge, the growth and properties of InN:Mg nanowires have not been reported. In this study, InN:Mg nanowires, with Mg effusion cell temperatures varying from 185° C. to 235° C., were grown and characterized. It was observed that, for relatively low Mg concentrations, InN nanowires with excellent surface morphology and structural properties were obtained but that with increasing Mg flux, the wires showed increasing diameter and reducing length, potentially due to the reduced adatom surface migration. A further increase of the Mg concentration generally led to an onset of tapered surface morphology, with decreasing width with growth time, and the generation of dislocations Referring to FIG. 15B there are shown photoluminescence spectra for InN:Mg nanowires measured at 5K for various Mg effusion cell temperatures. It is observed that the photoluminescence peak intensity decreases considerably with increasing Mg incorporation, which may be directly related to the formation of Mg-related defects. First curve 1550 representing an effusion cell temperature of 185° C., second curve 1560 an effusion cell temperature of 215° C., and third curve an effusion cell temperature of 235° C. Second and third curves 1560 and 1570 being magnified by 8 and 10 times respectively.

Mg and Si doped regions of a nanowire when disposed either side of an intrinsic region allow for the formation of a PIN structure providing for electrical injection of carriers into the dot-in-a-wire structures. Additionally, intentional controlled variations (modulation) of the doping with the quantum dot active regions can provide for enhanced hole transport thereby addressing a major bottleneck to high quantum efficiency, as discussed supra.

Figure 16:
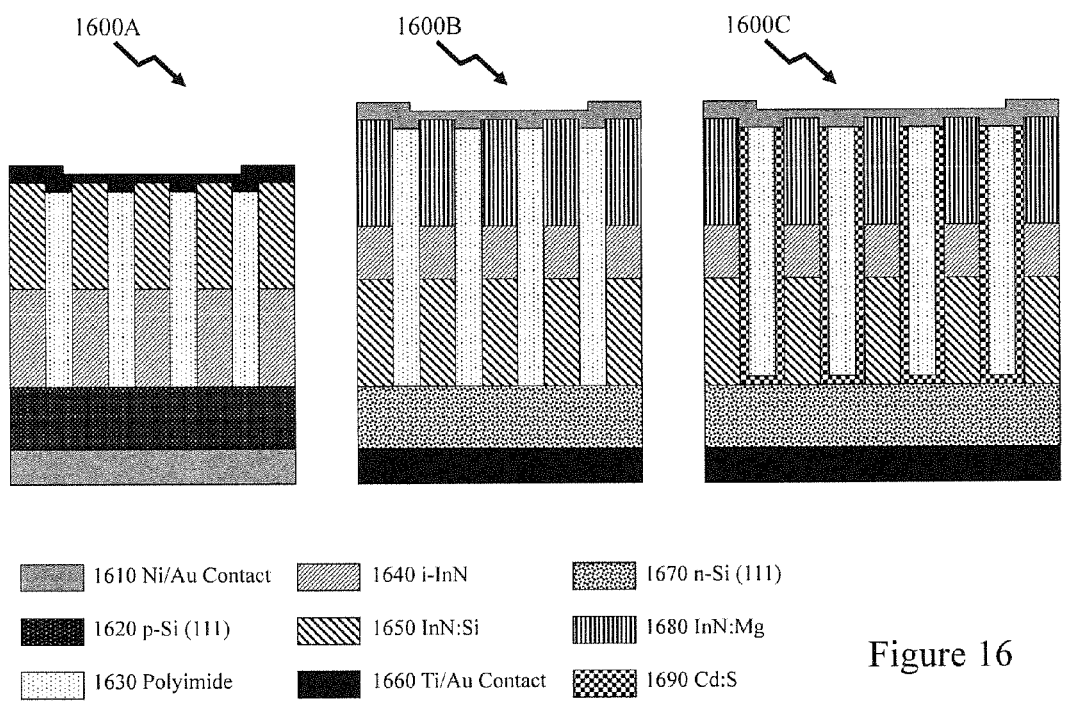
FIG. 16 depicts schematic designs for InN nanowire solar cells according to embodiments of the invention.

Referring to FIG. 16 there are depicted schematic designs for three InN nanowire solar cells according to embodiments of the invention. First solar cell 1600A the InN nanowire solar cells consist of 0.3 µm non-doped (intrinsic) InN 1640 with 0.4 µm Si doped InN 1650 sections, which are grown directly on p-type Si(111) 1620 substrate. The InN nanowires are separated by polyimide 1630, and first solar cell 1600A having lower contact of Ni/Au 1610 and top contact Ti/Au 1660. Such a design does not require the use of p-type InN nanowires, which had not been demonstrated prior to the invention described in this specification, but could not be implemented through poor morphology, varying nanowire height, etc. Second and third solar cells 1600B and 1600C respectively employ InN p-i-n axial homojunctions which comprise of ~0.8 µm InN:Si 1650, 0.2 µm non-doped InN (intrinsic) 1640, and 0.3 µm InN:Mg 1680 sections grown on n-type Si(111) 1670 substrates.

Compared to first solar cell 1600A these p-n junctions are formed within the InN nanowires. It may be noted that a small variation in the thicknesses of the device intrinsic regions i-InN 1640 may arise, which does not have any major impact on the device efficiency. Second and third solar cells employing Ni/Au 1610 upper contacts and Ti/Au 1660 contacts. In these solar cell designs the top/upper contact is approximately 15 nm thick. One of the primary limitations for semiconductor nanowire devices is the significant non-radiative carrier recombination associated with the presence of surface states, which can be greatly minimized by using core-shell or dot/well-in-a-wire nanoscale heterostructures, see Y. L. Chang et al in "High Efficiency Green, Yellow, and Amber Emission from InGaN/GaN Dot-in-a-Wire Heterostructures on Si (111)" (Appl. Phys. Lett., Vol. 96, p. 013106).

Accordingly third solar cell 1600C employs a CdS 1690 layer for passivation, this being a thin CdS layer coated onto the nanowire surface using a chemical bath deposition method at ~70° C., wherein the bath consists of CdCl2, NH4Cl, and NH4OH, with a molecular proportion of 2:20:20:200. The resulting CdS 1690 layer is nearly intrinsic and exhibits a very high resistivity (~10+6 Ohm cm). Such a passivation/buffer layer has been widely used in the fabrication of CuIn(Ga)Se2 solar cells and has led to the most efficient (~19.9%) thin film solar cells ever reported, see M. A. Conteras et al in "Progress Toward 20% Efficiency in Cu(In, Ca)Se-2 Polycrystalline Thin-Film Solar Cells" (Prog. Photovolt. Res. Appl., Vol. 7, pp 311-316). Growth conditions for the various nanowire samples have been carefully controlled to achieve high-quality InN nanowires with relatively large diameters (>150 nm) to effectively enhance the light absorption.

Figure 17A:
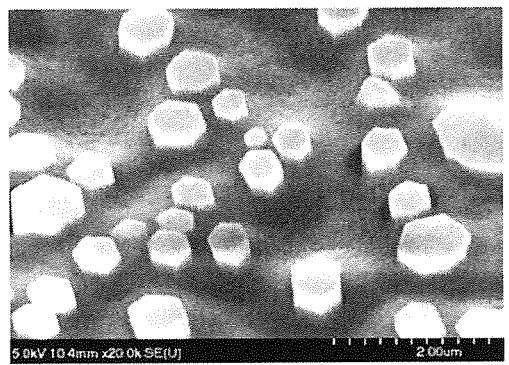
FIGS. 17A and 17B depict SEMs of the top surface of fabricated InN nanowire solar cells prior and subsequent to top metallization according to an embodiment of the invention.
Figure 17B:
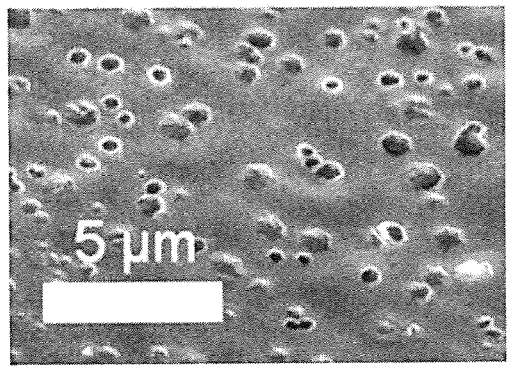

The fabrication process for InN nanowire solar cells on Si according to second solar cell 1600B begins with a polyimide (PI) 1630 resist layer that is first spin-coated to fully cover the InN nanowires for surface planarization. The PI layer is subsequently etched using O2:CF4 (1:4) dry-etching until the top region of the wires is exposed, shown in FIG. 17A. The wafer is then flood-exposed with UV light and hard-baked at ~350° C. for ~30 minutes to cure the PI. The top exposed section of the wires is patterned, using standard photolithography, into cells of various sizes (0.09 mm$^2$ up to 1.00 mm$^2$) and, a thin Ni/Au 1610 (~5 nm/~10 nm) p-metal contact is deposited on the cell surface, as shown in FIG. 17B, which is followed by the deposition of thick Ni/Au metal contact layers at the periphery of the devices. Ti/Au 1660 (30 nm/150 nm) layers are then deposited on the backside of the n-Si 1670 substrate as the n-metal contact. The sample is annealed at 300-400° C. for 60 seconds.

Figure 18:
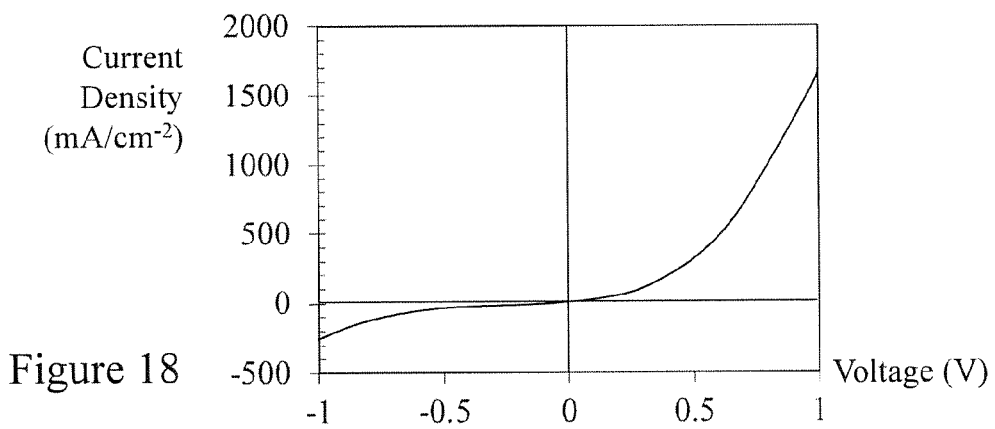
FIG. 18 depicts the dark I-V response for an InN:Si/i-InN nanowire device according to an embodiment of the invention.

Considering initially first solar cell 1600A, representing the prior art without the ability to implement p-type InN nanowires is described under dark and illumination, established as one-sun at AM 1.5G conditions, azimuth angle 48.2 degrees. First solar cell 1600A, the InN:Si/i-InN/p-Si heterojunction nanowire solar cells exhibit very poor diode characteristics, with rectifying ratios in the range of ~2 to ~4 measured at −0.5 V and 0.5 V as shown in FIG. 18. At −1V, a leakage current of more than 100 mA/cm2 was measured. As a consequence, no significant photo response was observed. The measured short-circuit current density and energy conversion efficiency were less than 2 mA/cm2 and 0.01%, respectively.

Figure 19A:
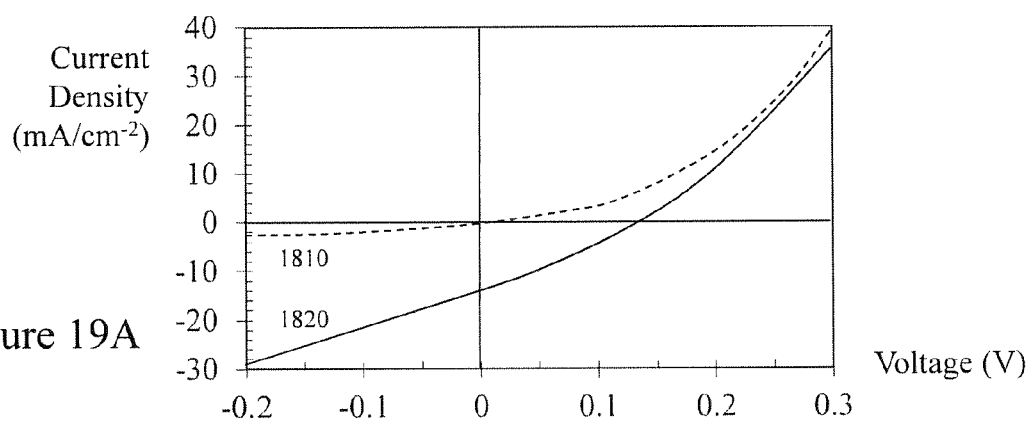
FIG. 19A depicts the I-V response for an InN;Mg/i-InN/ InN:Si nanowire device according to an embodiment of the invention.

Now referring to FIG. 19A there is shown the measured performance for second solar cell 1600B grown on n-type Si substrates. Under dark conditions, first curve 1910, the InN:Si/i-InN/InN:Mg nanowire device exhibits characteristics of a diode structure, with a significantly improved rectifying ratio (~60) measured at −1V and +1V, which is attributed to the built-in electric field in the p-i-n nanowire homojunction. In addition, a clear photoresponse is evident from second curve 1920 Under simulated AM 1.5G illumination, a short-circuit current density of ~12.9 mA/cm2 was obtained for a device area of 1 mm2. The measured open-circuit voltage, fill factor, and power conversion efficiency being ~0.13V, 30.2%, and 0.51%, respectively. The functioning of the InN p-i-n axial.

Figure 19B:
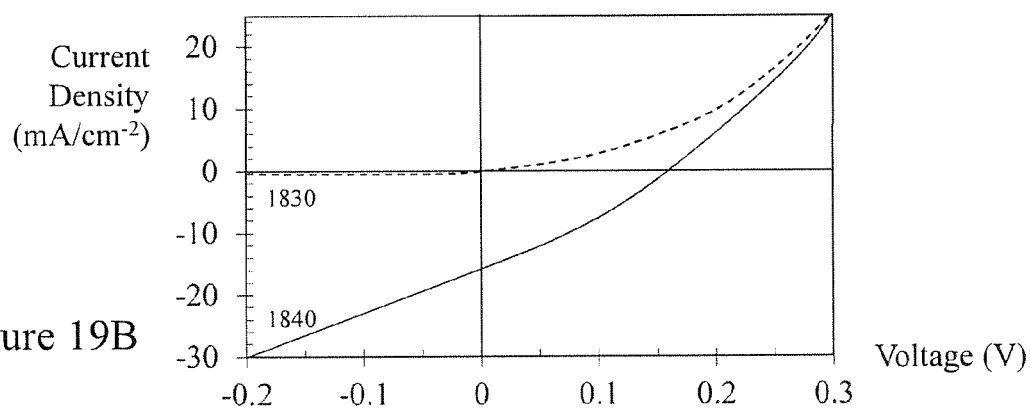
FIG. 19B depicts the I-V response for an InN:Mg/i-InN/ InN:Si nanowire device with CdS passivation according to an embodiment of the invention.

The performance of the afore-described InN:Si/iInN/InN:Mg nanowire homojunction solar cells, first and second solar cells 1600A and 1600B respectively may be limited by the presence of surface states, as discussed above which can be addressed, to a certain extent, with the use of CdS surface passivation. Illustrated in FIG. 19B there are the measured I-V curves under dark and illuminated conditions for the third solar cell 1600C, wherein a thin (~10 nm) CdS passivation-layer is incorporated. A reduction in the reverse leakage current and an improvement in the rectifying ratio (~150) were measured, compared to identical devices fabricated without the use of any CdS passivation, as evident from first curve 1930. The improved diode characteristics are attributed to the effective carrier confinement provided by the large bandgap CdS and the suppression of carrier leakage through the wire surface. Under one-sun (AM 1.5G) illumination, depicted by second curve 1940, the devices exhibit further improved performance, with a short-circuit current density of ~14.4 mA/cm2, open circuit voltage of 0.14 V, fill factor of 34.0%, and energy conversion efficiency of 0.68%. The measured short-circuit current densities are much larger than the commonly reported values for nanowire solar cells. The open-circuit voltage, whilst relatively low, can be improved by utilizing large bandgap InGaN nanowires and by optimizing the surface passivation and fabrication processes.

It would be evident to one of skill in the art that the performance of the InN nanowire solar cells may also be limited by the surface electron accumulation of n-type InN and the non-ideal carrier transport across the InN/Si misfit interface, due to the presence of a thin (~2-3 nm) amorphous SiNx layer, see H. P. T. Nguyen et al in "InN p-i-n Nanowire Solar Cells on Si" (J. Sel. Topic. Quant. Elect., Vol. 17, pp. 1062-1069, hereinafter Nguyen 1). Optionally improved device performance may be achieved utilizing core/shell heterostructures and by employing a planar GaN or InN buffer layer. Additionally, the energy conversion efficiency is currently limited by the low wire density, which as shown in FIG. 17A is a surface coverage of InN nanowires of less than 30%. As a result, a significant portion of the solar radiation cannot be absorbed by InN, and the benefit of light trapping associated with nanowires may be absent as well. Consequently, by optimizing the wire density and diameters, the energy conversion efficiency can be readily increased by a factor of 3, or larger.

Additionally the energy conversion efficiency will improve with InGaN nanowire solar cells with an optimized energy bandgap. Optionally the use of coalescent growth for a planar top contact layer would also greatly facilitate the device fabrication and reduce the series resistance.

According to an embodiment of the invention catalyst-free, vertically aligned InGaN/GaN dot-in-a-wire heterostructures were grown on Si(111) substrates by radio-frequency plasma-assisted molecular beam epitaxy. The GaN nanowires being formed under nitrogen rich conditions with conditions that included a growth temperature of approximately 750° C., nitrogen flow rate of 1-2 sccm, and a forward plasma power of approximately 400 W. Shown in FIG. 20A are 45 degree tilted SEM images of the resulting InGaN dot-in-a-wire heterostructures grown on Si (111) substrate. The areal density of the nanowires is estimated to be approximately $1 \times 100^{10}$ cm$^{-2}$. It is evident that the nanowires are vertically aligned to the substrate and exhibit a high degree of size uniformity.

Within the preceding descriptions of dot-in-a-wire nanowires in respect of FIGS. 10 through 15 above the InGaN/GaN dot-in-a-wire heterostructures consisted of approximately 0.5 μm GaN buffer layer, three vertically aligned quantum dots separated by approximately 5 nm GaN barrier layers, and an approximately 0.3 μm GaN capping layer wherein variations in emission from green (approximately 495 nm) through yellow (approximately 565 nm) to amber/red (approximately 620 nm) being achieved by growing the heterostructures with different In/Ga flux ratios.

As discussed supra the provisioning of white light sources with LED devices in the prior art is to co-package red, green, and blue LEDs as fabricating all three devices on a single substrate requires three separate epitaxial growth sequences with intermediate processing. However, the inventor(s) has (have) established a vertically integrated multi-element white light LED that is formed in a single epitaxial growth and processing sequence. According to an embodiment of the invention multiple self-organized InGaN quantum dots are incorporated into each GaN nanowire. A bright field scanning transmission electron microscopy (STEM) image of a single InGaN/GaN dot-in-a-wire is shown FIG. 20B, wherein the vertically aligned multiple InGaN quantum dots can be identified. The nanowires are of wurtzite crystal structure, with the c-axis aligned along the growth direction as discussed supra. The quantum dot layers were grown at relatively low temperatures of 550° C. to 600° C. to enhance the In incorporation. The quantum dot widths are in the range of 20 nm to 40 nm, and the quantum dot heights, which can be varied by varying the growth time at each specific stage in the growth sequence for each quantum dot, were within the range from approximately 3 nm to approximately 10 nm. Unlike prior art quantum well/disk-in-a-wire heterostructures, the quantum dots are completely embedded in the center region of the nanowires, thereby leading to superior three-dimensional carrier confinement. It can also be seen that the InGaN quantum dot alignment is correlated along the growth direction, due to strain-induced self-organization, which is indicated by the white arrow shown in FIG. 20B.

Figure 21:
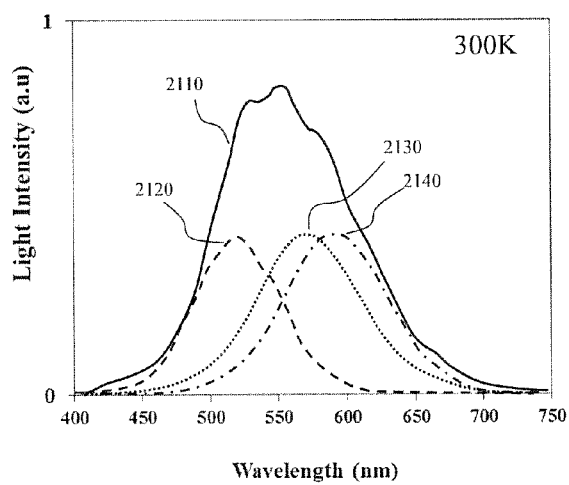
FIG. 21 shows photoluminescence spectra for InGaN/GaN dot-in-a-wire heterostructures grown on Si(111) according to different conditions.

Now referring to FIG. 21 the photoluminescence spectra of InGaN/GaN dot-in-a-wire heterostructures grown under different conditions measured at room temperature are depicted. The optical properties of the quantum dots are determined by the sizes and compositions of the quantum dots and, to lesser extent, the nanowire diameter. Consequently, multicolor emission, illustrated in FIG. 21 by first to third spectra 2120 to 2140 respectively, can be controllably achieved by varying the growth conditions, including the substrate temperature, growth duration, and In/Ga flux ratio. Defect related yellow luminescence, which is commonly observed in GaN films, is absent in catalyst-free GaN nanowires. Compared to previously reported InGaN/GaN quantum wells, InGaN ternary nanowires, or InGaN/GaN well/disk-in-a-wire heterostructures, the use of self-organized quantum dots can enable ultrahigh emission efficiency in the entire visible spectrum, due to the superior 3-dimensional carrier confinement and a high degree of tunability offered by the dots. Significantly, intrinsic white light can be achieved by light mixing of the blue, green and red emission from self-organized quantum dots incorporated in single GaN nanowires. This is evidenced by the photoluminescence spectrum 2110 shown in FIG. 21 for GaN nanowires that incorporate ten vertically aligned InGaN/GaN quantum dots with varying In compositions. The emission peak of the nanowire LED white light source was centered at approximately 545 nm and spans nearly the entire visible wavelength range. It would be evident that the spectral profile may be adjusted with variations in the number of quantum dots and their composition/geometry to broaden the profile, flatten it, weight it to the red or blue ends of the spectrum or even extend it into the near ultraviolet and/or near infrared.

Figure 22:
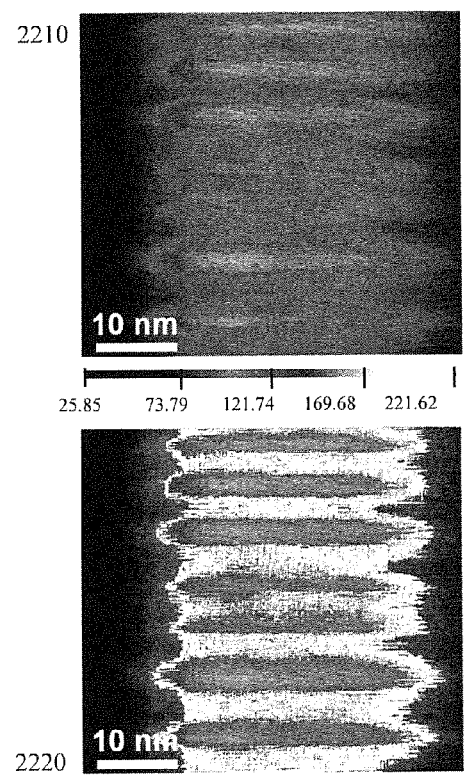
FIG. 22 is a high-resolution dark field image showing the contrast between the InGaN dots and GaN barriers.

A better understanding of the growth and emission mechanisms, STEM imaging and spectrum imaging (SI) were performed on single nanowires to investigate the structural properties of the InGaN/GaN dot-in-a-wire heterostructures. A high-resolution high angle annular dark field (HAADF) image showing the atomic number contrast is illustrated in FIG. 22 by first image 2210. Due to the issues of false coloring and reproduction in black and white for the patent specification this image has also been reproduced as second image 2220 wherein removal of coloring in the region of atomic numbers approximately 100-140 has been performed through color selection in a graphics image processing application to try and accentuate the differentiation between quantum wells, the barriers, and the nanowire. The intensity at each pixel in the image is presented as a pseudo-color display in order to highlight the changes in intensity quantitatively. The InGaN dots are located at the regions with relatively high intensity, since the average atomic number in the quantum dot region is larger than that in the GaN barriers. Importantly, no extending defects such as dislocations or stacking faults are observed in the InGaN/GaN quantum dot active regions.

Figure 23A:
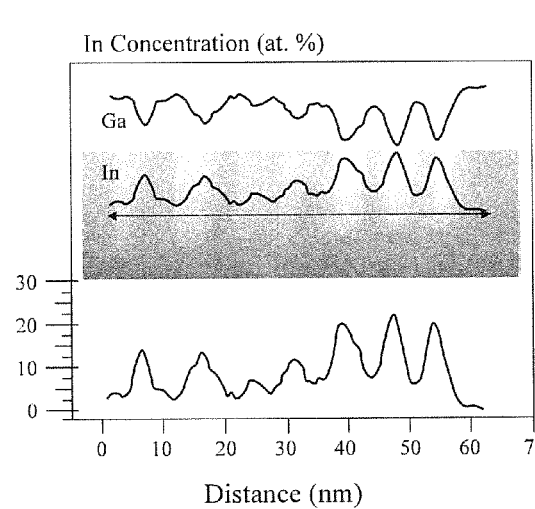
FIGS. 23A and 23B depict energy dispersive X-ray spectrum images of dot-in-a-wire heterostructures showing the In and Ga signal levels along the lateral and transverse directions.

In order to study the elemental distribution in the InGaN dots, energy dispersive X-ray spectrometry spectrum image (EDXS-SI) was performed across the centers of InGaN/GaN quantum dots. From the qualitative variation of the In $L_\alpha$ and Ga $K_\alpha$ signals shown in FIG. 23A, an In-rich or Ga-deficient region is observed in each of the InGaN dots. Using the Ga signal from the top GaN capping region as a built-in reference, the In concentration in each $In_xGa_{1-x}N$ dot is quantified and shown as the line profile in FIG. 23A. The In composition (x) in each dot is not uniform, and it varies from 10% to 50% atomic percent. Although these values are based on the through thickness averaging, the compositional variation of the dots is consistent with the large inhomogeneous broadening observed in the photoluminescence spectra evident in FIG. 17.

Figure 23B:
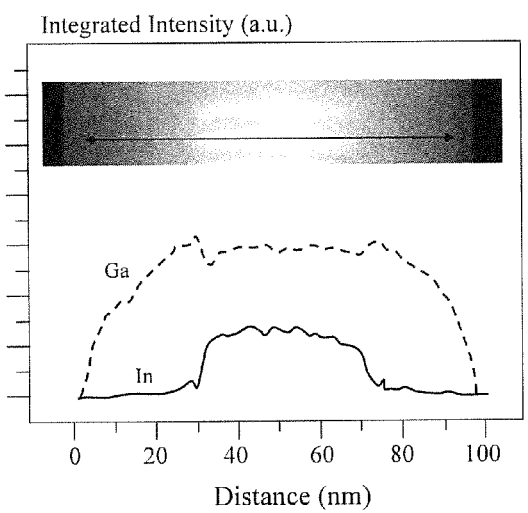

Since the sub-nanometer spatial resolution EDXS conditions were used, it may also be noticed both from the HAADF images and the EDXS data that the barrier layers contain a small percentage of In, due to In segregation, thereby leading to unique dot-in-a-wire core-shell nanoscale heterostructures. Besides the EDXS analysis, an electron energy loss spectrometry spectrum image (EELS-SI) was taken along the lateral direction, indicated by the arrow, of an individual InGaN dot, illustrated in the inset of FIG. 23B. The line profile of the integrated intensity for In $M_{4,5}$ and Ga $L_{2,3}$ edge are also depicted, and a drop/increase of the Ga and In signal respectively is observed in the dot region. The diameter of the dot is estimated to be approximately 40 nm based on the In profile. It was also evident that the quantum dots were positioned centrally within the nanowire.

Figure 24:
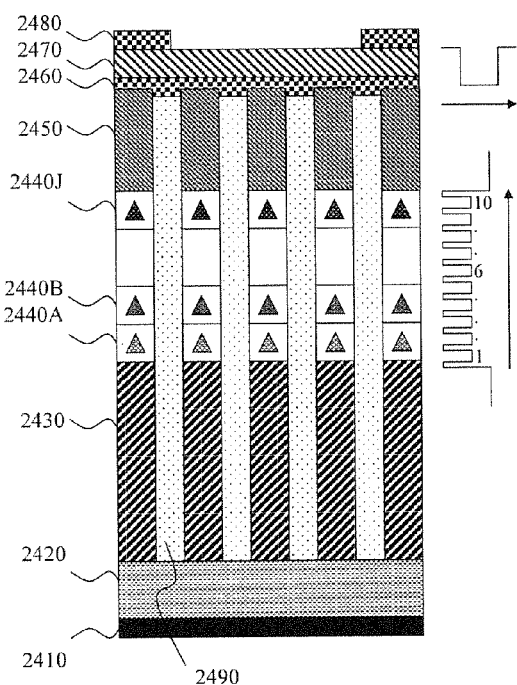
FIG. 24 depicts a schematic construction of a dot-in-a-wire white light LED source according to an embodiment of the invention.

The self-organized InGaN/GaN dot-in-a-wire LED heterostructures, schematically illustrated in FIG. 24, were grown on low resistivity n-type Si(111) substrates 2420. The bottom n-type Si doped GaN 2430 is formed atop this, followed by the ten quantum dots 2440A through 2440J, and then the upper p-type Mg doped GaN 2450. Providing the electrical contacts are lower Ti/Au contact 2410 and upper Ni/Au contacts 2460 and 2480 that are separated by an indium tin oxide (ITO) 2470. The nanowires are separated by polyimide 2490. As shown the device active region consists of ten vertically aligned InGaN quantum dots, 2440A, 2440B, to 2440J separated by GaN barrier layers, typically approximately 3 nm thick. The flat energy band diagrams along the nanowire axial direction and along the lateral direction of the quantum dot active region are also illustrated in FIG. 24. Due to In segregation, the GaN barrier layers also contain a small percentage (approximately 5-10%) of In.

The resulting thin, approximately 3 nm, InGaN barrier layers can enhance the hole injection and transport in the quantum dot active region, thereby leading to more uniform hole distribution, reduced electron leakage, and enhanced internal quantum efficiency at relatively high current levels. To further enhance the hole transport the structure is modulation doped p-type, which is achieved by incorporating Mg in part of the GaN barrier layer, with the Mg effusion cell temperature at approximately 150° C. to approximately 200° C. This technique of modulation p-doping being shown by the inventors to reduce deleterious effects associated with the direct Mg incorporation in the quantum dots. As a consequence, no degradation in the optical properties of the p-doped dot-in-a-wire heterostructures was measured compared to the undoped LED device heterostructures.

During the device fabrication process, the InGaN/GaN nanowire arrays were first planarized using a polyimide 2490 resist layer by spin-coating, which was followed by an appropriate dry etching process to reveal the top GaN:Mg 2450 sections of the dot-in-a-wire heterostructures. The p-metal and n-metal contacts, consisting of Ni (approximately 5 nm)/Au (approximately 7 nm)/indium tin oxide (ITO) 2460 and Ti/Au 2410 layers, were then deposited on the exposed wire surface and the backside of the Si substrate 2420, respectively. The fabricated devices with Ni/Au 2460 and Ti/Au 2410 metal contacts were first annealed at approximately 500° C. for 1 minute in nitrogen ambient. Upon deposition of the ITO transparent contact, a second annealing step was performed at approximately 300° C. in vacuum for approximately 1 hour.

Figure 25:
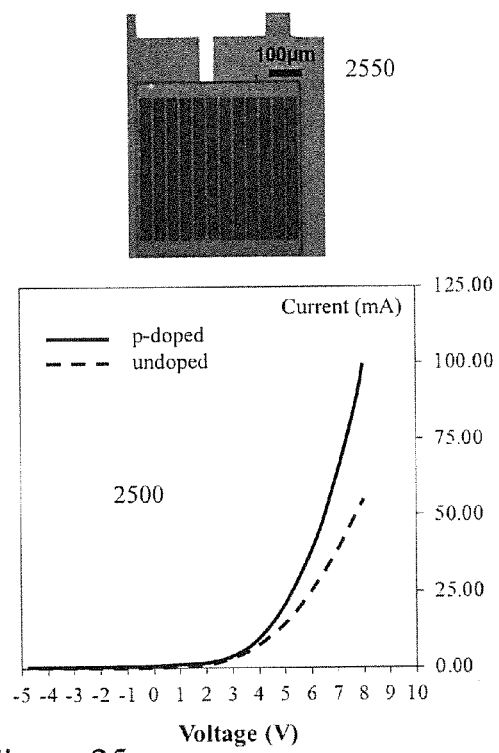
FIG. 25 depicts the current-voltage characteristics of undoped and p-doped dot-in-a-wire LEDs at room temperature according to an embodiment of the invention.

An optical microscopy image of a fabricated nanowire LED device is shown as LED 2150 in FIG. 25 wherein metallic contact grids were made on the device surface to facilitate the hole transport and injection processes. The measured current-voltage characteristics at room temperature, for both the undoped and modulation p-doped implementations of the nanowire dot-in-a-wire LEDs, are shown in graph 2500 of FIG. 25. The devices exhibit excellent diode characteristics, with relatively small (approximately 20Ω to 50Ω) series resistances and negligible leakage current under reverse bias. The p-doped nanowire LEDs also shows slightly higher current densities, compared to the undoped device under the same bias conditions.

Figure 26:
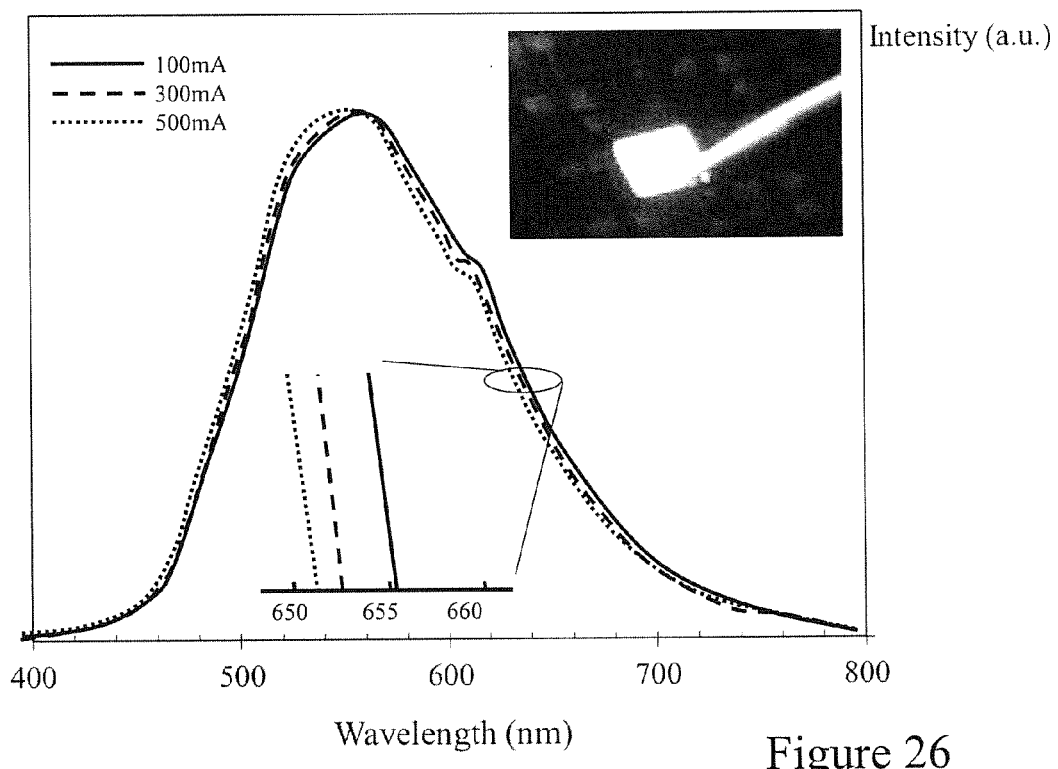
FIG. 26 depicts electroluminescence spectra of a p-doped InGaN/GaN dot-in-a-wire LED at room temperature.

Emission characteristics of InGaN/GaN dot-in-a-wire LEDs were studied, where to minimize junction heating effects impacting measurements, pulsed bias conditions, with duty cycles in the range of 0.1% to 5%, were utilized during the measurements. Strong white light emission, illustrated in the inset of FIG. 26, was observed for the p-doped dot-in-a-wire LEDs, which is a direct consequence of the polychromatic emission of the InGaN/GaN quantum dots, due to both the large inhomogeneous broadening and their varying thickness. The device area is approximately 0.5×0.5 mm². Importantly, emission spectra of the p-doped LEDs are nearly invariant with increasing injection currents. As shown in FIG. 26, a very small (approximately 4 nm) blue shift was measured for the p-doped dot-in-a-wire LEDs with increasing injection current from 100 mA to 500 mA, signifying the presence of a very small, or negligible quantum-confined Stark effect.

Figure 27:
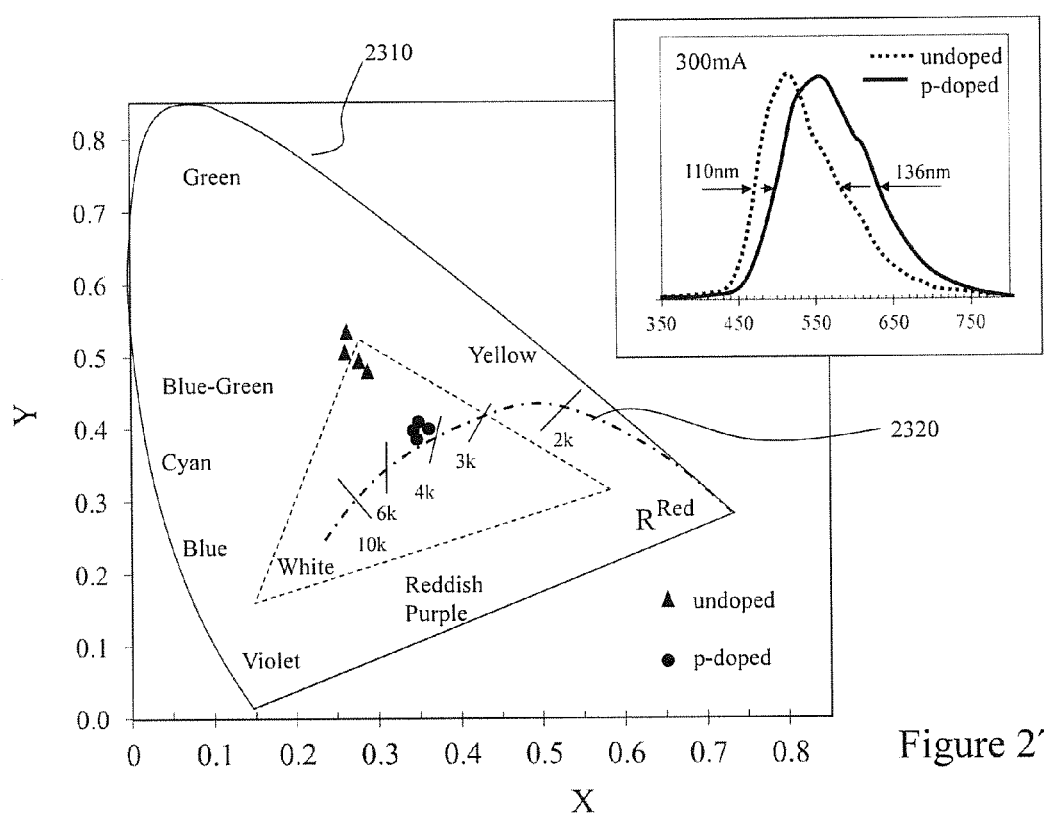
FIG. 27 depicts undoped (triangles) and p-doped (circles) dot-in-a-wire LED emission on a chromaticity diagram.

Additionally, the spectral linewidths, measured at full-width half-maximum (FWHM), at approximately 136 nm are comparatively larger than those of the undoped devices, FWHM approximately 110 nm, as illustrated in the inset of FIG. 27, although both LED structures exhibit nearly identical emission spectra under optical pumping. Locations of the light emission on the chromaticity diagram 2710 are shown in FIG. 27 for both the undoped (solid triangles) and p-doped (solid circles) LEDs at injection currents from 100 mA to 400 mA. It is seen that the p-doped LEDs exhibit improved CIE chromaticity coordinates (x≈0.350±0.015 and y≈0.370±0.015) with increasing injection currents, with a correlated color temperature at approximately 4500K and high color rendering properties, the color temperature being shown by curve 2720. The undoped LEDs, on the other hand, show varying chromaticity coordinates (x≈0.28±0.02 and y≈0.49±0.03) over the same current range.

The internal quantum efficiency of the undoped and p-doped dot-in-a-wire LEDs was also determined. To date, there has been no report on the internal quantum efficiency of GaN-based nanowire LEDs under electrical injection. The room-temperature internal quantum efficiency, relative to that at 5 K, is derived by comparing the light intensity measured at these temperatures under the same injection current. The results are shown in FIG. 28 for both the undoped and p-doped dot-in-a-wire LEDs. The internal quantum efficiency initially increases with increasing injection currents for both types of devices. It reaches the maximum values of 36.7% and 56.8% at approximately 130 A/cm$^2$ and 200 A/cm$^2$, for the undoped and p-doped devices, respectively. These values are significantly higher than the internal quantum efficiencies of any previously reported nanowire LEDs under either electrical injection or optical pumping, see for example "Catalyst-Free InGaN/GaN Nanowire Light Emitting Diodes Grown on (001) Silicon by Molecular Beam Epitaxy" by W. Guo et al (Nano Lett., Vol. 10, p. 3355, 2010) and "Strong Green Photoluminescence from InxGa1-xN/GaN Nanorod Arrays" by C. C. Hong et al (Opt. Express, Vol. 17, 20, p. 17227, 2009). More importantly, with the use of modulated p-doping, the internal quantum efficiency (approximately 56.8%) shows a more than 50% increase over undoped structures, which is the most efficient phosphor-free white LED when compared to the prior art.

Compared to the undoped dot-in-a-wire LEDs, the remarkably high internal quantum efficiency of the p-doped white LEDs, as well as their stable emission characteristics, are attributed to the significantly enhanced hole transport in the InGaN quantum dot active region. Poor hole transport, due to their heavy effective mass, has been identified as one of the primary limiting factors for achieving high performance LEDs. In conventional LED heterostructures, injected holes largely reside in the small region close to the p-GaN layer, which predominantly determines the emission characteristics. The poor hole transport and injection processes also lead to many undesirable properties, including electron overflow, enhanced Auger recombination, and hot carrier effect. In typical nanowire LED heterostructures, the wire diameters are comparable to, or smaller than the active region thickness. The resulting strong surface scattering, as well as the presence of surface charges, may further aggravate the hole transport and injection processes and deteriorate the device performance.

With the use of p-doing in the device active region, enhanced hole transport and, consequently, more uniform, less current dependent hole injection can be achieved, which is consistent with the relatively large spectral linewidth (approximately 136 nm) measured for the p-doped LEDs, compared to that (approximately 110 nm) of the undoped devices wherein optical emission is restricted to a relatively small quantum dot active region close to the p-GaN layer. Consequently, emission characteristics of the p-doped dot-in-a-wire LEDs are governed by the inhomogeneous broadening of the dots, which can be controlled by varying the dot properties during epitaxial growth and can lead to highly stable, robust optical emission with increasing current, compared to prior art approaches for monolithic white LEDs. If we assume unity electrical injection efficiency, the internal quantum efficiency ($\eta_i$) is typically modeled by $$\eta_i = \frac{BN^2}{AN + BN^2 + CN^3 + f(N)} \quad (1)$$

where N is the carrier density and A, B, and C are the Shockley-Read-Hall nonradiative recombination, radiative recombination, and Auger recombination coefficients, respectively, and f(N) represents the carrier leakage outside of the quantum dots.

The very high internal quantum efficiencies for both undoped and p-doped LEDs are attributed to the significantly reduced nonradiative recombination and carrier leakage, owning to the superior carrier confinement provided by the dot-in-a-wire heterostructures. The improved hole injection and transport processes in the LED active region further reduce carrier leakage, carrier recombination outside of the dots, and hot carrier effect, which explains the drastic increase (>50%) in the internal quantum efficiency, compared to the undoped devices.

To achieve high luminous efficacy, it is important to maintain the high efficiency at relatively high injection levels, i.e. to minimize or eliminate any efficiency droop. Although reduced efficiency droop has been demonstrated in InGaN/GaN nanowire LEDs within the prior art, the measured current densities were generally limited to approximately 50-100 A/cm$^2$. Referring to FIG. 25, the light-current characteristics for a p-doped dot-in-a-wire LED were measured up to approximately 300 A/cm$^2$, and no saturation was observed, suggesting the presence of a small, or negligible efficiency droop even under relatively high current injection conditions. It is also important to notice that these measurements were performed for unpackaged devices without any proper thermal management. Therefore, the intrinsic device performance is expected to be significantly better. To this end, the external quantum efficiency of the p-doped dot-in-a-wire LEDs was measured at 5 K, which remains nearly invariant for injection current densities as high as 640 A/cm2, shown in the inset of FIG. 29. The absence of efficiency droop at high injection levels is attributed to the superior carrier confinement provided by the quantum dot heterostructures, the nearly dislocation- and strain-free GaN nanowires, as well as the significantly enhanced hole transport and reduced carrier leakage, due to the p-type modulation doping.

It would be evident to one skilled in the art that whilst the embodiments described supra in respect of FIGS. 20 through 29 consider broadband LEDs the principles described may be applied to broadband photodetectors. It would also be evident that whilst some of the plurality of vertically aligned quantum dot-in-a-wire structures may be used in optically pumping colloidal quantum dots disposed within the overall device structure that others may be used to optically pump other quantum dots within the dot-in-a-wire structures.

Figure 30:
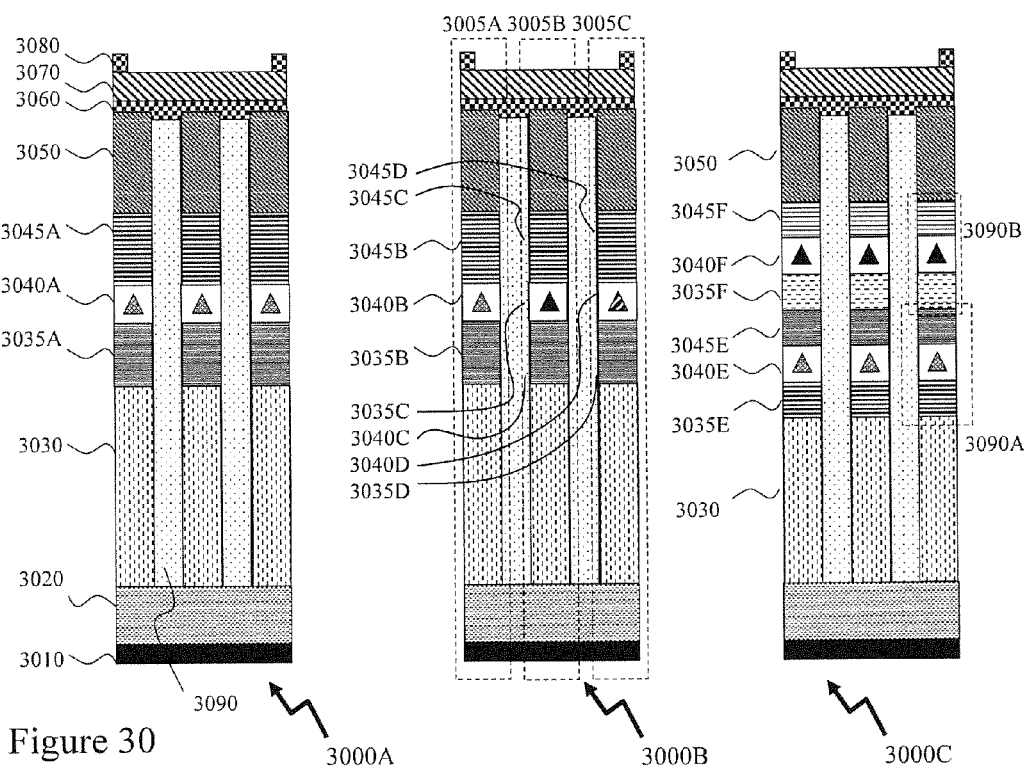
FIG. 30 depicts schematic constructions of dot-in-a-wire laser structures according to embodiments of the invention.

Referring to FIG. 30 there are shown first to third schematics 3000A through 3000C respectively of dot-in-a-wire laser structures according to embodiments of the invention. Considering first schematic 3000A then there is shown a self-organized InGaN/GaN dot-in-a-wire laser heterostructures on a low resistivity n-type Si(111) substrate 3020. The bottom n-type Si doped GaN 3030 is formed atop this, followed by lower distributed Bragg reflector (DBR) 3035A forming one mirror of the laser structure, then a single quantum dot 3040A, upper DBR 3045A, and the upper p-type Mg doped GaN 3050. Providing the electrical contacts are lower contact 3010, for example Ti/Au, and upper contacts 3060 and 3080, for example Ni/Au, that are separated by an ITO 3070, ITO being electronically conductive and optically transparent. The nanowires being separated by polyimide 3090 that has been spin-coated post-nanowire fabrication and prior to electrode metallization. The dot-in-a-wire laser structure is formed from quantum dot 3040A that acts as optical emitter, being injected electrically through n-type Si doped GaN 3030 and p-type Mg-doped GaN 3050, and lower DBR 3035A and upper DBR 3045A that act as the highly reflective facets required to establish the lasing operation.

Now referring to second schematic 3000B a multi-laser structure is shown comprising three nanowire lasers, 3005A to 3005C respectively. First nanowire laser 3005A employs an active region comprising first bottom DBR 3035B, first quantum dot 3040B, and first top DBR 3045B. Second nanowire laser 3005B employs an active region comprising second bottom DBR 3035C, second quantum dot 3040C, and second top DBR 3045C whilst third nanowire laser 3005C employs an active region comprising third bottom DBR 3035D, third quantum dot 3040D, and third top DBR 3045D. In each instance the top and bottom DBR structures are optimized for the respective quantum dot heterostructure. It would be evident to one skilled in the art that whilst the three nanowire lasers 3005A to 3005C would be grown in sequence that aspects of the epitaxial process may be undertaken together, e.g. the quantum dot structures may potentially all be grown simultaneously after the bottom DBR structures were grown if the emission wavelengths permitted as the operating wavelengths of each nanowire laser would be defined by the DBR structure.

Referring to third schematic 3000C there is shown an alternative multi-laser structure exploiting vertical integration. Accordingly each nanowire as shown now comprises vertically of bottom n-type Si doped GaN 3030 atop which are first lower DBR 3035E, first quantum dot 3040E, first upper DBR 3045E, second lower DBR 3035F, second quantum dot 3040F, second upper DBR 3045F, and the upper p-type Mg doped GaN 3050. First lower DBR 3035E, first quantum dot 3040E, and first upper DBR 3045E respectively forming first dot-in-a-wire laser 3090A whilst second lower DBR 3035F, second quantum dot 3040F, second upper DBR 3045F form a second dot-in-a-wire laser 3090B. It would be apparent to one skilled in the art that such a vertically stacked dot-in-a-wire multi-laser structure may be implemented where the emission wavelengths of the individual lasers are not overlapping with the subsequent DBR structures and that the quantum dot absorption edges are not overlapping either.

Figure 31:
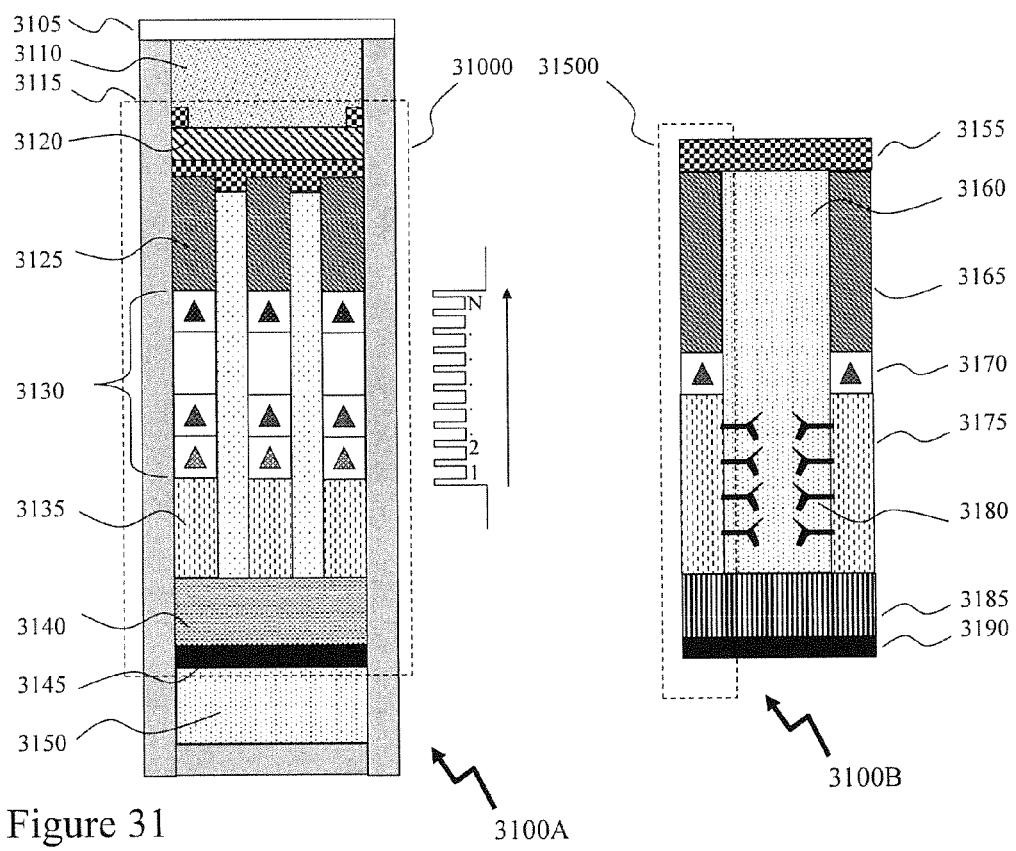
FIG. 31 depicts schematic constructions of photoelectrochemical and electrobiological devices exploiting dot-in-a-wire structures.

Now referring to FIG. 31 there are depicted schematics of photoelectrochemical device 3100A and electrobiological device 3100B respectively according to embodiments of the invention exploiting dot-in-a-wire structures. Considering initially photoelectrochemical device 3100A then a photovoltaic hydrogen/oxygen generator is depicted. The photoelectrochemical device 3100A exploiting a self-organized InGaN/GaN dot-in-a-wire photovoltaic structure 31000 that has been grown on a low resistivity n-type Si(111) substrate 3140. N-type Si doped GaN 3135 is formed atop this followed by vertically stacked array 3130 of quantum dot heterostructures, and p-type Mg doped GaN 3125. Atop this structure once planarized upper contacts, for example Ni/Au, that are separated by an ITO layer, ITO being electronically conductive and optically transparent. The bottom contact to the low resistivity n-type Si(111) substrate 3140 being Ti/Au, for example.

The self-organized InGaN/GaN dot-in-a-wire photovoltaic structure 31000 is then disposed within a housing 3115 having a transparent window 3105. Adjacent the upper ITO layer is disposed first electrolyte 3110 and adjacent the bottom contact is second electrolyte 3150. Accordingly, optical illumination of the photoelectrochemical device 3100A through the transparent window 3105, i.e. by solar radiation, results in the self-organized InGaN/GaN dot-in-a-wire photovoltaic structure 31000 generating a potential across the device such that the ITO layer and bottom layer are electrically charged such that electrochemical reaction occurs in the first and second electrolytes 3110 and 3150 respectively such that for example hydrogen is generated in the first electrolyte 3110 and oxygen in the second electrolyte 3150. By suitable ancillary equipment around the photoelectrochemical device 3100A these released gases can be collected and used for energy generation. The economics of such hydrogen generation using photoelectrochemical processes is heavily dependent upon the cost of the photovoltaic structures and their efficiency, see for example "Technoeconomic Analysis of Photoelectrochemical (PEC) Hydrogen Production—Final Report" December 2009 B. D. James et al report for the US Department of Energy (http://www1.eere.energy.gov/hydrogenandfuelcells/pdfs/pec_technoeconomic_analysis.pdf).

It would be evident to one skilled in the art that the vertically stacked array 3130 of quantum dot heterostructures, shown as comprising N elements, acts as multielement photovoltaic increasing the efficiency and thereby allowing both efficient hydrogen generation under low illumination conditions and a reduction in complexity through reducing the requirements for solar collector optics.

Referring to electrobiological device 3100B a self-organized InGaN/GaN dot-in-a-wire diode 31500 that has been grown on a low resistivity n-type Si(111) substrate 3185. N-type Si doped GaN 3175 is formed atop this followed by quantum dot 3170, and p-type Mg doped GaN 3165. Atop this structure is upper contacts 3155, for example Ni/Au, and the bottom contact 3190, to the low resistivity n-type Si(111) substrate 3185, being Ti/Au, for example. Accordingly the electrobiological device 3100B has within a medium 3160, which may for example be a sample taken from a patient. The n-type Si doped GaN 3175 has disposed upon it first receptors 3180 such that the presence of the biomolecule or inorganic molecule to which the receptors 3180 are receptive within the medium 3160 results in a change in the electrical characteristics of the n-type Si doped GaN 3175 such that the self-organized InGaN/GaN dot-in-a-wire diode 31500 performance varies.

It would be evident to one skilled in the art that accordingly the sensitivity may be substantially increased as the response of the diode may be substantially non-linear. In some instances the self-organized InGaN/GaN dot-in-a-wire diode 31500 may be optically emissive and the presence of the biomolecule or other molecule being sensed may above a specific concentration or threshold result in the electrical characteristic being shifted sufficiently either to result in the optical emitter turning on or turning off. Alternatively the receptors 3180 may be disposed upon the p-type Mg doped GaN 3165 or in some instances the quantum dot 3170. Accordingly by varying the receptors 3180 across an area of the n-type Si(111) substrate 3185 and partitioning one or both of the upper contacts 3155 and bottom contact 3190 a compact, high sensitivity, high efficiency assay device may be provided.

As discussed above prior art GaN-based planar heterostructures have been limited in their low efficiency and exhibit efficiency droop in the green to red spectral range. Within the prior art this has been explained by the presence of polarization fields, Auger recombination, poor hole transport, defects/dislocations, and/or electron leakage and overflow. Nanowire devices such as those described above in respect of embodiments of the invention means that many mechanisms that may contribute to efficiency degradation, including dislocations, polarization fields, as well as the associated quantum-confined Stark effect (QCSE) can be minimized. However, the inventor(s) has(have) noted that compared to conventional planar heterostructures the performance of such nanoscale LEDs is more susceptible to electron leakage out of the device active region, due to the presence of large densities of states/defects along the wire surface and the one-dimensional carrier transport process. The resulting carrier loss and nonradiative carrier recombination thereby limit the maximum quantum efficiency achievable at high current injection levels.

Figure 32:
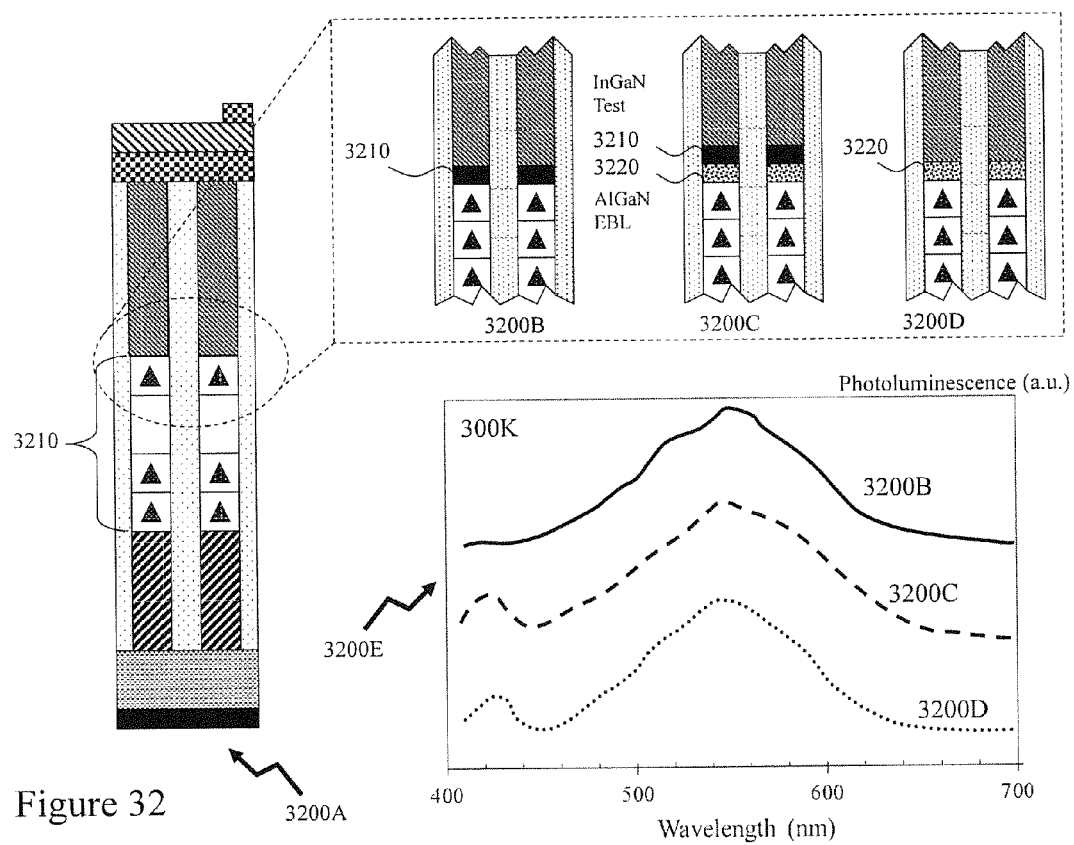
FIG. 32 depicts schematic constructions of dot-in-a-wire laser structures according to embodiments of the invention.

Referring to FIG. 32 there is shown a schematic of a dot-in-a-wire LED 3200A according to an embodiment of the invention as described above in respect first schematic 3000A in FIG. 30 wherein the single quantum dot 3040A has been replaced with multiple quantum dots 3210. To investigate the electron overflow phenomena an InGaN/GaN dot-in-a-wire LED heterostructures a first test nanowire LED 3200B was grown incorporating a p-doped InGaN/GaN quantum well between the device active region and p-GaN section. Accordingly electrons leaking out of the quantum dots can recombine with holes in the test well, which has smaller In compositions than that of the InGaN/GaN quantum dots and the resulting optical emission can therefore be used to evaluate the electron overflow in nanowire LEDs.

Additionally, a second test nanowire LED 3200B was grown incorporating a p-doped AlGaN electron blocking layer (EBL) between the LED active region and the InGaN test quantum well. A third test nanowire LED 3200C was also grown wherein the p-doped AlGaN EBL was incorporated but the InGaN test well omitted. is also investigated. Graph 3200E depicts the photoluminescence spectra of first to third test nanowire LEDs 3200B to 3200D respectively at room temperature. The peak at approximately 550 nm is related to the emission from the quantum dot active region of the nanowires, while the peak at approximately 430 nm is due to the presence of an InGaN test well, which can be measured by comparing first and second test nanowire LEDs 3200B and 3200C respectively.

Figure 33:
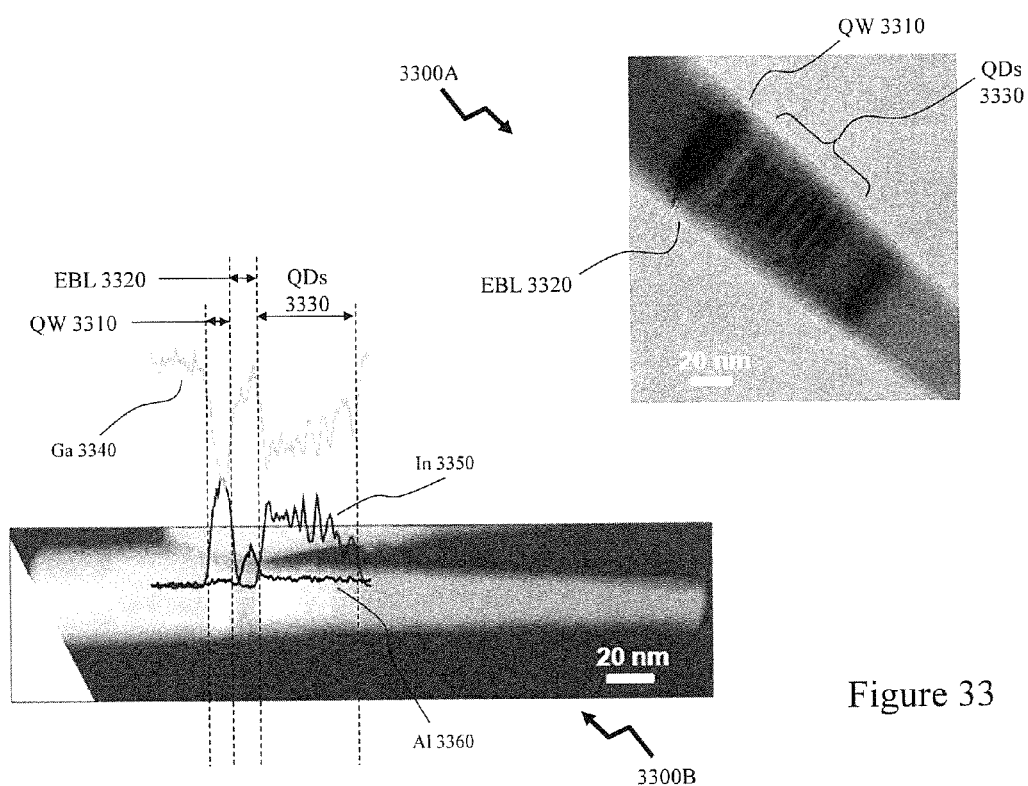
FIG. 33 depicts bright field and annular dark fields images of InGaN/GaN dot-in-a-wire LED structures and energy dispersive x-ray spectrometry signal for In, Ga, and Al of the dot-in-the-wire LED according to embodiments of the invention.

Referring to first image 3300A in FIG. 33 a TEM image of a second test nanowire LED, such as depicted by second test nanowire LED 3200C in FIG. 32, are shown wherein the vertically stacked 10 InGaN/GaN quantum dots 3330, the AlGaN electron blocking layer (EBL) 3320 and the test InGaN quantum well (QW) 3310 can be easily identified. There are no extended defects, such as misfit dislocations and stacking faults observed in such images and the InGaN/GaN quantum dots 3330 can be seen to be positioned in the center of the nanowires, due to the strain-induced self-organization. In order to confirm the existence of each region and obtain an estimation of the elemental variations, EDXS analysis together with the annular dark field image were also performed as depicted in second image 3300B. The first to third EDXS line profiles 3340 through 3360 respectively show the signal variations of Ga, In and Al respectively across the InGaN/GaN quantum dots 3330, the AlGaN EBL 3320 and the test InGaN quantum well 3310. The variation of the In signal, second EDXS line profile 3350, reveals the existence of the InGaN/GaN quantum dots 3330 and InGaN QW 3310. With the Ga signal, depicted by first EDXS line profile 3340, within the GaN region as a reference and also considering the thickness of the dots along the electron beam traveling path, the maximum In is estimated as approximately 50% constituting group III elements for the dot. From the third EDXS signal profile 2960 for Al the AlGaN EBL 3320 is observed between the InGaN/GaN quantum dot 3330 and InGaN QW 3310 regions. The thickness of the EBL is about 8 nm and within fabricated nanowires according to embodiments of the invention the Al composition of the EBL 3320 was varied from approximately 8% to approximately.

Characterisation of the dot-in-a-wire LEDs described in respect of FIG. 32 was performed using electroluminescence under pulsed biasing conditions at various temperatures. Junction heating was minimized by using a low (approximately 0.1%) duty cycle. Referring to FIG. 30 there are depicted the normalized electroluminescence spectra of first test nanowire LED 3200B under various injection currents. As discussed above first test nanowire LED 3200B incorporates an InGaN test well, shown as InGaN QW 3310 in FIG. 33, between the device active region and the upper p-GaN section of the nanowire LED. The peak at approximately 550 nm is related to the emission from the quantum dot active region, which agrees well with the photoluminescence measurements depicted in graph 3200E of FIG. 32. However, with increasing current from 100 mA to 1,000 mA, it can be seen that the emission at approximately 430 nm becomes progressively stronger, which is attributed to the carrier recombination in the InGaN/GaN test well, InGaN QW 3310. The inventors believe that these measurements confirm that injected electrons can escape from the quantum dot active region and subsequently recombine with holes in the InGaN test well.

Referring to FIG. 34 there is plotted the derived relative external quantum efficiency (EQE) (in arbitrary units) related to the electroluminescence emission from the quantum dot active region as well as that from the test well measured at room temperature. It can be seen that, for the emission from the test well, the quantum efficiency continuously increases with current, which can be explained by the increased electron overflow and therefore enhanced emission from the test well region with increasing current. For the emission of the quantum dot active region, the relative external quantum efficiency reaches its peak value at approximately 300-400 A/cm$^2$ and shows a continuous drop (approximately 6%) with increasing current up to 1,100 A/cm$^2$ thereafter, which can be explained by the enhanced electron overflow at high injection conditions. It can also been seen when looking at FIG. 34 in combination with FIG. 3 that electron overflow is appreciable below such injection levels, evidenced by the presence of emission peak from the test well at an injection current of approximately 300 A/cm$^2$.

Referring to FIG. 36 it can be seen that electron overflow is relatively enhanced with decreasing temperature. As shown the emission intensity from the test well becomes comparable to that from the quantum dots when measured under an injection current of approximately 450 A/cm$^2$ at low temperatures (80K), while its intensity is only approximately 10% of that from the quantum dots when measured at the same injection current at room temperature. Consequently, the quantum efficiency related to the optical emission from the quantum dot active region shows a more severe drop with decreasing temperature.

Now referring to FIG. 37 the derived relative EQE (in arbitrary units) is plotted as a function of injection current density for three different temperatures. The estimated efficiency drop is approximately 6%, 10%, and 21% for measurements performed under an injection current of approximately 1,100 A/cm$^2$ at 300K, 200K, and 80K, respectively. The increased electron overflow at low temperatures is consistent with recent theoretical studies; see for example Piprek et al in "Electron Leakage Effects on GaN-based Light-Emitting Diodes" (J. Opt. Quantum Electron., Vol. 42, p. 89, 2010). At low temperatures, the hole concentration in the p-GaN region is drastically reduced, due to the large activation energy for Mg dopant, thereby leading to reduced hole injection efficiency and further enhanced electron overflow. It can also be seen in FIG. 37 that with decreasing temperature the peak quantum efficiency shifts to lower current densities due to the reduced Shockley-Read-Hall recombination as well as enhanced bimolecular radiative recombination rate.

These phenomena can be simulated by using the model given by Equation (1) below for the internal quantum efficiency, where N is the carrier density in the device active region, and A and B are the Shockley-Read-Hall nonradiative recombination and radiative recombination coefficients, respectively as provided for example by Ryu et al in "Evaluation of radiative efficiency in InGaN blue-violet laser-diode structures using electroluminescence characteristics" (App. Phys. Lett., Vol. 89, 171106, 2006) and Dai et al in "Carrier recombination mechanisms and efficiency droop in GaInN/GaN light-emitting diodes" (App. Phys. Lett., Vol. 97, p. 133507, 2010). The term f(N) represents any other higher order effects, including Auger recombination and carrier leakage outside of the device active region, which are generally described by $CN^3+DN^4$ The carrier density (N), is related to the injection current density (J) by Equation (2) below where the term $W_{QD}$ represents the total thickness, approximately 25-30 nm, of the quantum dot active region.

$$\eta_i = \frac{BN^2}{AN + BN^2 + f(N)} \quad (1)$$

$$J = qW_{QD}[AN + BN^2 + f(N)] \quad (2)$$

As presented in FIG. 37 the measured relative external quantum efficiency at various temperatures can be well simulated using this model. The derived values of (A, B, C) are approximately ($5\times10^8$ s$^{-1}$, $1.2\times10^{-9}$ cm$^3$ s$^{-1}$, $1.1\times10^{-28}$ cm$^6$ s$^{-1}$), ($1.5\times10^9$ s$^{-1}$, $1.1\times10^{-9}$ cm$^3$ s$^{-1}$, $1.1\times10^{-28}$ cm$^6$ s$^{-1}$), and ($1.6\times10^9$ s$^{-1}$, $9\times10^{-10}$ cm$^3$ s$^{-1}$, $1.1\times10^{-28}$ cm$^6$ s$^{-1}$) at 80K, 200K, and 300K, respectively. It can also be seen from FIG. 33 that the quantum efficiency of nanowire LEDs according to embodiments of the invention generally reaches its peak value at significantly higher current densities (>200 A/cm$^2$), compared to that (<20 A/cm$^2$) of conventional prior art InGaN/GaN quantum well blue-emitting LEDs. This observation is consistent with the simulated Shockley-Read-Hall recombination coefficient (A of approximately $1.0\times10^9$ s$^{-1}$) at 300K in the nanowire LEDs according to embodiments of the invention, which is significantly larger than the values commonly employed in InGaN/GaN quantum well blue-emitting LEDs and can be partly explained by the significantly enhanced non-radiative surface recombination, due to the very large surface-to-volume ratios of nanowires. The commonly observed surface band bending in GaN nanowires, as well as the inefficient carrier capture by quantum dots due to hot carrier effect, may also contribute considerably to the non-radiative carrier recombination on nanowire surfaces.

As a result the emission characteristics of nanowire LEDs are predominantly determined by surface-related nonradiative carrier recombination under relatively low carrier injection conditions. In the absence of any $3^{rd}$ or higher order carrier loss mechanisms, it is further expected that the quantum efficiency should display a small, continuous increase under high injection conditions, illustrated as the dotted line 3310 in FIG. 37. The inventors note that such phenomena have not been observed in nanowire LEDs of the prior art, suggesting the presence of electron overflow or any other high order carrier loss mechanisms, which can lead to either a nearly constant quantum efficiency or efficiency droop under high injection currents has not been commonly measured for prior art nanowire LEDs.

Within the prior art carrier leakage and electron overflow have been noted to play a dominant role in the efficiency droop of prior art GaN based planar LEDs, which is directly related to the ineffective electron confinement, poor hole transport, and possibly Auger recombination and can be further exasperated by the presence of polarization fields. However, the observed severe efficiency degradation measured at lower temperatures indicates that Auger recombination and Auger-assisted overflow are not likely the primary mechanisms responsible for efficiency droop in nanowire LED devices according to embodiments of the invention, since the Auger recombination coefficient (C) generally decreases exponentially with decreasing temperature.

Figure 38:
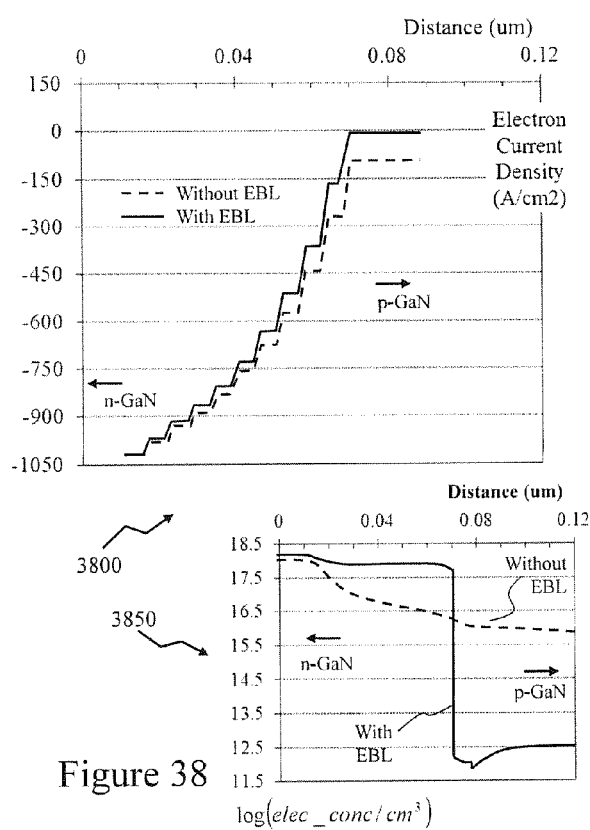
FIG. 38 depicts simulated electron current density across an InGaN/GaN quantum dot active region according to embodiments of the invention with and without the electron blocking layer (EBL)

This study is also consistent with recent results that Auger recombination is drastically reduced in nearly defect-free GaN-based nanowire devices, see Guo et al in "Catalyst-free InGaN/GaN nanowire light emitting diodes grown on (001) silicon by molecular beam epitaxy" (Nano. Lett., Vol. 11, p. 1434, 2011). Analysis of the electron overflow was performed by simulating the band-diagram and carrier distribution in the device active region using the advanced LED device simulation software APSYS (Crosslight Software, 2011). The simulated LED, according to an embodiment of the invention without an EBL such as dot-in-a-wire LED 3200A in FIG. 32, employed an active region consisting of ten vertically coupled InGaN quantum dots, separated by approximately 3 nm GaN barrier layers. With an average In composition of approximately 20% in the dots, approximately 10% of the injected current density can leak into the p-GaN region under an injection current density of approximately 1,000 A/cm$^2$, illustrated as the dashed curve in first graph 3800 in FIG. 38. However, much more severe electron overflow is expected, due to the highly non-uniform In distribution along the lateral dimension of the wires. More importantly, the current path associated with the near-surface GaN region, presented by the dashed curve in second graph 3850 in FIG. 38, can contribute significantly to electron overflow in InGaN/GaN dot-in-a-wire LEDs as well.

Simulations were also performed on third test nanowire LED 3200E wherein a p-doped AlGaN EBL is incorporated between the quantum dot active region and p-GaN. It can be seen that the electron overflow, through either the quantum dot active region or the near-surface GaN, can be largely eliminated, illustrated by the solid curves in first and second graphs 3800 and 3850 respectively in FIG. 38. Al compositions in the range of approximately 10% to 20% demonstrated satisfactory performance. The use of higher Al composition, however, may reduce the hole injection efficiency thereby limiting device efficiency. Additional simulations by the inventors also indicate that the use of an EBL can also be effective in preventing electron overflow in InGaN/GaN nanowire LEDs according to embodiments of the invention, due to the drastically reduced polarization fields, compared to prior art InGaN/GaN quantum well devices.

Figure 39:
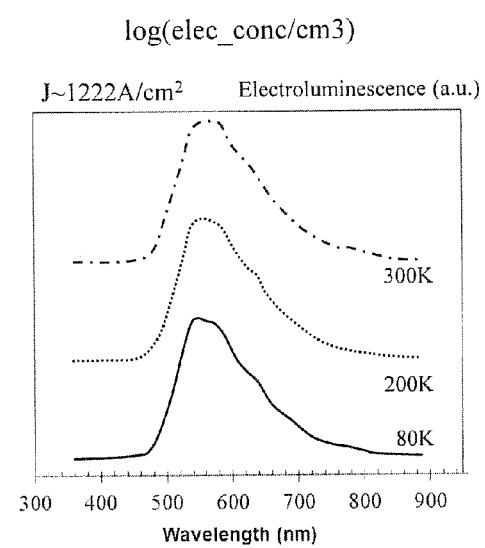
FIG. 39 depicts normalized electroluminescence spectra of a dot-in-the-wire LED according to an embodiment of the invention at different temperatures under constant injection current.

The effectiveness of utilizing an AlGaN EBL to limit electron overflow in nanowire LEDs according to embodiments of the invention can be observed in respect of the electroluminescence spectra of a second test nanowire LED 3200C as presented in FIG. 39. An 8 nm $Al_{0.15}Ga_{0.85}$ (15% Al) EBL was incorporated between the quantum dot active region and the InGaN test well. The measurements were performed up to very high injection conditions, approximately 1220 A/cm$^2$, at 80K, 200K, and 300K for the results presented in FIG. 39. Compared to the photoluminescence results shown in FIG. 32 only emission from the quantum dot active region (λpeak of approximately 550 nm) can be observed under electrical injection, and any emission from the test well (approximately 430 nm) is absent for measurements performed at various injection conditions and temperatures, which confirms the reduced, or eliminated electron overflow by use of an AlGaN EBL.

Figure 40:
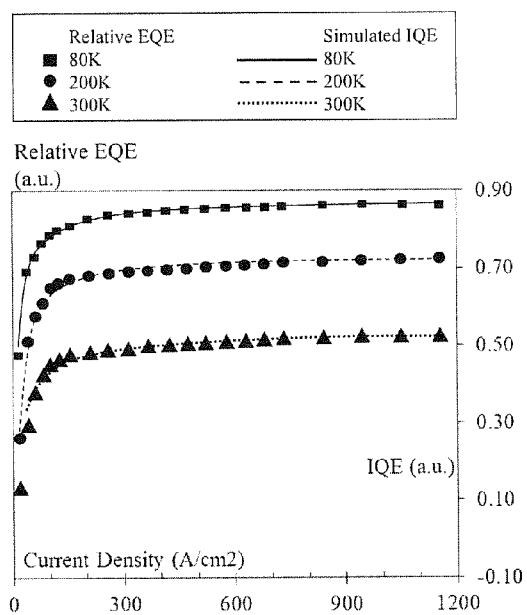
FIG. 40 depicts the relative EQE and simulated IQE for a dot-in-the-wire LED according to an embodiment of the invention at varying temperature.
Figure 41:
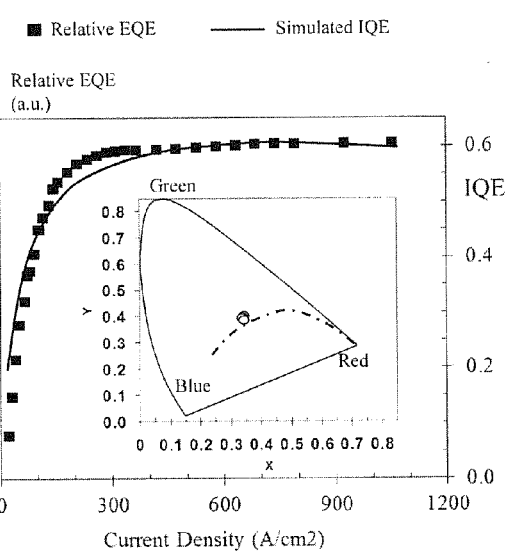
FIG. 41 depicts relative EQE for a dot-in-the-wire LED according to an embodiment of the invention with an AlGaN EBL and p-type modulation doping in the active region together with emission distribution on standard chromaticity diagram.

Now referring to FIG. 40 the performance characteristics of a dot-in-a-wire nanowire according to an embodiment of the invention, described above as third test nanowire LED 3200D, consisting of ten vertically aligned InGaN/GaN quantum dots and an AlGaN EBL are presented depicting the variations of measured relative EQE with varying injection current at 80K, 200K, and 300K. The relative EQE shows an initial rapid increase with increasing current, which is directly related to the saturation of surface defects with increasing carrier density, followed by a smaller, continuous increase right up to very high injection currents (approximately 1,222 A/cm$^2$). This has not been measured for prior art nanowire LEDs such as presented by Guo et al (Nano. Lett., Vol. 11, p. 1434, 2011) and Nguyen et al in "P-type modulation doped InGaN/GaN dot-in-a-wire white light-emitting diodes monolithically grown on Si(111)" (Nano. Lett., Vol. 11, p. 1919, 2011, hereinafter Nguyen2).

This new characteristic can be simulated with good accuracy using Equation (1) above for the LED internal quantum efficiency (IQE). These simulation results are also shown in FIG. 40 wherein the calculated IQE (curves) show excellent agreement with the experimental results (shapes). The derived (A, B, C) values are $(7.2\times10^7$ s$^{-1}$, $6.8\times10^{-10}$ cm$^3$ s$^{-1}$, $1.0\times10^{34}$ cm$^6$ s$^{-1}$), $(8.9\times10^7$ s$^{-1}$, $5.6\times10^{-10}$ cm$^3$ s$^{-1}$, $2.0\times10^{-34}$ cm$^6$ s$^{-1}$), and $(9.6\times10^7$ s$^{-1}$, $3.9\times10^{-10}$ cm$^3$ s$^{-1}$, $3.0\times10^{-34}$ cm$^6$S$^{-1}$) at 80K, 200K, and 300K, respectively. Whilst the values for A and B are reasonably close to those calculated for the first test nanowire LED 3200B, the values for C are nearly approximately 6 orders of magnitude smaller, confirming the drastic reduction of electron overflow by the AlGaN EBL introduced into nanowire design. Accordingly the inventors believe these results suggest that Auger recombination plays a very small, or negligible role on the performance nanowire LEDs, since the Auger coefficient (C) could be reasonably expected to be relatively independent of the incorporation of an AlGaN EBL.

Now referring to FIG. 4I there are presented experimental and simulation results for InGaN/GaN dot-in-a-wire LEDs according to an embodiment of the invention combining an AlGaN EBL with p-type modulation doping in the device active region. As demonstrated previously, by Nguyen, see Nguyen2, p-type modulation doping can significantly improve the performance of nanowire LEDs by enhancing the hole injection and transport process in the quantum dot active region. Accordingly, the relative EQE with current density at room temperature is plotted (shapes) in FIG. 4I and it can be seen that the quantum efficiency shows initially a rapid rise (up to approximately 400 A/cm$^2$), followed by small, continuous increase at higher injection conditions. There is virtually no efficiency degradation for injection current density up to approximately 1200 A/cm$^2$. Using the model of Equation (1) the values of A, B and C were estimated to be approximately $(1.0\times10^8$ s$^{-1}$, $1.8\times10^{-10}$ cm$^3$ s$^{-1}$, $1.0\times10^{-34}$ cm$^3$ s$^{-1}$), respectively. The inventor(s) has(have) also demonstrated that dot-in-a-wire LEDs according to an embodiment of the invention can exhibit highly stable white-light emission. As shown in the inset of FIG. 4I the locations of light emission by sources can be plotted on a chromaticity diagram. The locations plotted were measured under different injection conditions between 333 A/cm$^2$ and 1100 A/cm$^2$, with the values of x and y in the approximate ranges of 0.346-0.333 and 0.379-0.361, respectively. The stable white light emission of the dot-in-a-wire LEDs grown according to embodiments of the invention with p-doping modulation and EBL is attributed to the large inhomogeneous broadening of the quantum dots, the highly uniform carrier distribution within the LED active region, and the substantially reduced QCSE within the nanowire heterostructures.

Photoelectrochemical Devices and Co-Catalyst Nanostructures

As discussed supra the splitting of water enables the generation of clean and renewable hydrogen fuel. Splitting water directly from solar irradiation further allows this to be achieved without the consumption of electric power. Further as discussed supra engineered nanostructures may provide improved solar based overall water splitting. Accordingly, the inventor(s) has(have) established according to embodiments of the invention GaN nanowire arrays supporting pure water splitting, wherein the water splitting reaction primarily occurs on the Ga-face nonpolar lateral surfaces (m-plane) of the GaN nanowires. The capacity of GaN nanowires for water splitting is unambiguously confirmed by utilizing the hole-scavenger methanol, $CH_3OH$, and the electron-acceptor silver nitrate, $AgNO_3$, to respectively fuel the $H_2$ and $O_2$ half-reactions. To further enable highly efficient water splitting embodiments of the invention further incorporate co-catalytic rhodium/chromium oxide (Rh/$CrO_2$) core-shell nanostructures on the lateral GaN nanowire surfaces, and have observed, for the first time, photocatalytic overall water splitting on metal nitride nanowires. The inventor(s) has(have) demonstrated that the decomposition of pure water into $H_2$ and $O_2$ by GaN nanowires is a highly stable photocatalytic process, with the amount of $H_2$ and $O_2$ generated well exceeding that of the host GaN nanowire catalytic materials in a few hours. GaN nanowires according to embodiments of the invention also demonstrate resulting turnover numbers that are much higher than previously achieved within the prior art for GaN powder samples.

GaN Nanowire Fabrication:

The catalyst-free GaN nanowires were grown on Si(111) substrates using a radio-frequency plasma-assisted molecular beam epitaxial (MBE) system under nitrogen-rich conditions. Growth conditions included a temperature of ~750° C., nitrogen flow rate of 1-2 sccm, and a forward plasma power of ~400 W. As described supra such GaN nanowires may be formed without metal catalysts. Compared to indium, which melts at approximately 157° C. and boils at approximately 2,072° C., gallium melts at approximately 30° C. and boils at approximately 2,205° C. thereby providing liquid nanoscale droplets for nanowire growth at ~750° C.

Figure 42:
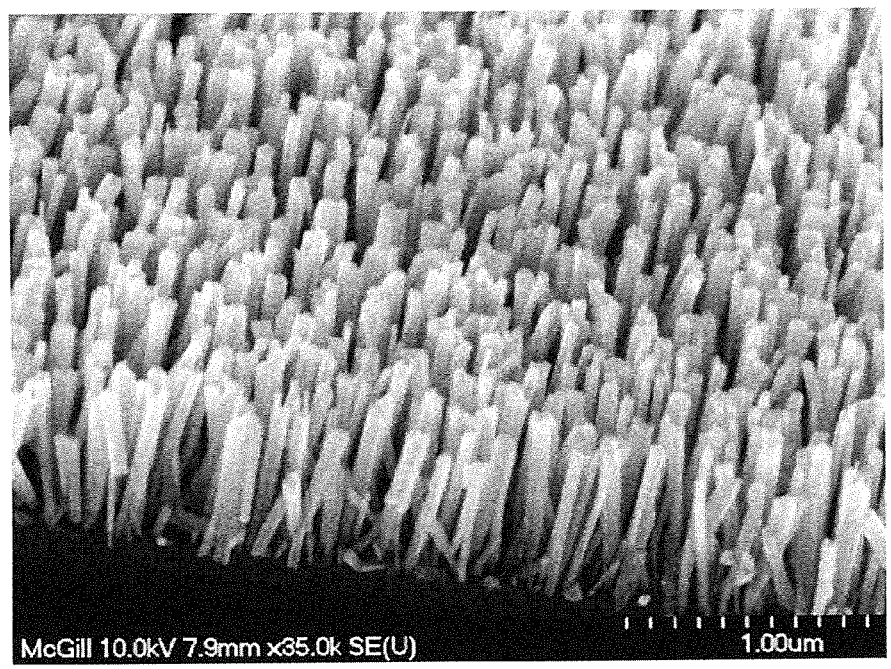
FIG. 42 depicts a scanning electron microscopy image showing GaN nanowire morphology on a Si(111) substrate according to an embodiment of the invention.

As depicted in FIG. 42 there is shown a typical 45 degree-tilted scanning electron microscopy (SEM) image of GaN nanowires grown according to an embodiment of the invention. The nanowires possess a wurtzite crystal structure and are vertically aligned to the substrate, with the growth direction along the c-axis, and an areal density estimated to be $\approx 1\times10^{10}$ cm$^{-2}$. As evident from FIG. 42 the GaN nanowires exhibit a high degree of size uniformity and as discussed supra their densities, diameters and lengths can be controlled by varying the growth conditions. Materials analysis also confirmed that the GaN nanowire lateral surfaces are Ga-faces. However, unlike prior art powder samples, epitaxial GaN nanowires grown according to embodiments of the invention exhibit superior structural, electrical, and optical properties, which in conjunction with their extreme chemical stability and large specific surface area, promise significantly enhanced photocatalytic activity. Within the experimental results presented below the GaN nanowire samples had areas of areas of $\approx 4$ cm$^2$ corresponding to $\approx 5$ μmol of GaN material volume.

GaN Nanowire Water Splitting:

In order to demonstrate water splitting using GaN nanowires according to embodiments of the invention initial photocatalytic reaction experiments were performed by adopting a 300 W xenon lamp as an outer irradiation source and placing the GaN nanowire samples within a reaction chamber employing a quartz lid in order to secure adequate transmittance of UV and visible light. A gas chromatograph equipped with a thermal conducting detector (TCD) was employed for the evaluation of evolved gases ($H_2$ and/or $O_2$). In order to better understand the photocatalytic activity on GaN nanowire surfaces, particularly the lateral nonpolar m-plane Ga-terminated surfaces, independent analysis of the $H_2$ and $O_2$ half-reactions in the presence of respective sacrificial reagents was performed. When a photocatalytic reaction is carried out in an aqueous solution consisting of a reducing reagent, i.e. an electron-donor or hole-scavenger, then the photogenerated holes irreversibly oxidize the reducing reagent instead of water and thereby enhance $H_2$ evolution. Alternatively, when photogenerated electrons in the conduction band are consumed by oxidizing reagents, i.e. electron-acceptors or electron-scavengers, then the $O_2$ evolution reaction is enhanced. Typically an alcohol acts as hole-scavenger and either $Ag^+$ and $Fe^{3+}$ the electron-acceptor. Within the experiments reported here for GaN nanowires according to embodiments of the invention methanol ($CH_3OH$) is used as a hole-scavenger to conduct the $H_2$ half-reaction and silver nitrate ($AgNO_3$) as an electron-acceptor to perform the $O_2$ half-reaction, respectively.

Figure 43A:
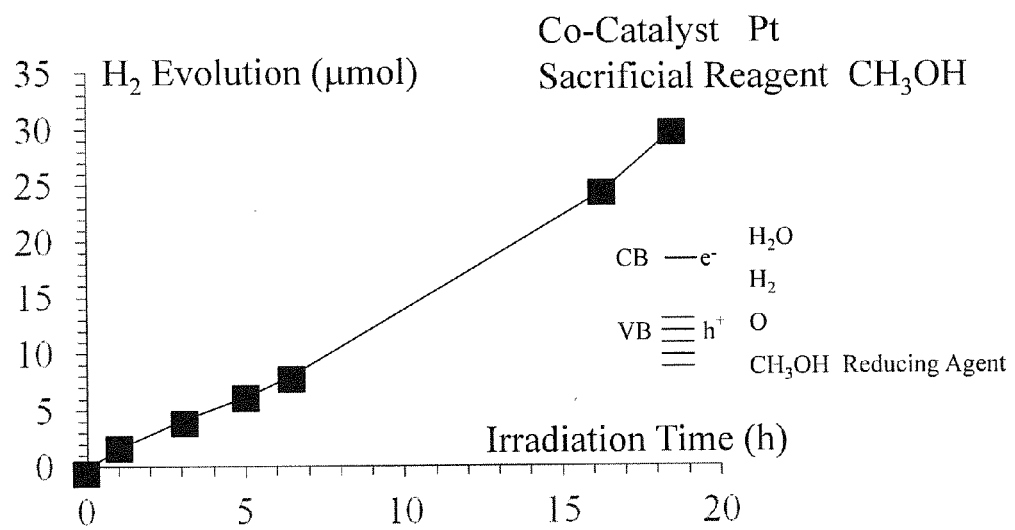
FIGS. 43A and 43B depict $H_2$ and $O_2$ evolution half-reactions in the presence of respective sacrificial reagents using GaN nanowires according to an embodiment of the invention under illumination.
Figure 43B:
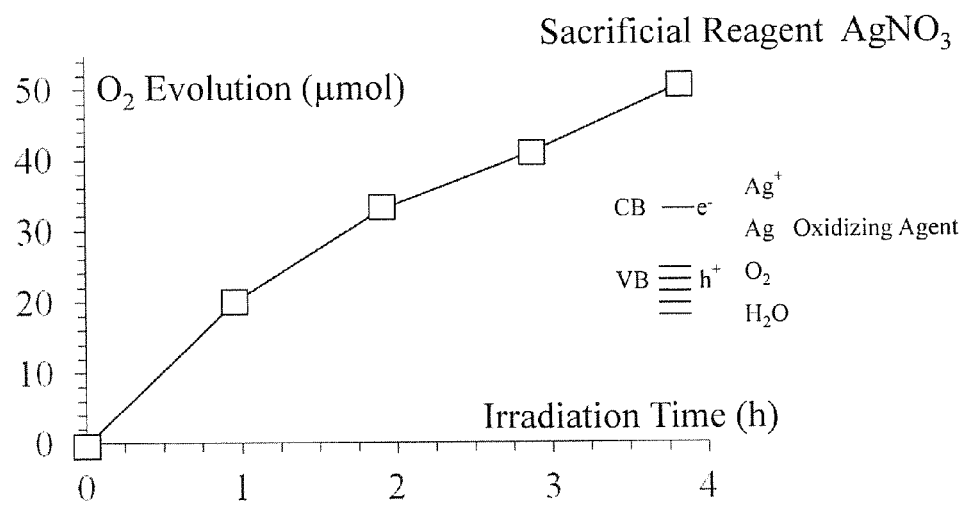

Measured evolution of $H_2$ and $O_2$ over time are depicted within FIGS. 43A and 43B respectively whilst their corresponding reaction processes are schematically illustrated in the insets. As depicted in FIG. 43A approximately 5 μmol of $H_2$ and 50 μmol of $O_2$ are produced after 4 hours, which demonstrate that GaN nanowires satisfy the photocatalysis thermodynamic and kinetic potentials necessary for $H_2$ and $O_2$ evolution. Further, comparison of these results using GaN nanowires according to an embodiment of the invention with those using GaN powders and planar GaN thin film surfaces, see FIG. 47, demonstrate that the photocatalytic activity of GaN nanowires according to an embodiment of the invention is remarkably higher than either powder or planar samples under the same experimental conditions.

These experimental observations are consistent with theoretical analysis. For example, the energy barriers for the first and second H-atom splitting on a pristine Ga-face are predicted to be ≈0.10 eV and ≈1.42 eV respectively, see for example P-T. Chen et al in "First-Principles Calculations of Hydrogen Generation Due to Water Splitting on Polar GaN Surfaces" (J. Phys. Chem. C, Vol. 114, Iss. 42, pp 18228-18232, hereinafter PTChen). These can be easily satisfied by the energy band potentials of GaN ($E_g$=3.4 eV) upon band gap excitation. Further, ab initio molecular dynamic simulations further show that the overall water oxidation reaction at GaN non-polar surfaces involves four proton-coupled electron transfer intermediate steps and can be energetically driven by photo-generated holes. The significantly reduced photocatalytic activity of GaN powder samples may therefore be directly related to the uncontrolled surface polarity of these powders.

As shown by recent first-principles calculations, the cleavage of water molecules to generate $H_2$ gas has been predicted to be a much more active process on Ga-terminated surface sites compared to N-terminated surface sites, due to the much smaller absorption energies of $H_2$ molecules on the Ga-terminated surface sites. This picture is consistent with earlier theoretical predictions which demonstrate that the unoccupied surface states driving electron transfer to $H^+$ are localized on Ga-terminated surface sites. Though $H_2$ generation on the Ga-face is expected be exothermic and therefore very efficient under idealized theoretical conditions, in practice, semiconductor photocatalysis reaction rates are strongly influenced by surface charge properties. Due to the presence of dangling bonds and/or surface defects Fermi-level pinning is commonly observed on GaN surfaces which may significantly degrade the photocatalytic activity through enhanced nonradiative recombination. Such defects also reduce the number of pristine sites available for $H_2$ evolution.

Figure 43C:
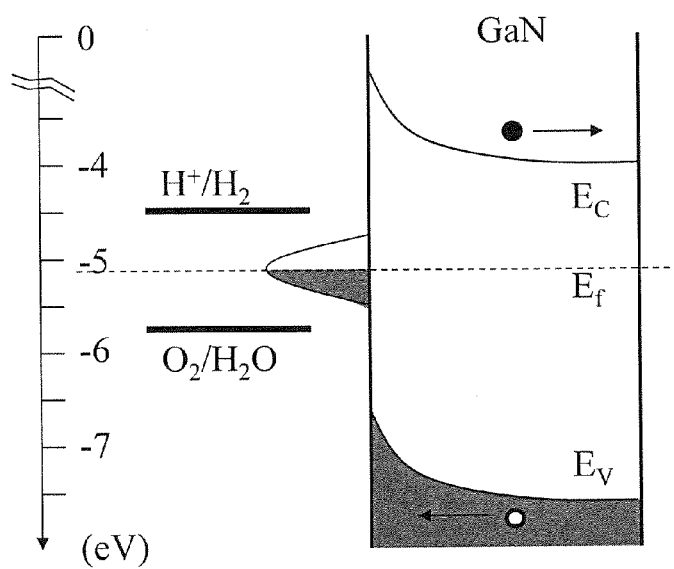
FIG. 43C depicts schematically depicts how according to an embodiment of the invention GaN surface defects drive holes to the nanowire sidewall and electrons into the nanowire bulk.

Nanostructure CoCatalyst:

Due to the dominant n-type character of GaN surface defects tend to pin GaN bands upwards, as depicted in FIG. 43C, resulting in a built in electric field which simultaneously drives excited electrons away from surface reaction sites and provides an electron tunneling barrier. These thereby exponentially reduce the rate of electron transfer to $H^+$ ions. For these reasons, as well as the experimental demonstration that $O_2$ generation is a much more efficient process than $H_2$ generation as evident from FIGS. 43A and 43B respectively a suitable cocatalyst that can provide reaction sites and enable efficient electron transfer to the surface by unpinning the bands at the cocatalyst/GaN interface may be beneficially employed. Such a practice has been employed with most semiconductor photocatalysts developed to date in order to achieve efficient pure water splitting.

Noble metals such as platinum (Pt) and rhodium (Rh) whilst being excellent promoters of $H_2$ evolution can also catalyze a backward reaction to form water from $H_2$ and $O_2$, thereby limiting their usefulness as cocatalysts for overall photocatalytic water splitting. In order to avoid such an $H_2O$ back reaction a transition-metal oxide, that does not catalyze water formation from $H_2$ and $O_2$, is usually employed as a diffusion barrier coating to prevent $O_2$ interaction with the noble metal surface. Among such cocatalysts within the prior art core-shell-structured noble-metal/metal oxide nanoparticles dispersed on a photocatalyst have been proven to enable $H_2$ formation in oxynitride solid solutions.

The deposition of such cocatalysts onto nanowire surfaces may be achieved through impregnation, adsorption, or photodeposition. Among these methods, photodeposition may be applied to almost all noble metals and, importantly, the cocatalyst nanoparticles may be selectively deposited on the active sites of the photocatalyst surface, since the metal cations in aqueous solution are reduced by photogenerated electrons into metal nanoparticles and accordingly deposit on the surface of the photocatalyst where electrons reside. Amongst the available noble metals rhodium (Rh) forms a Schottky contact with GaN, thereby overcoming the exposed GaN surface band pinning which is detrimental to the efficient transfer of electrons to $H^+$ ions in photoelectrolysis. Accordingly, a rhodium/chromium oxide (Rh/$Cr_2O_3$) core-shell nanostructure offers benefit over many other noble-metal/metal oxide combinations.

In order to fabricate the Rh/$Cr_2O_3$ core-shell nanostructures, sodium hexachlororhodate(III) ($Na_3RhCl_6$) and potassium chromate ($K_2CrO_4$) were used as precursors for the two-step cocatalyst photodeposition. For depositing the rhodium core, 34 of 0.2 mM $Na_3RhCl_6$, 6 mL of methanol, and 60 mL of distilled water were placed within a Pyrex chamber with the GaN nanowire sample. The solution was subsequently purged with argon to remove any oxygen gas before the chamber was evacuated, filled with 0.33 atm of argon, and then irradiated for 15 minutes using a UV-enhanced 300 W xenon lamp. Subsequently, the GaN nanowire sample was rinsed with distilled water. Deposition of the chromium-oxide shell followed a similar process wherein 3 μL of 0.2 mM $K_2CrO_4$, 6 mL of methanol, and 60 mL of water were placed in the Pyrex chamber with the GaN nanowires and purged with argon. After argon purging the chamber was evacuated, filled with 0.33 atm of argon and irradiated for 30 minutes using the same xenon lamp. The sample was dried overnight in air.

Figure 44A:
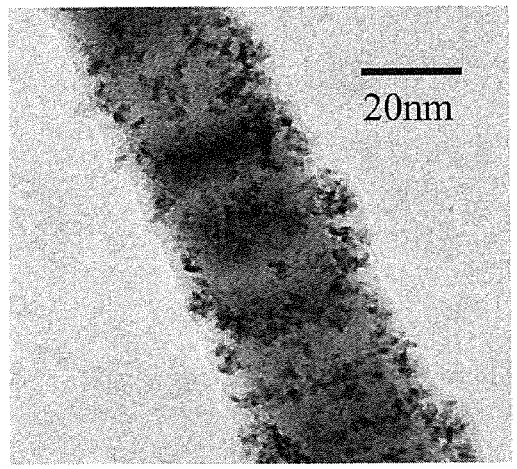
FIG. 44A depicts a low magnification TEM image showing uniform distribution of the $Rh/Cr_2O_3$ nanoparticles on GaN nanowire surfaces according to an embodiment of the invention.
Figure 44B:
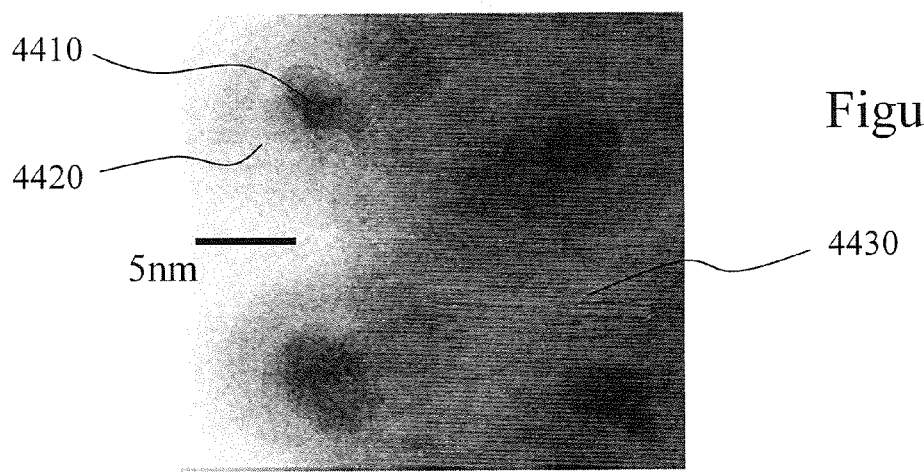
FIG. 44B depicts an HR-TEM image of the region imaged in FIG. 44A.
Figure 44C:
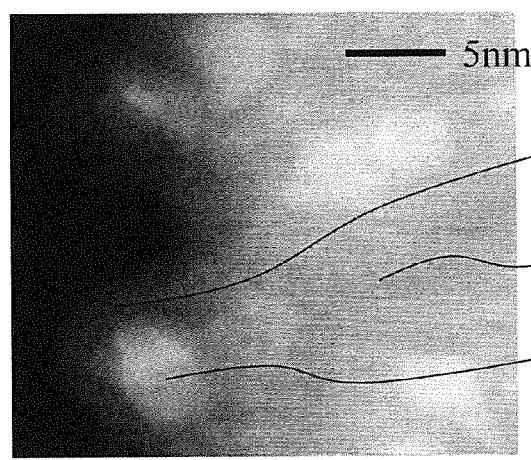
FIG. 44C depicts an HR-HAADF image of the region depicted in FIG. 44B showing the $Rh/Cr_2O_3$ core/shell nanostructures deposited on the GaN nanowire according to an embodiment of the invention.

Scanning transmission electron microscopy (STEM) with an aberration corrector of the probe-forming lens and a high brightness electron source was used to characterize the $Rh/Cr_2O_3$ core-shell nanostructures photodeposited on the GaN nanowires according to embodiments of the invention. Referring to FIG. 44A a fairly uniform distribution of $Rh/Cr_2O_3$ nanoparticles on the GaN nanowire lateral surfaces can be clearly seen. FIGS. 44B and 44C respectively depict typical high-resolution transmission electron microscopy (HR-TEM) and high resolution high angle annular dark field (HR-HAADF) images of the $Rh/Cr_2O_3$ core-shell nanostructures photodeposited on the GaN nanowires. It is evident from these that each GaN nanowire grown according to embodiments of the invention exhibits the nature of a single crystalline structure. For the $Rh/Cr_2O_3$ core-shell nanostructure, the metallic Rh core is well crystallized while the $Cr_2O_3$ shell is likely amorphous.

Figure 45:
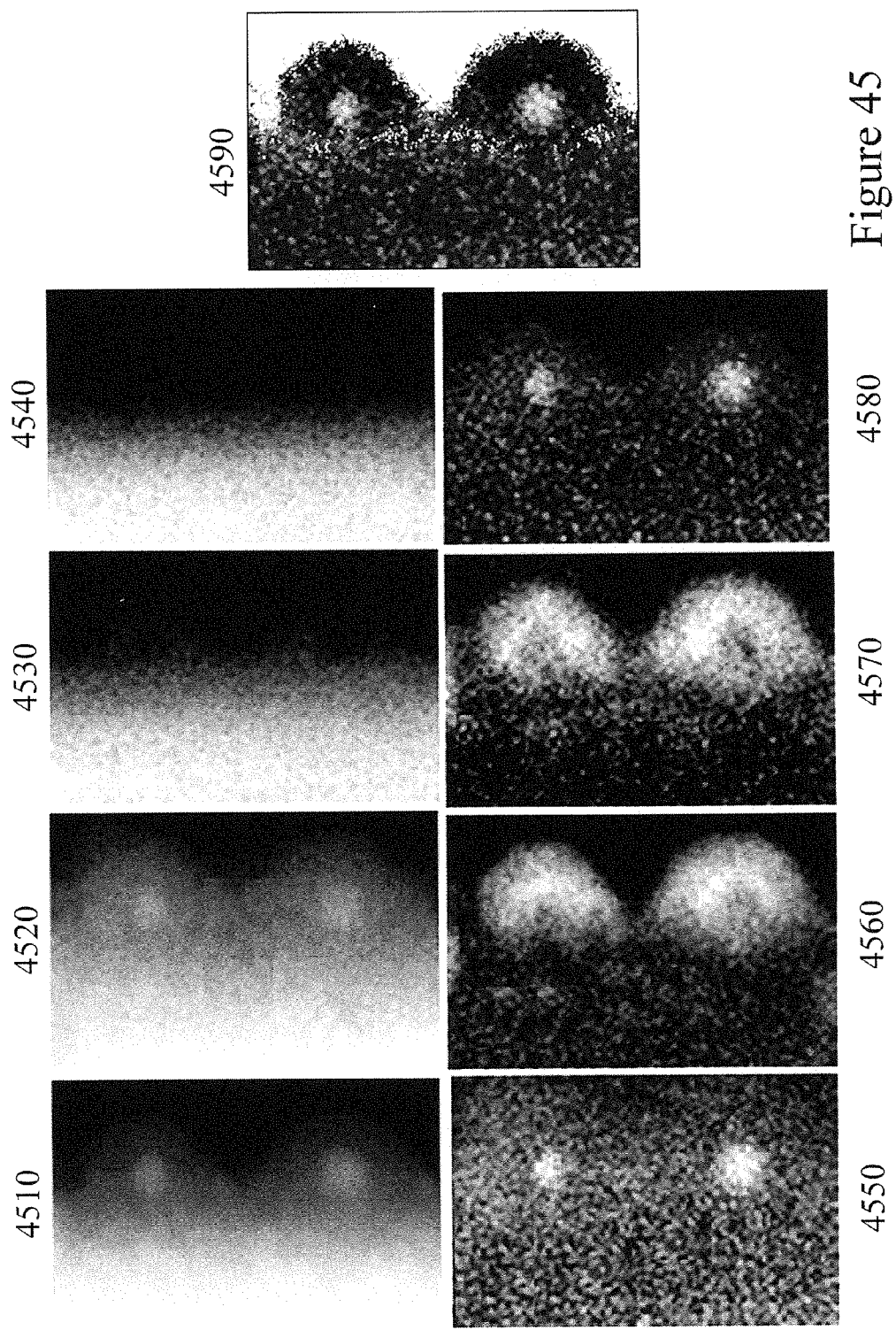
FIG. 45 depicts HR-HAADF and EELS mapping images of $Rh/Cr_2O_3$ core/shell nanostructures deposited on a GaN nanowire according to an embodiment of the invention.

Electron energy loss spectrometry spectrum image (EELS-SI) analysis was also performed in order to study the elemental distribution in the $Rh/Cr_2O_3$ core-shell nanostructure. Referring to FIG. 45 first image 4510 depicts the HR-HAADF image whilst second image 4520 depicts the EELS mapping image for a region of an $Rh/Cr_2O_3$—GaN nanowire according to an embodiment of the invention. Third to seventh images 4530 to 4570 respectively depict element mapping images for Ga, N, Rh, Cr, and O respectively whilst eighth image 4580 depicts a false color composite image of Cr, Rh, and Ga. Ninth image 4590 is a manipulated version of 4580 to improve visibility in the black and white images supplied with this patent application to show Ga in nanowire, Rh in nanostructure core, and Cr in nanostructure shell. It would be evident to one skilled in the art that by combining the HRTEM/HAADF images and the element mapping images that the $Rh/Cr_2O_3$ core-shell nanostructures were successfully photodeposited on the lateral surfaces of the GaN nanowires.

Nanowire-Nanostructure CoCatalyst Results:

Photocatalytic water splitting experiments were performed using the GaN nanowires photodeposited with $Rh/Cr_2O_3$ core-shell nanostructures according to embodiments of the invention. Performed in pure water the $H_2$ evolution was promoted by the noble metal (Rh) core of the core-shell nanostructures whilst the backward reaction over the noble metal, namely $2H_2+O_2 \Rightarrow 2H_2O$, was prevented by the $Cr_2O_3$ shell of the nanostructures.

Figure 46A:
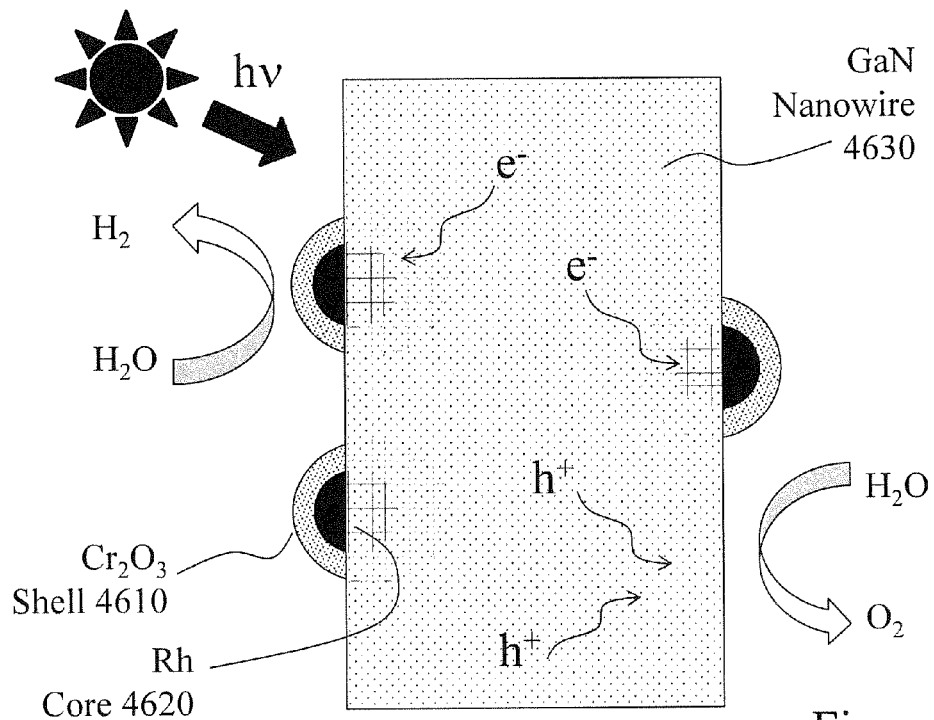
FIG. 46A depicts schematically water splitting on $Rh/Cr_2O_3$ core-shell nanostructure deposited GaN nanowires according to an embodiment of the invention.
Figure 46B:
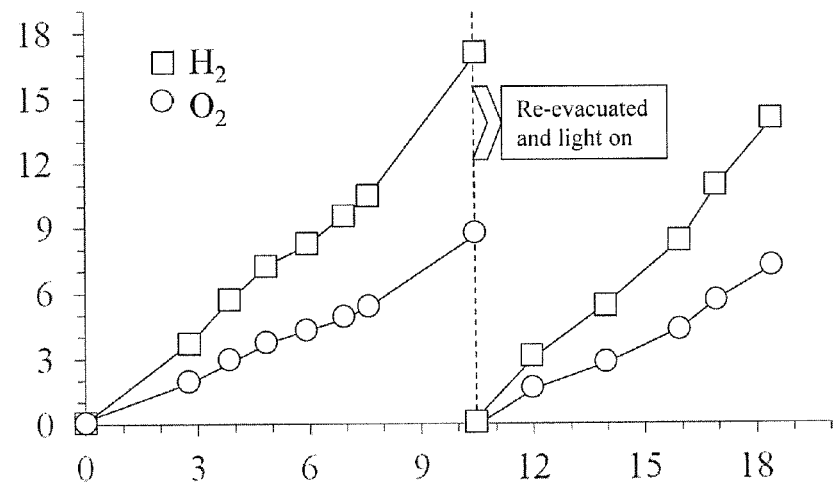
FIG. 46B depicts the experiments results of photocatalytic water splitting on $Rh/Cr_2O_3$ core-shell nanostructure deposited GaN nanowires according to an embodiment of the invention.
Figure 47:
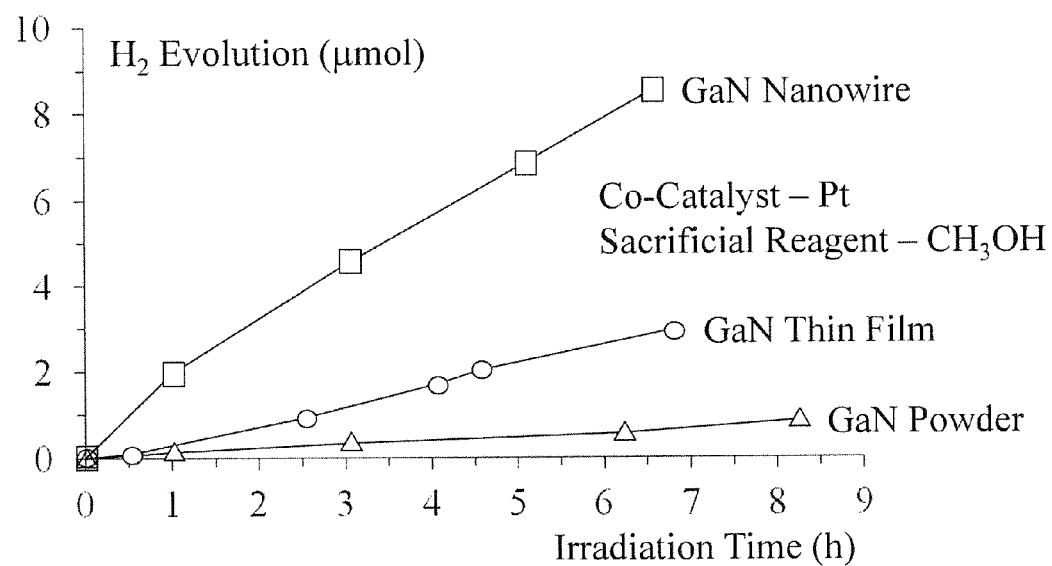
FIG. 47 shows $H_2$ evolution of GaN nanowires according to an embodiment of the invention compared with GaN thin film and powder samples.

A visual depiction of the water splitting process by GaN nanowire $Rh/Cr_2O_3$ nanostructures is illustrated in FIG. 46A wherein photogeneration within the GaN nanowire generates electron-hole pairs which form part of the water oxidation, $2H_2O+4h^- \rightarrow 4H^+ +O_2$, and proton reduction, $4H^+ +4e^- \rightarrow 2H_2$. Accordingly, it is evident from the experimental results presented in FIG. 46B that overall water splitting is realized using the GaN nanowire $Rh/Cr_2O_3$ nanostructures according to an embodiment of the invention. FIG. 46B depicts typical evolution of the photocatalytic water splitting reactions over time. In the two cycles depicted totaling approximately 20 hours, a steady and nearly stoichiometric evolution of $H_2$ and $O_2$ gases was observed. No apparent degradation in the photocatalytic activity was observed after 20 hours. Repeated experiments yield similar results to those shown in FIG. 46B. It is also noted that the pH (~7.0) of the reactant solution was virtually invariant after the reaction. Additionally, the turnover number (defined as the number of reacted electrons over the number of atoms in a photocatalyst) exceeded 6 after approximately 20 hours reaction time. Moreover, the turnover number of the GaN nanowire $Rh/Cr_2O_3$ nanostructures according to embodiments of the invention is significantly higher than the commonly reported values for powder and thin film samples of GaN which are presented in FIG. 47 compared with GaN nanowires.

These experimental results further confirm that the evolution of $H_2$ and $O_2$ gases results from a photocatalytic reaction can be achieved with GaN nanowires according to embodiments of the invention which are chemically stable in the whole reaction process. Preliminary measurements also show an apparent quantum yield of ~0.5%. However, the real quantum yield is expected to be significantly higher and may be further improved by optimizing the nanowire dimensions, doping, material etc. in combination with the surface density, size, and doping concentrations for the $Rh/Cr_2O_3$ nanostructures. For example the use of tunable band gap epitaxial InGaN nanowires rather than GaN nanowires should result in high-efficiency overall water splitting and $H_2$ production under direct solar irradiation.

However, it would be evident to one skilled in the art that the descriptions and experimental results presented supra in respect of FIGS. 42 through 47 that III-nitride nanowire heterostructures discretely and in combination with core-shell nanostructure cocatalysts provide the basis for viable photocatalysts for achieving stable and efficient water splitting and $H_2$ generation directly from solar irradiation. Moreover, the realization of these wafer-level monolithic photocatalytic device structures as opposed to prior art thin film and powder based approaches offer the potential for low cost, high performance, and compact hydrogen production systems that were not previously possible using the materials and techniques within the prior art.

Multi-Band Nanowires:

Within the preceding discussions in respect of embodiments of the invention GaN which has a large bandgap ($E_g \approx 3.4$ eV) was exploited to provide photocatalytic water splitting. However, such a bandgap corresponds to the deep blue/violet/ultraviolet regions of the optical spectrum in respect of solar radiation absorbed. Accordingly, the inventor(s) has(have) extended the techniques described supra in respect of FIGS. 42 through 47 in combination with those described supra in respect of FIGS. 3 through 41 wherein multi-band metal-nitride nanowire arrays are employed to achieve one-step hydrogen production from overall pure water splitting under visible light irradiation. Compared to conventional oxide-based catalysts within the prior art the direct energy bandgap ($E_g$) of metal-nitrides, e.g. InGaN can be tuned to encompass nearly the entirely solar spectrum, see for example FIGS. 12 and 21 supra as well as for example Wu in "When Group-III Nitrides Go infrared: New Properties and Perspectives" (Appl. Phys., Vol. 106, 011101) and Kuykendall et al in "Complete Composition Tunability of InGaN Nanowires using a Combinatorial Approach" (Nature Mater., Vol. 6, pp. 951-956). Moreover, recent density functional theory (DFT) calculations showed that the band edge potentials of InGaN can straddle the $H^+/H_2$ and $O_2/H_2O$ redox potentials for In compositions up to approximately 50%, i.e. bandgaps down to approximately 1.7 eV (780 nm in the red region of the visible spectrum), see for example Moses et al in "Band Bowing and Band Alignment in InGaN Alloys" (Appl. Phys. Lett., Vol. 96, 021908).

Accordingly, multi-band nanowires, such as InGaN for example, would provide for overall water splitting under visible light irradiation. Further, metal nitrides with $d^{10}$ electronic configuration, e.g. $In^{3+}$, $Ga^{3+}$, etc, possesses conduction and valence bands of hybridized sp orbitals with large dispersion, indicating high mobility of photoexcited carriers and hence enhanced photocatalytic activity, see for example Inoue in "Photocatalytic Water Splitting by RuO2-loaded Metal Oxides and Nitrides with $d^0$- and $d^{10}$-related Electronic Configurations" (Energy Environ. Sci., Vol. 2, pp. 364-386). Further, the large surface-to-volume ratios of nearly defect-free one-dimensional nanowires can further enhance the charge carrier separation, surface reaction rate and therefore the overall photocatalytic activity, see for example Walter et al in "Solar Water Splitting Cells" (Chem. Rev., Vol. 110, pp. 6446-6473) and Hwang et al in "Si/InGaN Core/Shell Hierarchical Nanowire Arrays and their Photoelectrochemical Properties" (Nano. Lett., vol. 12, pp. 1678-1682). Moreover, a multi-bandgap nanowire heterostructure facilitates efficient matching and utilization of incident solar irradiation.

Accordingly, the inventor(s) has(have) established in the preceding sections of this specification a novel fabrication methodology for the formation of high quality metal nitride, e.g. InGaN, nanowire structures as well as quantum dot in a nanowire and quantum dot within a quantum dot within a nanowire structures due to the quality of the nanowires. Accordingly, the inventor(s) has(have) shown that these can form the basis of a variety of electronic, optoelectronic and optical devices as well as providing a new material platform for one-step, stable production of solar-fuels under both UV and visible light irradiation. Accordingly, the inventor(s) has (have) established catalyst-free growth of high quality InGaN/GaN multi-band nanowire heterostructures via radio frequency plasma-assisted molecular beam epitaxy (MBE) as discussed supra in respect of embodiments of the invention.

Multi-Band Nanowire MBE Growth:

Vertically aligned InGaN/GaN nanowire heterostructures were grown on Si (111) substrates by radio-frequency plasma-assisted MBE under nitrogen rich conditions without using any external catalyst as presented supra in respect of embodiments of the invention. Instead of direct formation of InGaN nanowires on Si (111) an initial GaN nanowire template was formed with subsequent controlled formation of InGaN quantum dots with excellent structural and optical properties. Each InGaN quantum dot was capped by an approximately 3 nm thick GaN barrier layer. The growth parameters for GaN nanowire included a growth temperature of approximately 750° C., nitrogen flow rate of 1.0 sccm, a forward plasma power of approximately 350 W, and a Ga beam equivalent pressure of $\approx 6 \times 10^{-8}$, see Nguyen2. During growth in order to incorporate the InGaN quantum dots the growth temperature was reduced to approximately 600° C. The composition and energy bandgap of InGaN ternary wires and quantum dots being controllable by varying the In/Ga flux ratios as well as the growth temperature.

Accordingly, vertically aligned GaN nanowires with ten self-organized InGaN/GaN quantum dots were incorporated along the axial dimension of the GaN nanowires as shown schematically shown in FIG. 48. The InGaN quantum dot heights are approximately 3 nm, and the In composition of the dots was varied in the range of approximately 15 to 50% across the series of InGaN quantum dots to effectively cover a broad absorption wavelength range. Accordingly such unique InGaN/GaN dot-in-a-wire nanoscale heterostructures enable the harness of sunlight into the green spectral range without the formation of extended defects and dislocations resulting from the large lattice mismatch (approximately 11%) between InN and GaN present within prior art structures, see Nguyen2. To further enhance optical absorption within the blue wavelength range, an InGaN nanowire segment 4810 of approximately 30 nm height and average In composition of approximately 11% was also incorporated in the GaN nanowire 4830 above the series of InGaN/GaN quantum dots 4820. InGaN nanowire segment 4810 being is separated by approximately 15 nm GaN from the uppermost InGaN quantum dot of the series of InGaN/GaN quantum dots 4820.

Figures 48A, 48C:
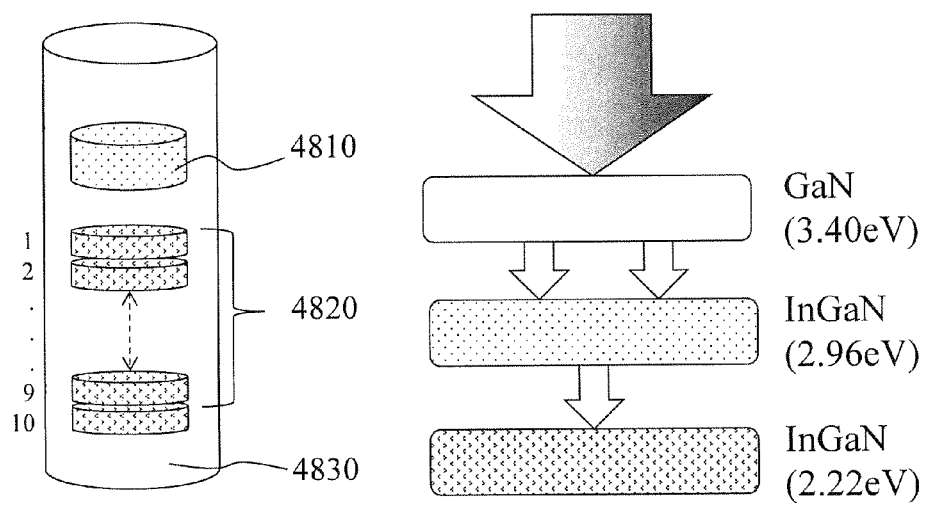
FIG. 48A depicts a schematic of an InGaN/GaN nanowire heterostructure according to an embodiment of the invention.
FIG. 48C depicts a schematic of an InGaN/GaN triple band nanowire heterostructure according to an embodiment of the invention.
Figure 48B:
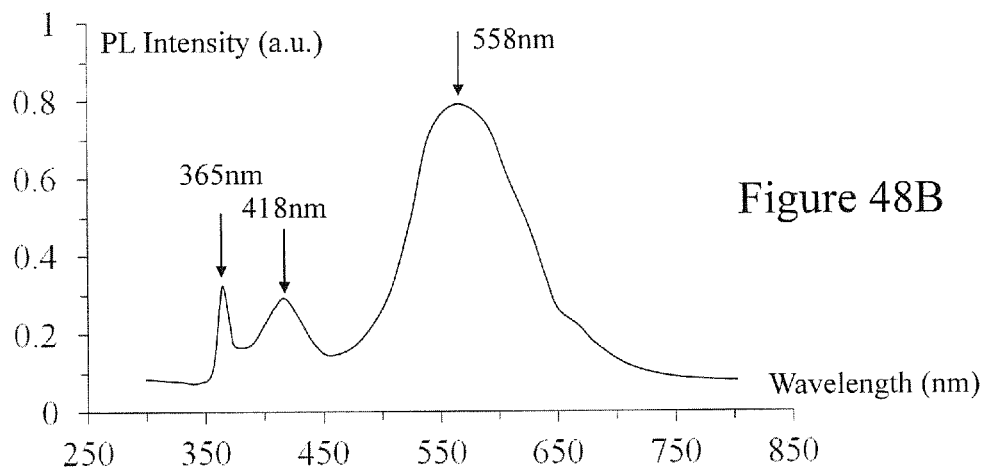
FIG. 48B depicts room temperature photoluminescence spectra of InGaN/GaN nanowire arrays according to an embodiment of the invention.

The photoluminescence (PL) spectrum of the as fabricated InGaN/GaN nanowire heterostructures measured at room temperature is depicted in FIG. 48B clearly shows optical emission from GaN nanowire 4830, InGaN ternary nanowire segment 4810, and series of InGaN/GaN quantum dot-in-a-wire structures 4820, with the corresponding peak wavelengths at approximately 365 nm, 418 nm, and 558 nm, respectively. With the use of a bowing co-efficient of 1.43, see for example Wu et al in "Small Band Gap Bowing in $In_{1-x}Ga_xN$ Alloys" (Appl. Phys. Lett., Vol. 80, pp. 4741-4743), and also neglecting any quantum confinement effect, the average In compositions for the InGaN ternary wire and InGaN dots were estimated to be approximately 11% and 32%, respectively. As illustrated in FIG. 48C the resulting InGaN/GaN nanowire heterostructure can function effectively as a triple-band structure for harvesting sunlight in the UV, blue, and green spectral regions.

Figure 49A:
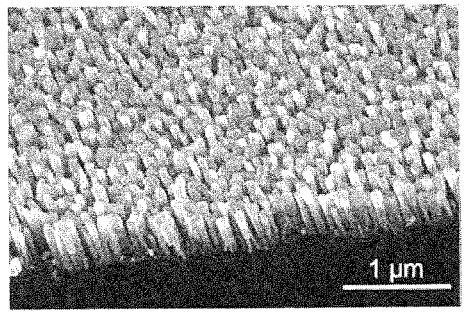
FIG. 49A depicts a 45° tilted SEM image of GaN/InGaN nanowire heterostructures grown on GaN nanowire templates on Si (111) according to an embodiment of the invention.
Figure 49B:
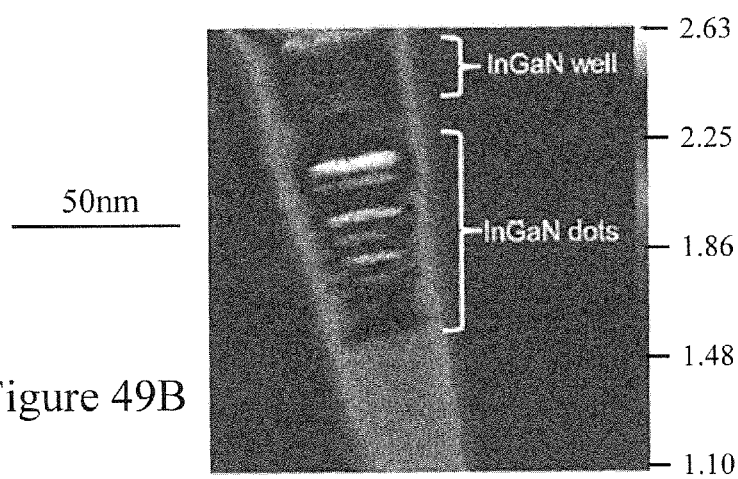
FIG. 49B depicts an HAADF image in pseudo-colour of an as-grown InGaN/GaN nanowire heterostructure according to an embodiment of the invention showing the atomic number contrast between the InGaN and GaN layers.

Referring to FIG. 49A there is shown a 45° tilted SEM image of the as-grown InGaN/GaN nanowire ensemble on Si (111) substrate. The nanowires are vertically aligned to the substrate with nearly uniform height of approximately 500 nm, lateral sizes of approximately 30-70 nm, and an areal density in the range of approximately $1.5 \times 10^{10}$ cm$^{-2}$. Structural properties of the InGaN/GaN nanowire heterostructures were further studied using STEM microscopy and spectrum imaging. An HAADF image of an InGaN/GaN nanowire in a pseudocolor display is depicted in FIG. 49B, illustrating the atomic number contrast between InGaN and GaN (grey). It can be seen that the ten InGaN/GaN quantum dots are vertically aligned along the growth direction of the wire and that the InGaN nanowire segment can also be identified. The nanowires possess wurtzite crystal structure and are oriented along the c-axis. From energy dispersive X-ray spectrometry spectrum imaging (EDXS-1) studies, the compositional variation of In in each dot was measured to be within the range of approximately 15-50%, which is in agreement with the broad spectral linewidth measured in the PL spectrum from the dots (peak at approximately 558 nm), shown in FIG. 48B. The TEM studies further confirm that the lateral dimension of InGaN dots is comparable to that of the wire, and, as a consequence, photo-generated charge carriers in InGaN can readily diffuse or tunnel to the wire surface to drive redox reactions on the nonpolar GaN (1 0 $\bar{1}$ 0) surface, i.e. the lateral m-plane surfaces.

Within the prior art, and as presented supra in respect of GaN nanowires by the inventors, the GaN surface possesses the thermodynamic and kinetic potential for overall water splitting, see also for example Wang et al in "Wafer-Level Photocatalytic Water Splitting on GaN Nanowire Arrays Grown by Molecular Beam Epitaxy" (Nano. Lett., Vol. 11, pp. 2353-2357), Chen et al in "First-Principles Calculations of Hydrogen Generation due to Water Splitting on Polar GaN Surfaces" (J. Phys. Chem. C, Vol. 114, pp. 18228-18232), and Shen et al in "Photocatalytic Water Oxidation at the GaN (1 0 $\bar{1}$ 0)—Water Interface" (J Phys. Chem. C, Vol. 114, pp. 13695-13704). To further verify that InGaN possesses the thermodynamic and kinetic potential for overall water splitting as predicted by DFT calculations, see for example Moses, half reactions for individual evolution of $H_2$ and $O_2$ were first performed under visible light illumination. A long-pass ($\lambda$>385 nm) filter was utilized to optically excite only the InGaN material. Methanol, $CH_3OH$, and silver nitrate, $AgNO_3$, were used as sacrificial reagents for $H_2$ and $O_2$ half reactions, respectively.

Half reactions are usually performed to test if the material possesses the thermodynamic potential for reducing or oxidizing water into $H_2$ or $O_2$ separately. In the case of $H_2$ half reaction, methanol is oxidized by the photogenerated holes in the valence band and therefore the electrons can easily migrate to the surface of the photocatalyst where the H' ions reduce to $H_2$. In the $O_2$ half reaction, the photogenerated electrons in the conduction band reduce $Ag^+$ to Ag, while the valence band holes oxidize $H_2O$ to $O_2$. The $H_2$ half reactions for InGaN/GaN nanowire photocatalyst were performed with the presence of $CH_3OH$ (10 vol. %) as electron donor and Pt (1 wt %) nanoparticles as co-catalyst. The Pt co-catalyst was in situ photodeposited from an aqueous $H_2PtCl_6$ solution to accelerate $H_2O$ reduction reaction. Successful photodeposition of metallic Pt(0) was confirmed by XPS. A separate $O_2$ half reaction experiment was performed in the presence of $AgNO_3$ (0.1 M) as electron acceptor.

Figure 50A:
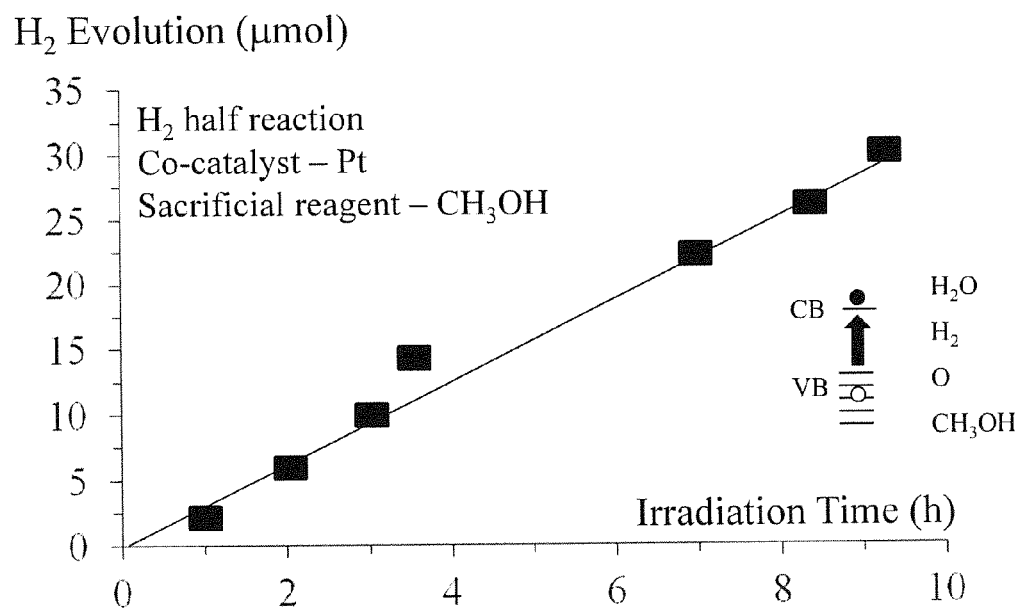
FIG. 50A depicts experimental evolution of H2 in half reaction with the presence of $CH_3OH$ and Pt with GaN/InGaN nanowires according to an embodiment of the invention.
Figure 50B:
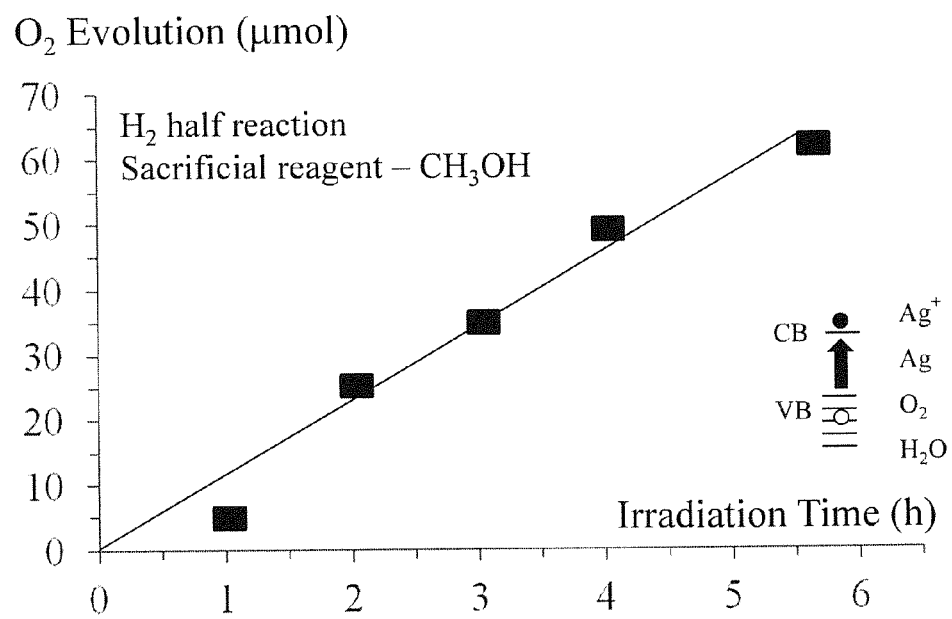
FIG. 50B depicts experimental evolution of O2 in half reaction with the presence of $AgNO_3$ with GaN/InGaN nanowires according to an embodiment of the invention.

The resulting evolution of $H_2$ and $O_2$ exhibits a nearly linear increase over time, as depicted in shown in FIGS. 50A and 50B respectively. Over approximately 3 μmol/hr of $H_2$ and approximately 10 μmol/hr of $O_2$ were produced during the course of the experiment, which confirmed that the conduction and valence band edge potentials of the $In_xGa_{1-x}N$ nanowires according to embodiments of the invention meet the thermodynamic and kinetic requirements for $H_2$ and $O_2$ evolution. No degradation of activity was observed during the course of these experiments.

In addition to the thermodynamic and kinetic potential requirement, the efficiency of photocatalytic water splitting is strongly influenced by surface electronic structure and charge properties. The half reactions further suggest that the activity for $H_2O$ reduction is less efficient, compared to that of $H_2O$ oxidation reaction. This can be qualitatively explained by the presence of an upward band bending on the surfaces of nominally undoped or n-type Ga(In)N, due to the Fermi-level pinning related to surface states and defects, see for example van der Walle et al "Microscopic Origins of Surface States on Nitride Surfaces" (J Appl. Phys, Vol. 101, 081704), Bertelli et al in "Atomic and Electronic Structure of the Non-Polar GaN (1100) Surface" (Phys. Rev. B, Vol. 80, 115324), and Sanford et al in "Steady-State and Transient Photoconductivity in c-axis GaN Nanowires Grown by Nitrogen-Plasma-Assisted Molecular Beam Epitaxy" (J Appl. Phys., Vol. 107, 034318, 14pg). The resulting tunneling barrier can significantly reduce the electron transfer to the surface reaction sites, thereby limiting the $H_2$ production efficiency. In order to increase the activity for $H_2$ evolution, noble metals are usually introduced as cocatalyst to unpin the surface Fermi level for promoting charge separation and surface chemical reactions. The cocatalyst creates chemically active reaction sites and decreases the activation energy barrier for catalytic reactions, see for example Kamat in "Photophysical, Photochemical and Photocatalytic Aspects of Metal Nanoparticles" (J. Phys. Chem. B, Vol. 106, pp. 7729-7744). Accordingly, enhanced photocatalytic activity may be expected from a cocatalyst incorporated photocatalyst.

Recent study, see for example Wang and Maeda et al. in "Preparation of Core-Shell-Structured Nanoparticles (with a noble-metal or metal oxide core and a chromia shell) and their Application in Water Splitting by means of Visible Light" (Chem., Vol. 16, pp. 7750-7759), suggests that rhodium/chromium oxide core-shell nanoparticles can act as excellent $H_2O$ reduction cocatalyst for $H_2$ evolution and can be readily incorporated on GaN nanowire photocatalyst using photodeposition techniques, such as described supra. While rhodium (Rh) metal core nanoparticles enhance the forward reaction of $H_2O$ reduction, the chromium oxide ($Cr_2O$) amorphous shell suppresses the backward reaction to form $H_2O$ from $H_2$ and $O_2$ on the Rh core, see for example Chen et al in "Semiconductor-Based Photocatalytic Hydrogen Generation" (Chem. Rev., Vol. 110, pp. 6503-6570).

Accordingly, as discussed supra in respect of GaN nanowires the inventor(s) has(have) In this regard; we have investigated the photodeposition (supplementary online text) of Rh/Cr2O2 nanoparticles on the InGaN/GaN nanowire heterostructure. In a manner similar to that discussed supra the photodeposition of $Rh/Cr_2O_3$ core-shell nanoparticles was performed in two steps. First, 3 μL of 0.2 mM sodium hexachlororhodate(III) ($Na_3RhCl_6$), 6 ml of $CH_3OH$, and 60 ml of "ultrapure" water of Type 1 (e.g. ISO 3696) water were placed in a Pyrex™ chamber and the solution purged with ultra-pure Argon for 15 minutes. The chamber was then evacuated for 10 minutes before being irradiated using a 300 W Xenon lamp for 30 minutes for photo-assisted deposition of Rh nanoparticles. In the second step, the above mentioned procedure was followed with 34 of 0.2 mM potassium chromate ($K_2CrO_4$) as precursor for $Cr_2O_3$ deposition. The nanowire photocatalyst was then dried.

Figure 51:
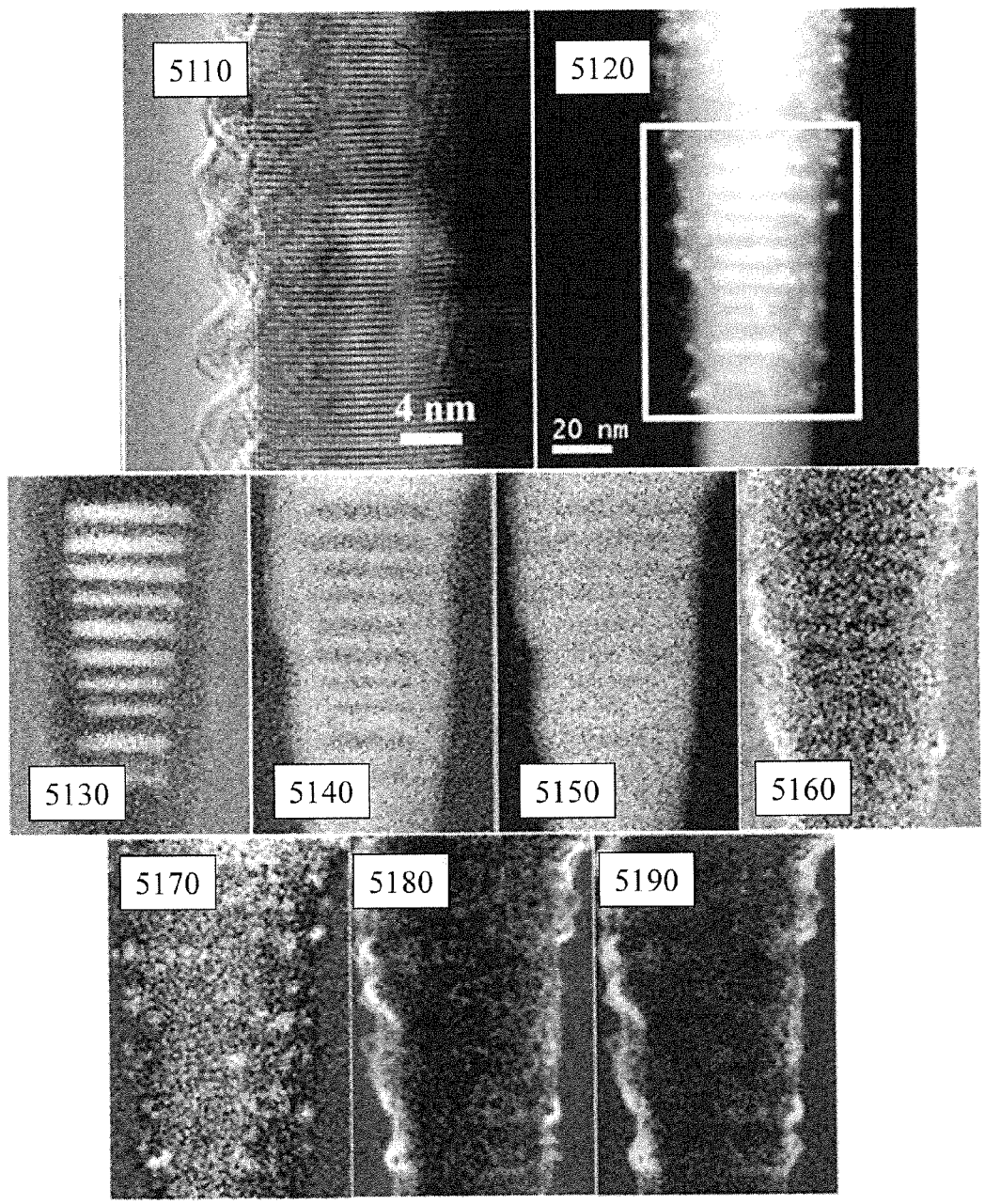
FIG. 51 depicts high resolution TEM image and EELS mapping images of $Rh/CrO_3$ nanoparticles on the lateral surfaces of a GaN/InGaN nanowire according to an embodiment of the invention.

Referring to FIG. 51 first image 5110 depicts a high resolution TEM (HRTEM) image of InGaN/GaN nanowires after photodeposition of $Rh/Cr_2O_3$ nanoparticles. The structural characterization demonstrates that nanoparticles were uniformly deposited on the lateral surfaces of the crystalline nanowires. Additionally, an electron energy loss spectrometry (EELS) spectrum image, second image 5120, confirms that the $Rh/Cr_2O_3$ nanoparticles formed a core/shell nanostructure on the nanowire surface. Due to the edges overlap, the elemental distribution of In, Ga, N, O, Rh and Cr as depicted in third to eighth images 5130 through 5180 respectively for the nanowire photocatalyst was derived from the EELS spectrum image, second image 5120, with multiple linear least square (MLLS) fitting, see for example Leapman et al in "Separation of Overlapping Core Edges in Electron Energy Loss Spectra by Multiple-Least-Square Fitting" (Ultramicroscopy, Vol. 26, pp. 393-403). Accordingly, the nanostructures employed within these experiments employed crystalline Rh nanoparticles were approximately 5 nm with a covering of approximately 2-3 nm thick amorphous $Cr_2O_3$ shell. The $Rh/Cr_2O_3$ core-shell nanostructures are also clearly illustrated in the RGB image with Rh, Cr and O signals overlaid in ninth image 5190. X-ray photoelectron spectroscopy (XPS) analysis further confirmed that the photodeposited nanoparticles consist of metallic Rh (Rh $3d_{5/2}$ binding energy ~307.5 eV), mixed Rh—Cr oxide (Rh $3d_{5/2}$ binding energy ~309.69 eV), and $Cr_2O_3$ (Cr $2p_{3/2}$ binding energy ~576.9 eV).

Figure 52A:
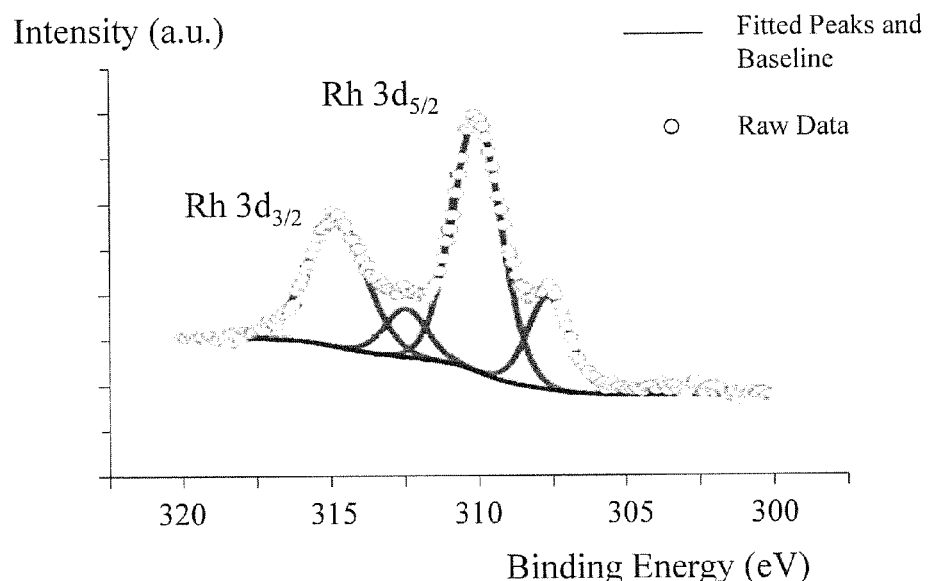
FIG. 52A depicts high resolution XPS spectra of Rh 3d core level electrons for $Rh/Cr_2O_3$ core/shell nanostructures coated GaN/InGaN nanowires according to an embodiment of the invention.
Figure 52B:
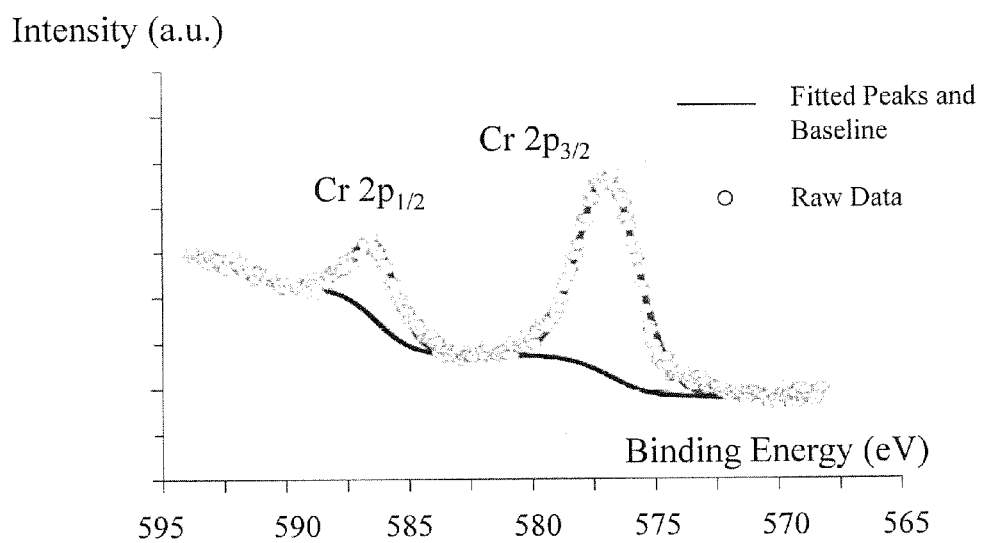
FIG. 52B depicts high resolution XPS spectra of Cr 2p core level electrons for $Rh/Cr_2O_3$ core/shell nanostructures coated GaN/InGaN nanowires according to an embodiment of the invention.

In order to confirm the presence and the valence state of the cocatalyst nanoparticles, XPS analysis was performed after photodeposition. FIGS. 52A and 52B respectively depict the high resolution XPS spectra for the $Rh_{3d}$ and $Cr_{2p}$ core level electrons after photodeposition on the InGaN/GaN nanowires. After de-convolution using Lorentzian-Gaussian mixing functions (L/G=30%), two spin-doublets were clearly resolved from $Rh_{3d}$ peak. The $Rh3d_{5/2}$ peak observed at 307.5 eV is attributed to metallic rhodium Rh°, see for example Moulder et al. in "Handbook of X-Ray Photoelectron Spectroscopy" (Perkin-Elmer Corp, Eden Prairie, Minn., 1992). This value is slightly higher than the reported values for bulk metallic Rh (307.2 eV) as commonly observed in nanosized metal particles due to initial and final-state effects, see for example Mason in "Electronic Structure of Supported Small Metal Clusters" (Phys. Rev. B, Vol. 27, pp. 748-762). The Rh3d$_{5/2}$ peak at 309.69 eV is attributed to a mixed Rh—Cr oxide, indicating the interaction between the Rh and Cr nanoparticles, see for example Li et al "Direct Hydrogen Gas Generation by using InGaN Epilayers as Working Electrodes" (Appl. Phys. Lett., Vol. 93, 162107). The areas of the two deconvoluted XPS peaks in FIG. 52A correspond to 16.15% Rh in metallic)(Rh° form and 83.85% in mixed Rh—Cr oxide form. The deconvolution of Cr2p peak reveals one spin-doublet as shown in FIG. 52B. The Cr2p$_{3/2}$ peak at 576.9 eV is in good agreement with the reported values for $Cr_2O_3$, see for Maeda et al in "Roles of Rh/Cr2O3 (Core/Shell) Nanoparticles Photodeposited on Visible-Light Responsive $(Ga_{1-x}Zn_x)(N_{1-x}O_x)$ Solid Solutions in Photocatalytic Overall Water Splitting" (J Phys. Chem. C, Vol. 111, pp. 7554-7560). Therefore, the valence state of Cr in the co-catalyst is trivalent after photodeposition. From FIG. 52B we also observe that there is no peak observed near 579.6 eV which is assigned to $Cr^{6+}$; indicating that all the $Cr^{6+}$ species in the precursor ($K_2CrO_4$) have been photoreduced to form $Cr_2O_3$ after photodeposition. The surface compositions of Rh and $Cr_2O_3$ were 2.62 and 3.36 At.%, respectively, as estimated from the areas of the corresponding XPS peaks after Shirley background subtraction. A control experiment further confirmed that the deposited nanoparticles are indeed caused by photodeposition, and not via other processes such as physical deposition without the influence of irradiation.

Figure 53A:
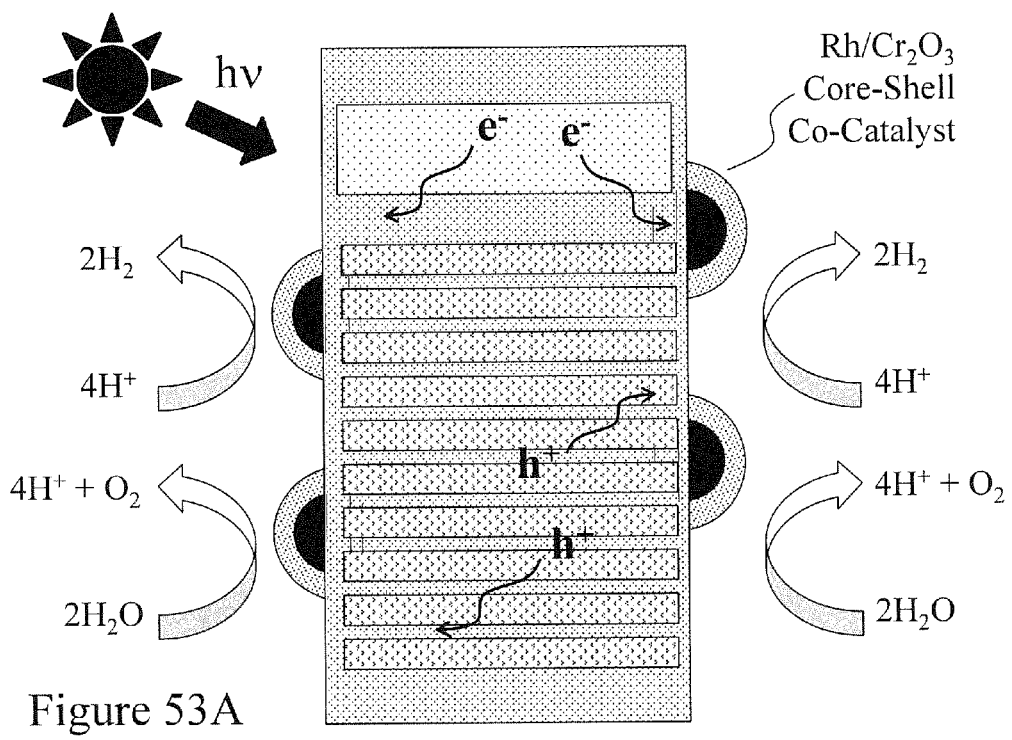
FIG. 53A depicts a schematic of the photocatalytic overall water splitting reaction mechanism using $Rh/Cr_2O_3$ core/shell nanostructures coated GaN/InGaN nanowires according to an embodiment of the invention.
Figure 53B:
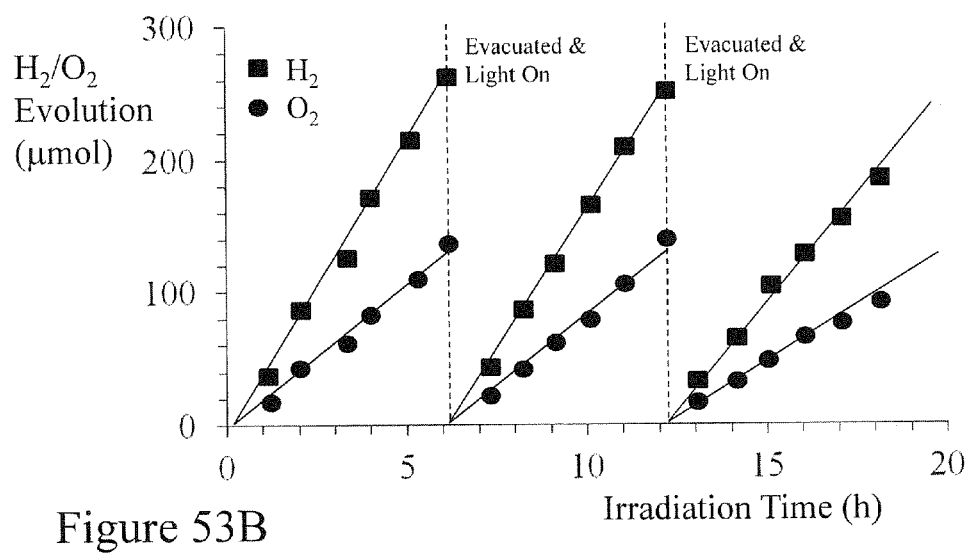
FIG. 53B depicts overall pure water splitting using $Rh/Cr_2O_3$ core/shell nanostructures coated GaN/InGaN nanowires according to an embodiment of the invention.

The Rh/$Cr_2O_3$ nanoparticle coated InGaN/GaN nanowire heterostructures were subsequently used for photocatalytic overall pure water splitting under a 300 W full arc (>300 nm) Xenon lamp. In these experiments, an approximately 3.3 cm$^2$ substrate was employed. Referring to FIG. 53A there is depicted a schematic of the reaction mechanism on the Rh/$Cr_2O_3$ core-shell nanoparticle coated InGaN/GaN nanowire heterostructure. Four photons are required to catalyze water oxidation ($2H_2O+4h^+ \rightarrow 4H^+ + O2$) and proton reduction ($4e^- + 4H^+ \rightarrow 2H_2$) in overall water splitting. Referring to FIG. 53B results for the overall pure water (pH~7.0) splitting on Rh/$Cr_2O_3$ photodeposited InGaN/GaN nanowire heterostructures under full arc (>300 nm) irradiation are presented. Stoichiometric evolution of $H_2$ and $O_2$ is evident in the absence of any sacrificial reagents. Considering the heights of approximately 440 nm and approximately 60 nm for GaN nanowire and InGaN nanowire segments respectively, as well as the nanowire density of approximately 1.5×10$^{10}$ cm$^{-2}$, the corresponding material volumes are approximately 4.0 and approximately 0.38 μmol for GaN and InGaN, respectively.

More than 1056 μmol gases were evolved, approximately 683 μmol of $H_2$ and approximately 373 μmol of $O_2$, during the course of the approximately 18 hours of experiment, which is substantially greater than the total amount of GaN and InGaN catalysts, approximately 4.38 μmol, used in this experiment; suggesting that the reaction proceeded catalytically. Considering this amount, approximately 4.38 μmol of InGaN/GaN photocatalyst used, the $H_2$ production rate is approximately 92 mmolhr$^{-1}$ g$^{-1}$ of photocatalyst, which is nearly an order of magnitude higher than any previously reported photocatalyst for overall water splitting under full-arc (>300 nm) irradiation, see for example Maeda et al in "Improvement of Photocatalytic Activity of $(Ga_{1-x}Zn_x)(N_{1-x}O_x)$ Solid Solution for Overall Water Splitting by Co-loading Cr and another Transition Metal" (J. Catalysis, Vol. 243, pp. 303-308). The measured overall reaction represents a collective effect from the redox reactions driven by the charge carriers in the GaN wire, the InGaN ternary wire, and the InGaN quantum dots upon the absorption of photons in the UV and visible spectral range. The pH of the sample water was invariant after the experiment, indicating a balanced oxidation and reduction reaction of $H_2O$ and as supported by the approximately 1.85 ratio of evolved $H_2$:$O_2$. Moreover, the turnover number, defined as the ratio of total amount of $H_2$ evolved relative to the amount of catalyst, exceeded 155 after approximately 18 hours of experiment.

To further evaluate the photocatalytic activity under visible light and to derive the apparent quantum efficiency (AQE) of the InGaN nanowire photocatalyst, the hydrogen and oxygen evolution rate was measured as a function of wavelength by adopting several band-pass filters within subsequent experiments, these having center wavelengths of 400, 446, 505, 530, 560 and 600 nm. The measured incident power density varied between approximately 23-27 mW/cm for wavelengths between 400-560 nm. Optical reflections from the air/water and water/GaN interfaces were estimated to be approximately 14%, using the refractive indexes of air, water and GaN as 1.0, 1.33 and 2.3, respectively. The AQE was estimated using Equation (2) below.

$$AQE = 2 \times \frac{NumberEvolvedH_2 MoleculesPerHour}{NumberIncidentPhotonsPerHour} \times 100\% \quad (2)$$

Figure 54:
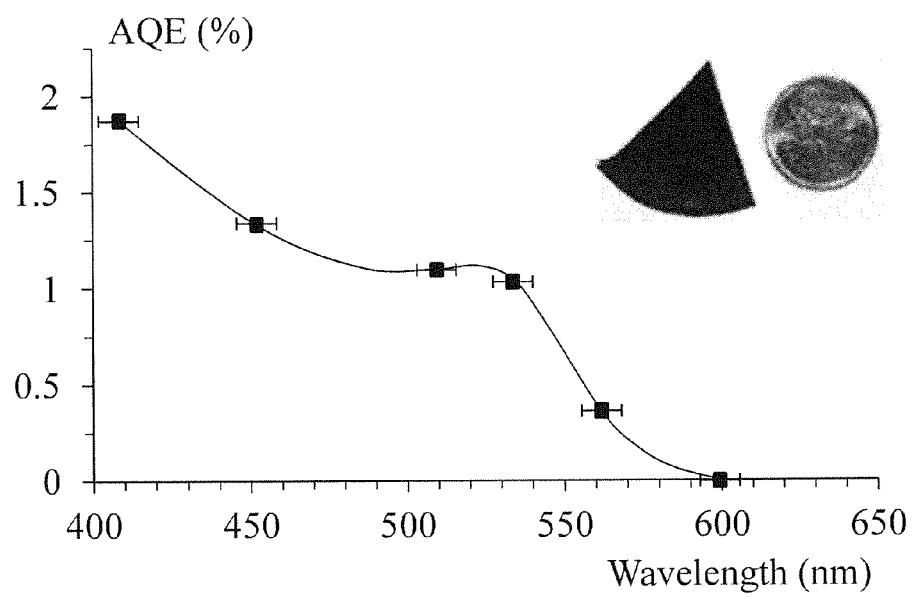
FIG. 54 depicts apparent quantum efficiency for $Rh/Cr_2O_3$ core/shell nanostructures coated GaN/InGaN nanowires according to an embodiment of the invention as a function of the incident light wavelength together with inset depicting sample employed.

Steady evolution of $H_2$ and $O_2$ was clearly observed under blue and green light irradiation over the range 400 nm to 560 nm providing unambiguous evidence that $In_xGa_{1-x}N$, for In compositions of approximately 32% or lower, possesses suitable band-alignment and bandgap for overall pure water splitting. For comparison, for structures without the incorporation of InGaN, no hydrogen can be observed under visible light irradiation over similar wavelength ranges. As evident from FIG. 54 the AQE decreases with increasing wavelength. The highest AQE, approximately 1.86%, was achieved at approximately 395-405 nm, which consists of the contribution from InGaN ternary wire (PL peak approximately 418 nm) and ten vertically aligned InGaN quantum dots (PL peak approximately 558 nm). The longest wavelength (approximately 560 nm) under which overall water splitting was achieved in these experiments was in agreement with the PL peak (approximately 558 nm) of the InGaN/GaN dot-in-a-wire structures, further confirming the photocatalytic activity of such quantum confined nanoscale heterostructures. The wafer size is schematically shown in the inset of FIG. 54. The quantum efficiency (QE) was estimated at 440-450 nm using an absorbed photon estimation based on the nanowire fill factor of approximately 90%, the total thickness of InGaN quantum dots (approximately 30 nm) and the absorption coefficient of 4×10$^4$ cm$^{-1}$ for InGaN with 32% In composition, see for example Hahn et al. in "Epitaxial Growth of InGaN Nanowire Arrays for Light Emitting Diodes" (ACS Nano., Vol. 5, pp. 3970-3976). The resulting QE efficiency calculated was approximately 13% at approximately 440-450 nm with a total quantum dot layer thickness of approximately 30 nm. It is also important to note that the quantum efficiency at each excitation wavelength depends not only on the optical absorption, but also on the carrier relaxation, diffusion and recombination as well as the degree of carrier localization and surface charge properties of the absorbing materials. Accordingly, the efficiency of these Rh/$Cr_2O_3$ nanoparticle coated InGaN/GaN nanowire heterostructures can be further improved by optimizing the design of such multi-band photocatalysts, such as for example incorporating of AlGaN barriers between the adjacent active regions.

Additionally, these studies correlate well with the dynamics of water dissociation at the (1 0 1̄ 0) terminated GaN surfaces. Recent first principles molecular dynamic simulations have suggested the GaN (1 0 $\bar{1}$ 0) surfaces are very reactive for spontaneous and extremely fast dissociation of a majority, approximately 83%, of the water molecules, $H_2O \rightarrow H^+ + OH^-$, which is in direct contrast with the most studied photocatalyst titanium dioxide, TiO2, see for example Wang et al in "Water Dissociation at the GaN(1 0 $\bar{1}$ 0) Surface: Structure, Dynamics and Surface Acidity" (J Phys. Chem. C, Vol. 116, pp. 14382-14389). Further, the low effective free-energy barrier for proton diffusion on GaN (1 0 $\bar{1}$ 0) surface facilitates enhanced migration of protons from the $O_2$ evolution reaction sites to $H_2$ evolution sites, which can lead to increased HZ evolution in the present heterogeneous $Rh/Cr_2O_3$ decorated InGaN/GaN nanowire photocatalyst. The overall pure water splitting under blue and green light irradiation is also partly attributed to the inherent polarization induced electric field within metal-nitrides, see for example Chichibu et al. in "Effective Band Gap Inhomogeneity and Piezoelectric Field in InGaN/GaN Multiquantum Well Structures" (Appl. Phys. Lett., Vol. 73, pp. 2006-2008) and the resulting quantum confined stark effect, see for example Lahnemann et al in "Coexistence of Quantum-Confined Stark Effect and Localized States in an (In,Ga)N/GaN Nanowire Heterostructure" (Phys. Rev. B, Vol. 84, pp. 155303, 6 pgs), that can effectively suppress the recombination of photogenerated electrons and holes and promote the transfer of charge carriers to the semiconductor/water interface. In addition, the extremely small surface recombination velocity of III-nitrides, compared to other semiconductors, can further reduce nonradiative surface recombination.

Figure 55A:
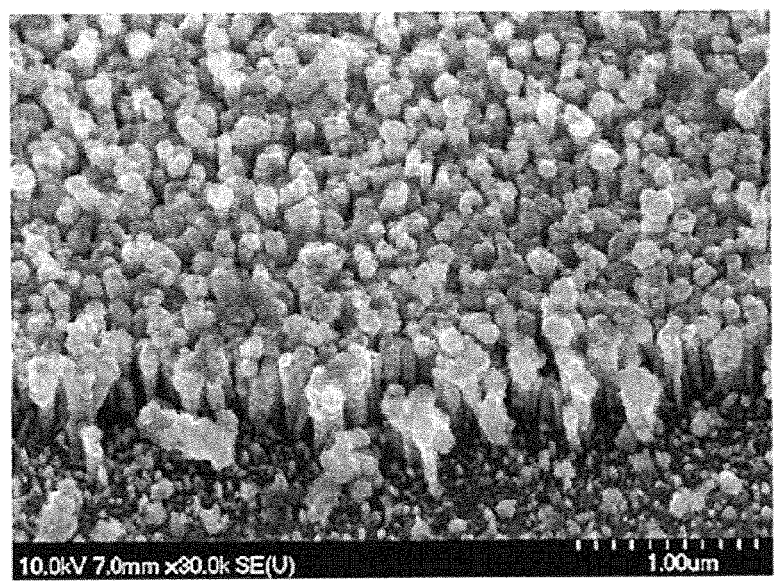
FIG. 55A depicts an SEM image of $Rh/Cr_2O_3$ core/shell nanostructures coated GaN/InGaN nanowires according to an embodiment of the invention after overall water splitting.
Figure 55B:
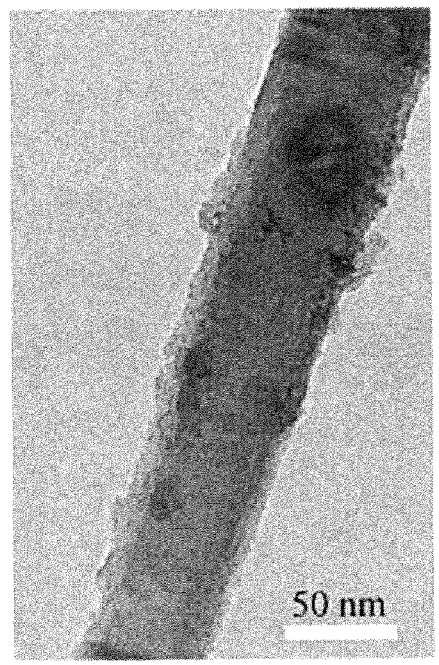
FIG. 55B depicts a low magnification TEM image of a single $Rh/Cr_2O_3$ core/shell nanostructures coated GaN/InGaN nanowires according to an embodiment of the invention after overall water splitting.

Beneficially, InGaN is highly resistant to corrosion, see for example Li and Waki et al. "Direct Water Photoelectrolysis with Patterned n-GaN" (Appl. Phys. Lett., Vol. 91, 093519. 3 pgs). The stability of the nanowire photocatalyst was further confirmed by detailed structural and surface analysis after the overall water splitting reactions performed and discussed supra. From SEM and TEM images of the InGaN/GaN nanowires after overall water splitting, see FIGS. 55A and 55B respectively the nanowire catalyst remained virtually unchanged during the course of reaction, indicating that the catalyst is stable under UV and visible light irradiation. FIGS. 55A and 55B being taken after 18 hours of reaction. These results clearly confirm a stable photocatalytic reaction of InGaN/GaN nanowire heterostructures on Si (lll) substrate. This wafer-level approach of water splitting offers recyclable and environmentally benign photocatalyst for large scale practical applications.

Figure 56A:
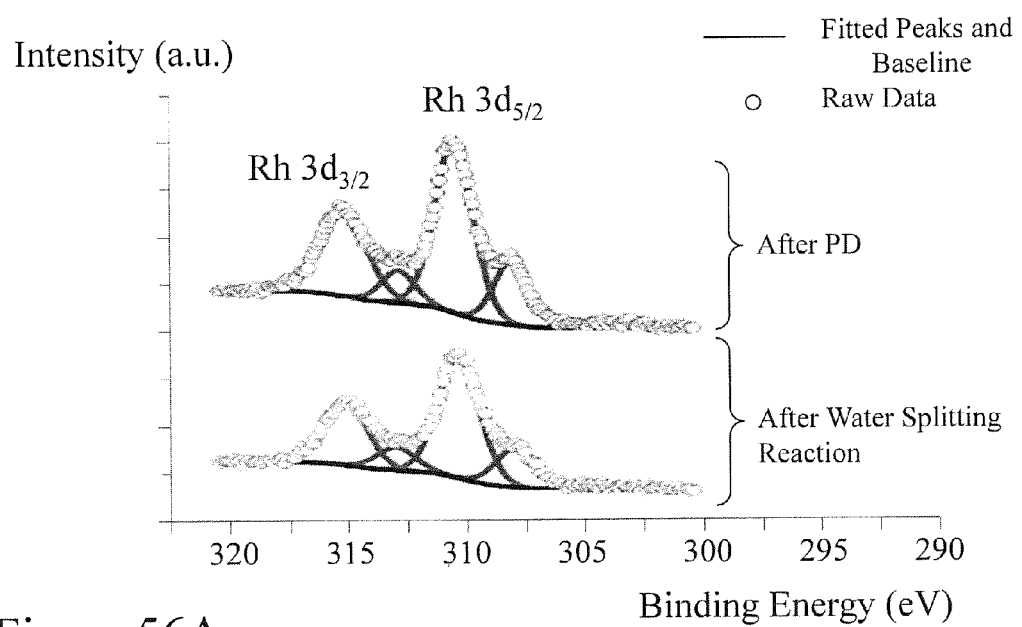
FIG. 56A depicts high resolution XPS spectra of Rh 3d core level electrons for $Rh/Cr_2O_3$ core/shell nanostructures coated GaN/InGaN nanowires according to an embodiment of the invention after photodeposition and overall water splitting.
Figure 56B:
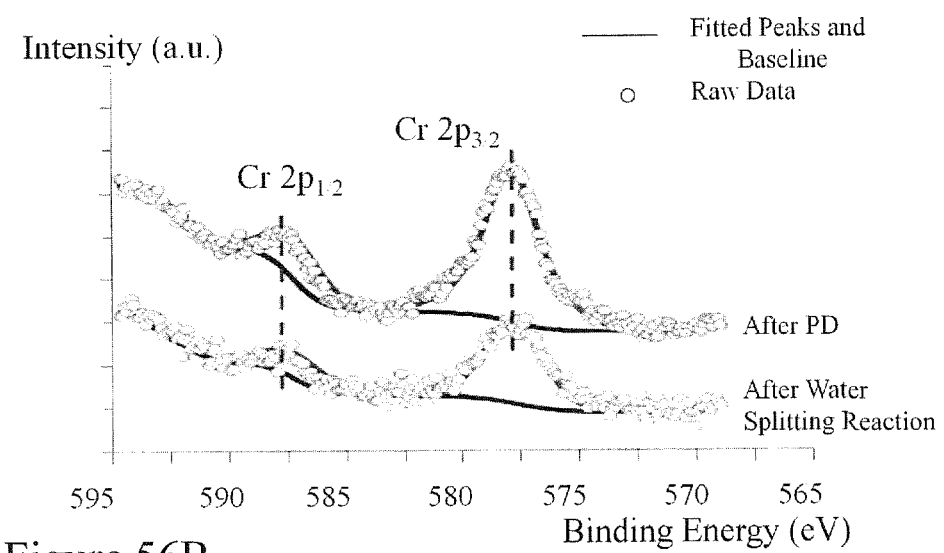
FIG. 56B depicts high resolution XPS spectra of Cr 2p core level electrons for $Rh/Cr_2O_3$ core/shell nanostructures coated GaN/InGaN nanowires according to an embodiment of the invention after photodeposition and overall water splitting.

Additionally comparison of XPS spectra pre- and post-reaction was undertaken as depicted in FIGS. 56A and 56B respectively. The Rh3d XPS peaks before and after overall water splitting reactions are shown in FIG. 56A wherein whilst the XPS peak position remains unchanged during the course of reaction, the XPS peak area for metallic Rh (307.5 eV) decreased from 16.15% (before the reaction) to 7.4% (after the reaction); suggesting that the metallic Rh particles are oxidized during the course of the reaction. This presumably arises from the fact that some of the Rh particles are not fully covered by the $Cr_2O_3$ coating and are, therefore, vulnerable to oxidation from the evolved oxygen. Whilst the atomic percentage of the Rh3d remained nearly the same after overall water splitting, the Cr2p reduced from 3.36% (before the reaction) to 2.95% (after the reaction) as evident in FIG. 56B. This is presumably due to corrosion and hydrolysis of the $Cr_2O_3$ co-catalyst which could explain the slightly reduced activity observed after few hours of reaction, see FIG. 53B, Also, the Cr2p peak position did not change after approximately 18 hours of reaction, see FIG. 56B. This result also reveals that the trivalent state of the Cr did not change after the reaction.

Within the embodiments of the invention described supra core-shell nanostructures formed from rhodium/chromium oxide were deposited upon the outer surface of GaN nanowires discretely and GaN nanowires with InGaN quantum dots and quantum wells embedded. However, it would be evident to one skilled in the art that other semiconductor material systems may be employed according to embodiments of the invention including, but not limited to, those exploiting initial InN nanowire structures with InGaN quantum dots and quantum wells, AlN nanostructures, AlGaN nanostructures, as well as other binary, ternary, and quaternary alloys of gallium, aluminum, indium and nitrogen. Such Ga and In based nitride nanostructures provide bandgaps compatible with photonic structures emitting and/or absorbing within the near ultraviolet through blue, green and into the yellow regions of the visible spectrum. It would be evident that extension from these into the yellow-orange, orange, red and near infrared regions of the electromagnetic spectrum may be attained by exploiting Ga and In based binary, ternary and quaternary structures with As and P. Further extension beyond 1 µm to approximately 4 µm is possible with such material systems such as InAsP ternary semiconductors. Further, extension into the mid-ultraviolet with the binary AlN may be considered.

Accordingly, it would be evident to one skilled in the art that by selectively patterning a single substrate with multiple nanowire designs of different binary, ternary, and quaternary materials systems that multiple band emitters and/or photovoltaic structures may be provided. Alternatively, multiple substrates each with a discrete nanowire design may be employed. Within embodiments of the invention the nanowires may be employed discretely such as described supra.

Within other embodiments of the invention nanoparticles may be employed to coat the surfaces of the nanowires or in combination with the nanowires. As described supra such combinations may include colloidal quantum dots may be CdS, CdSe, and CdTe to cover the blue/green/red portions of the visible spectrum such as described in respect of FIG. 9 or Rh/Cr2O3 nanoparticles upon the surfaces of the nanowires such as described in respect of FIGS. 44A to 44C respectively and FIG. 51. It would be evident to one skilled in the art that other nanoparticle material combinations may be employed according to the specific functionality of the device containing the nanowire—nanoparticle combination. Such core-shell nanoparticles may include, but not be limited to, noble metal-oxide, metal-xide, non-noble metal-oble metal, carbon-metal, carbon-noble metal, metal-silica, noble metal silica, as well as those exploiting semiconductors as core and/or shell. The particular core-shell nanoparticles together with metal, carbon, and semiconductor nanoparticles being selected according to the application of the devices containing them in respect of reducing reactions, oxidation reactions, etc. Accordingly, in addition to water splitting such nanostructures discretely or in combination with nanoparticles and electrical and/or optical carrier injection may be employed for other applications involving reactions with one or more components of fluids.

It would also be evident that within the preceding discussions consideration has been given primarily to vertical nanowire structures, also known as nanorods, although it would be evident to one skilled in the art that other nanostructures may be employed including, but not limited to, nanospheres, nanocones, nanodots, horizontal nanowires, nanotubes, and nanopores. Operation of the devices within the descriptions supra in respect of water splitting and core-shell nanoparticle/nanowire structures was achieved at room temperature. However, it would be evident to one skilled in the art that in some devices elevated temperatures and/or reduced temperatures may be required to achieve the desired functionality or improve the efficiency of the photoelectrochemical process. Further, such nanoparticle/nanowire structures as described in respect of FIG. 31 may exploit biomolecules in addition to non-biologically active or specific materials.

Non-Crystalline Substrate Growth

Within the descriptions supra in respect of FIG. 3 through 7 respectively the catalyst-free growth of high-quality GaN nanowires on Si(111) substrates was described according to embodiments of the invention both with and without providing a template to define nanowire location(s). Within these a thin, approximately 2-3 nm, amorphous $SiN_x$ layer was found to exist within the nanowire-substrate interface, see FIG. 4K. Accordingly, this indicates that the nanowire nucleation and growth may be initiated from this thin amorphous layer. Other discussions of the impact of this amorphous layer may be found for example in Stoica et al in "Interface and Wetting Layer Effect on the Catalyst-Free Nucleation and Growth of GaN Nanowires" (Small, Vol. 4, pp. 751-4), Consonmi et al in "Nucleation Mechanisms of Self-Induced GaN Nanowires Grown on an Amorphous Interlayer" (Phys. Rev. B, Vol. 83, 035301, 8 pgs), and Furtmayr et al in "Nucleation and Growth of GaN Nanorods on Si (111) Surfaces by Plasma-Assisted Molecular Beam Epitaxy—The Influence of Si- and Mg-doping" (J. App. Phys., Vol. 104, 034309, 7 pgs.). However, a thin $SiN_x$ layer on a Si(111) substrate cannot be a conclusive argument that GaN and other semiconductor nanowires can be spontaneously grown on amorphous substrates, due to the incompletely-removed influences from the underlying Si(111) substrate, e.g., the epitaxial relationship between the substrate, thin amorphous layer, and semiconductor nanowire.

The spontaneous formation of GaN nanowires on thick $SiO_x$ buffer layers deposited on Si(100) substrates has been investigated, wherein such ex situ deposited amorphous layers can remove any potential influences from the underlying substrates. Within these experiments in nitrogen rich environments no $SiN_x$ layer was found on top of $SiO_x$ layer (referred to hereinafter as a template), suggesting that in these instances the GaN nanowire formation started from the $SiO_x$ directly, see for example Stoica. However, within these experiments the resulting GaN nanowires generally exhibited random orientations with respect to the surface of the underlying $SiO_x$ template, which is itself believed to be related to the local surface roughness of the underneath amorphous layers, see for example Stoica.

Accordingly, the realization of catalyst-free, electronically pure GaN nanowires on amorphous substrates with controlled orientation, and superior crystalline and optical qualities on a large scale within the prior art has remained an elusive goal given the inherent benefits outlined supra for cost reduction, increased functional integration, performance enhancement etc. Accordingly, the inventor(s) has(have) extended the techniques discussed supra to yield catalyst-free molecular beam epitaxial (MBE) growth of GaN nanowires, GaN heterostructures, and InGaN/GaN dot-in-a-wire structures on $SiO_x$ upon both Si(111) and Si(100) substrates.

Within experiments performed by the inventors GaN nanowires/heterostructures were grown on $SiO_x$ templates deposited on 2-inch Si(111) or (100) substrates by radio-frequency (RF) plasma-assisted MBE. Prior to loading into the MBE system, the Si substrates were cleaned by standard solvent solutions, and then were coated with approximately 100 nm thick $SiO_x$, by plasma-enhanced chemical vapour deposition (PECVD), thereby acting as the amorphous template for the nanowire formation. For the subsequent demonstration of InGaN/GaN dot-in-a-wire LED heterostructures on amorphous templates, the thickness of the underneath $SiO_x$ is approximately 1.5 μm. The growth conditions for the GaN nanowires include a substrate temperature within the range 780° C. to 830° C., a Ga flux of approximately $7\times10^{-8}$ torr, a nitrogen flow rate of approximately 0.6-1.4 sccm, and a RF plasma forward power of approximately 350 W.

Figure 57:
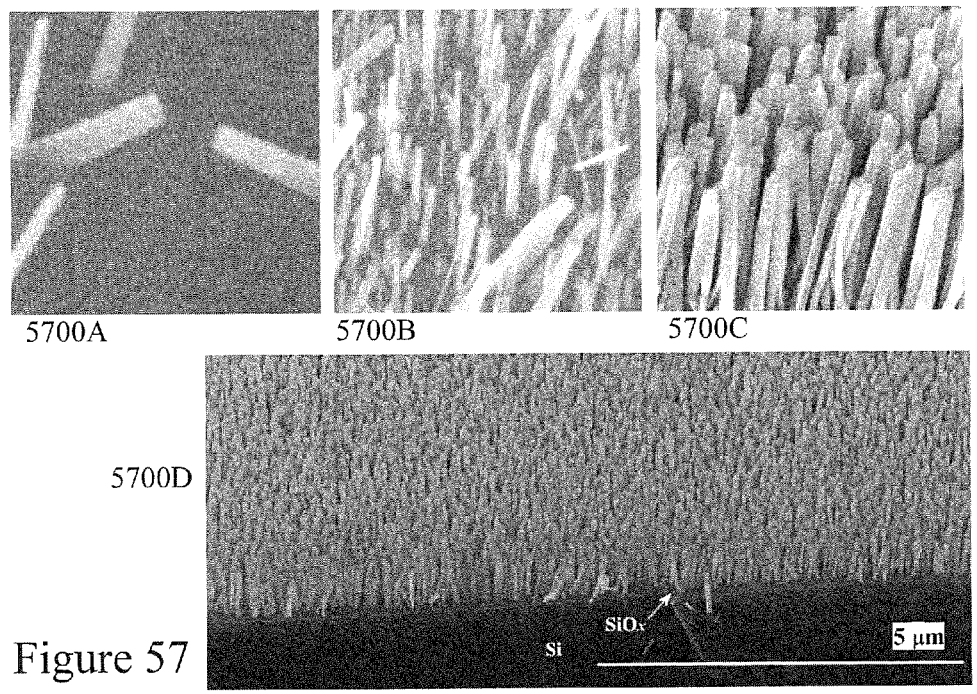
FIG. 57 depicts high resolution SEM images of GaN nanowires according to an embodiment of the invention grown on $SiO_X$ layers under different growth temperatures together with a low resolution image showing large area uniform growth.

Initially, GaN nanowires were grown with different substrate temperatures were first investigated, where the $N_2$, flow rate at approximately 1.0 sccm, with the $SiO_x$ layer deposited on Si(111) substrates. Scanning electron microscope (SEM) images taken with a 45-degree angle are depicted in FIG. 57 by first to third images 5700A to 5700C respectively for substrates temperatures of approximately 830° C., 808° C., and 780° C., respectively. It is evident that as the substrate temperature decreases the nanowire density increases dramatically. Further, the orientation of the nanowires changes from being random/tilted to almost-100% vertically aligned. It is also evident that the terms of the nanowire diameters and length distributions, increases significantly. Fourth image 5700D in FIG. 57 shows the highly uniform and vertically aligned nature of the GaN nanowires grown according to an embodiment of the invention on a large scale. Within fourth image 5700D the 100 nm-thick $SiO_x$ is also marked.

Additional growth experiments were also performed with varying $N_2$ flow rate, between approximately 0.6 sccm and approximately 1.4 sccm, whilst keeping the substrate temperature fixed at approximately 780° C. In these experiments no significant change in the nanowire density, orientation, and uniformity was observed. Furthermore, with similar growth conditions, changing the underlying substrate from Si(111) to Si(100) whilst using the same $SiO_x$ template did not affect the afore-described properties of the semiconductor nanowires. These experimental results clearly indicate that, the substrate temperature is a key factor controlling nanowire morphology. The inventors ascribe this temperature dependence through the varying Ga adatm desorption rate as substrate temperature is varied. At relatively high substrate temperatures, the Ga adatom desorption rate is high, and accordingly the nanowire nucleation process is strongly suppressed. This results in a low nanowire density, c.f. first image 5700A in FIG. 57 at approximately 830° C., and the orientation of the GaN nanowires depends strongly on the surface roughness of the underlying $SiO_x$ thereby leading to random orientations for such low-density GaN nanowires, as also reported by Stoica.

Similarly, with GaN nanowires grown at slightly reduced temperatures, c.f. second image 5700B at approximately 808° C., although some vertically aligned GaN nanowires are formed the general nanowire orientation is still highly dependent on the surface roughness of the underlying $SiO_x$ template. However, with further reduction in the substrate temperature, c.f. third image 5700C in FIG. 57 grown at approximately 780° C. the significantly reduced Ga adatom desorption rate results in an enhanced nucleation process yielding GaN nanowires with a very high density, approximately $10^{10-11}$ cm$^{-2}$, and in this case the GaN nanowires are almost-100% vertically aligned. Due to the high nanowire density, the number of Ga adatoms that can impinge onto any non-vertically orientated nanowires is significantly reduced, due to the shadow effect of the surrounding nanowires. This results in a suppression of growth for non-vertical nanowires essentially promoting the formation of vertically aligned and nearly uniform GaN nanowire arrays on non-patterned templates. Accordingly, for non-patterned template regions, i.e.

by removal of the template or masking the template for example, in addition to surface flatness a high nanowire density is required to achieve vertically aligned GaN nanowires on SiO$_X$ and this may be achieved by optimizing the substrate temperature to support low Ga adatom desorption from the template.

Figure 58:
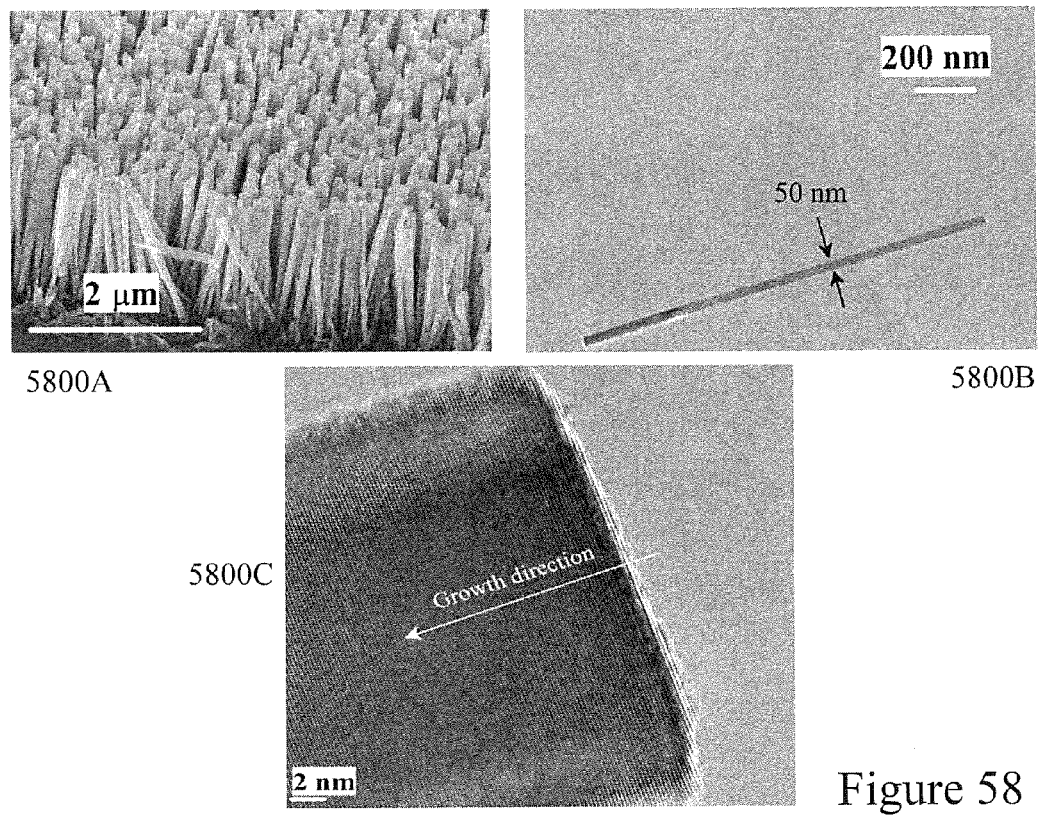
FIG. 58 depicts SEM and TEM images of GaN nanowires according to an embodiment of the invention grown on $SiO_X$ for a longer duration.
Figure 59:
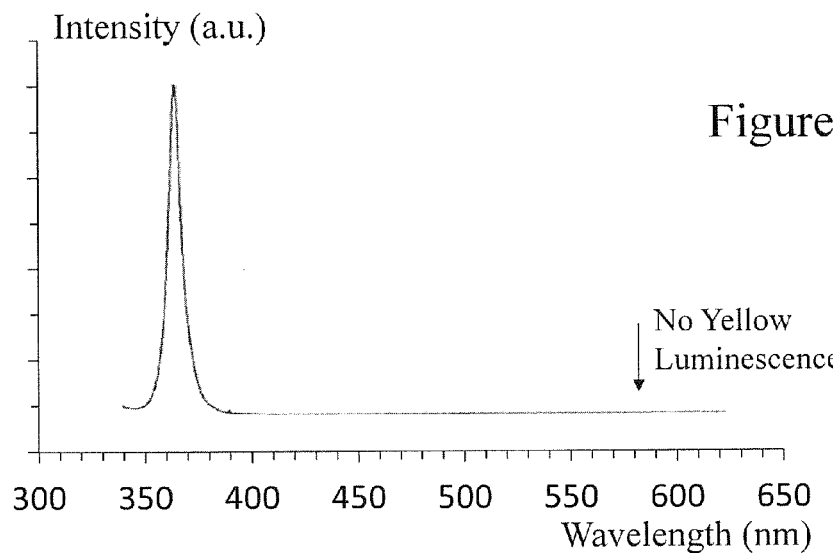
FIG. 59 depicts the PL spectrum at room temperature for a nanowire 325 nm laser on an amorphous substrate according to an embodiment of the invention.

Referring to FIG. 58 in first image 5800A it is evident that the dimensional uniformity and controlled orientation can also be maintained for relatively long GaN nanowires. First image 5800 depicting an SEM image of GaN nanowires grown on a SiO$_X$ template on Si(111) at approximately 780° C. with a nitrogen flow rate of approximately 0.6 sccm for a longer growth duration. Referring to second image 5800B a low-magnification TEM image of a single GaN nanowire with a length of approximately 1.8 µm and a diameter of approximately 50 nm. As can be seen, it exhibits a very high uniformity, i.e. equal size at nanowire top and bottom. Third image 5800C shows a high-resolution TEM image of the "root" of a single GaN nanowire, i.e. the initial portion close to the template, which exhibits clear atomic planes, and is free of stacking faults. Detailed studies of grown nanowires further confirmed that the entire nanowire is also free of dislocations. Referring to FIG. 59 the PL spectrum measured at room temperature of a GaN nanowire is shown with no defect-related yellow luminesce observed. The peak at approximately 363 nm with a linewidth of approximately 6 nm can be ascribed to band-to-band carrier recombination, and appears at a wavelength consistent with the bandgap energy of GaN. Again the inventors found no difference between nanowires grown on Si(111) or Si(100) with SiO$_X$ template deposition in respect of nanowire qualities.

Accordingly, the inventor(s) has(have) demonstrated high-quality, both structurally and optically, vertically aligned GaN nanowires grown on amorphous templates on a large scale. The quality of the nanowires grown is comparable to that of GaN nanowires grown directly on Si substrates within the prior art, see for example Stoica and Consonni as well as Calarco et al in "Nucleation and Growth of GaN Nanowires on Si(111) Performed by Molecular Beam Epitaxy" (Nano. Lett., Vol. 7, pp. 2248-2251), Debnath et al in "Mechanism of Molecular Beam Epitaxy Growth of GaN Nanowires on Si(111)" (Appl. Phys; Lett., Vol. 70, 123117), Bertness et al in "GaN Nanowires Grown by Molecular Beam Epitaxy" (J. Crystal Growth, Vol. 310, pp. 3154) and "GaN Nanowires Grown by Molecular Beam Epitaxy" (IEEE J. Sel. Topics in Quant. Elect., Vol. 17, pp. 847), and Geelhaar et al in " " (IEEE J. Sel. Topics in Quant. Elect., Vol. 17, pp. 878). However, importantly in contrast to the prior art this work by the inventors is based upon establishing a non-epitaxial relationship between the nanowire and the Si substrate. According the inventors expect that nanowire formation can be achieved on essentially any substrate provided that the 2D nuclei, which often rely on the presence of an amorphous interface, e.g. SiN$_x$, SiO$_x$, can be formed and that the subsequent shape transformation of the 2D nuclei is driven by the anisotropies of surface free energies, surface stresses, etc., as well as the interface barriers.

It would be evident to one skilled in the art that high density uniform GaN nanowires on amorphous templates are important for realizing many practical large-area devices, such as LEDs and solar cells. Within the prior art high-efficiency white(full)-color InGaN/GaN nanowire LEDs have been achieved on silicon substrates, see for example the inventor in Nguyen2, Guo, Lin and Sekiguchi et al in "Emission Color Control from Blue to Red with Nanocolumn Diameter of InGaN/GaN Nanocolumn Arrays Grown on Same Substrate" (App. Phys. Lett., Vol. 96, 231104). However, the external quantum efficiency has been severely limited by the optical absorption of the Si substrates upon which these have been manufactured. Accordingly, significantly improved device performance may be achieved for such devices by utilizing amorphous and/or transparent substrates.

To demonstrate the feasibility of such structures upon amorphous substrates the inventor(s) has(have) grown and characterized InGaN/GaN dot-in-a-wire LED heterostructures such as those described supra in respect of embodiments of the invention with an approximately 1.5 µm SiO$_X$ template. The InGaN/GaN dot-in-a-wire LED heterostructures as depicted in first image 6000A in FIG. 60 consist of lower GaN:Si 6030, 10 vertically aligned InGaN/GaN quantum dots in central region 6020, and upper GaN:Mg 6010 upon the SiO$_X$ template 6040 on substrate 6050. Each InGaN quantum dot has a height of approximately 3 nm and is covered by approximately 3 nm GaN barrier. Detailed growth process and characterization of such dot-in-a-wire nanoscale LED heterostructures directly on Si substrate are described supra in respect of embodiments of the invention. Second image 6000B in FIG. 60 depicts a corresponding SEM image for an InGaN/GaN dot-in-a-wire LED heterostructure from which it is evident that the InGaN/GaN nanowires are almost-100% vertically aligned with high uniformity.

Now referring to FIG. 61 there is depicted a plot of the room temperature (300K) PL spectrum of an InGaN/GaN dot-in-a-wire LED heterostructure, shown as first curve 6110, wherein the emission peak wavelength is approximately 650 nm. The relatively large spectral linewidth, approximately 100 nm, is directly related to the compositional variation of the InGaN quantum dots, see Nguyen2. Also depicted for comparison in FIG. 61 is the PL spectrum from the same an InGaN/GaN dot-in-a-wire LED heterostructure structure grown directly onto a Si(111) substrate and shown as second curve 6120. It can be seen that the SiO$_X$ heterostructure has a comparable or even stronger PL emission intensity compared with that from the reference heterostructure grown onto Si(111) directly. The stronger emission from the SiO$_X$ device may be ascribed to the reduced optical absorption from the SiO$_X$ template.

Figure 62:
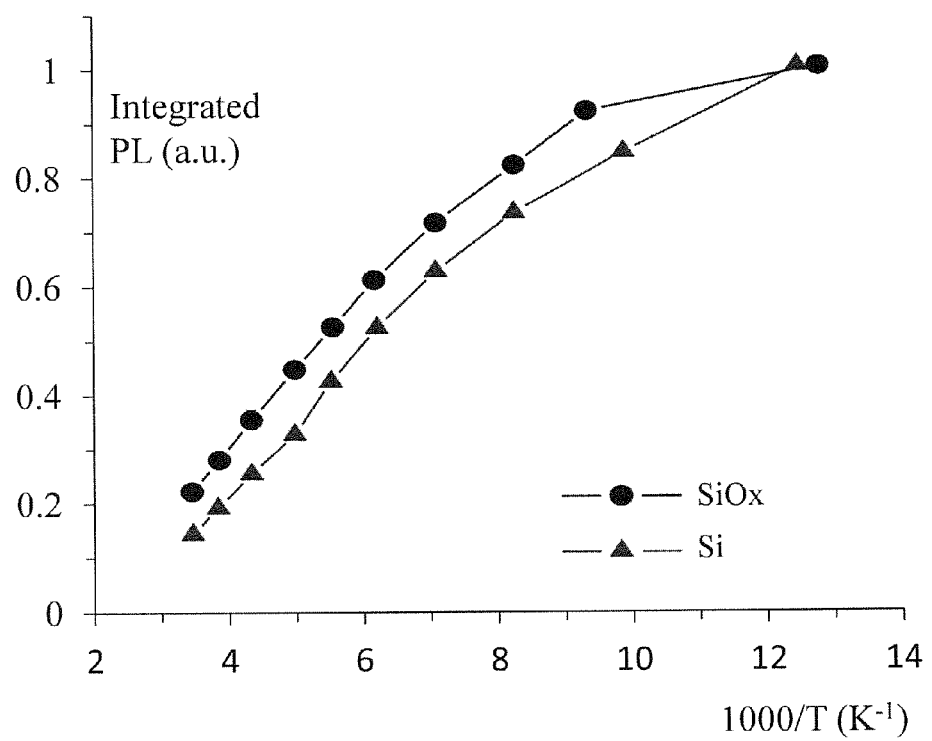
FIG. 62 depicts normalized integrated PL intensities as a function of inverse temperature for LED heterostructures on $SiO_X$ and Si substrates according to embodiments of the invention.

To reveal more details for these two devices grown according to different embodiments of the invention, the inverse-temperature dependent integrated PL intensity was plotted in FIG. 62 over the range from 74K to 300K. The integrated PL intensities at 300K are about 20% and 15% of those measured at 74 K for the two samples respectively. These measurements suggest that the optical performance of InGaN/GaN nanowire LED heterostructures on SiO$_X$ templates may be comparable to, or enhanced with respect to, that achieved from the same structure grown directly onto a Si substrate. Accordingly, embodiments of the invention allow for catalyst-free, highly uniform, vertically aligned GaN nanowires with high crystalline and optical qualities to be attained on SiO$_X$ templates on a large scale. Additionally, embodiments of the invention demonstrate that process tenability in respect of the substrate temperature allows the process to be established in a regime with low adsorption of the group III element adatoms providing the growth site in order to provide the high nanowire density and vertically aligned semiconductor nanowire structures relevant for large-scale device applications. Further, InGaN/GaN dot-in-a-wire heterostructures were also achieved on thick SiO$_X$ templates exhibiting good performance allowing large area semiconductor nanowire solid state emitters and photodetectors/solar cells. Such process tunability and amorphous substrate growth allows for such devices to not only exploit SiO$_X$ or SiN$_x$ templates on silicon but also other substrates including, but not limited to, quartz, sapphire, glass, ceramic, and plastic with non-epitaxial relationships to the nanowires. Accordingly, embodiments of the invention allow for high-efficiency semiconductor heterostructures to be employed on amorphous substrates tailored towards their applications within many emerging solid-state lighting, solar cell, and flat panel displays as well as direct integration to photonic and electronic circuits for a variety of applications.

Within embodiments of the invention described supra in respect of embodiments of the invention reference has been made to dot-within-a-dot, dot-within-a-wire and well-within-a-wire structures. However, it would be evident that other quantum structure combinations may be employed within devices and structures according to embodiments of the invention including, but not limited to, disk-within-a-dot, dot-within-a-disk, disk-within-a-well, and dot-within-a-well as well as other involving other zero-dimensional, one-dimensional, two-dimensional, and three-dimensional structures.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device comprising:
a substrate having at least one semiconductor structure of a plurality of semiconductor structures formed thereupon, the at least one semiconductor structure comprising a first predetermined portion formed from a first wurtzite semiconductor whose growth was initiated by providing nanoscale droplets of a group III element constituent of the wurtzite semiconductor on the surface of the substrate and absent both a foreign catalyst and other constituent elements of the first wurtzite semiconductor; and
the at least one semiconductor structure of the plurality of semiconductor structures having formed upon the first predetermined portion a second predetermined portion comprising a plurality of vertically aligned quantum structures separated by a plurality of barrier layers and a second predetermined portion formed upon the plurality of vertically aligned quantum structures and plurality of barrier layers a second wurtzite semiconductor comprising at least the group III element constituent of the first wurtzite semiconductor.

2. The device according to claim 1, wherein
the first wurtzite semiconductor and the second wurtzite semiconductor are the same compound semiconductor but doped such that one is either p-type or n-type and the other is the other of p-type and n-type.

3. The device according to claim 1, wherein
each quantum structure of the plurality of vertically aligned quantum structures is a self-organized quantum dot; and
the semiconductor structure is a nanowire.

4. The device according to claim 1, wherein
the semiconductor structure is modulation doped during growth.

5. The device according to claim 1, wherein
the device is an optical emitter; and
the spectral emission profile of the device may be varied by varying at least one of:
the number of vertically aligned quantum structures;
the composition of each vertically aligned quantum structure within the plurality of vertically aligned quantum structures; and
the geometry of each vertically aligned quantum structure within the plurality of vertically aligned quantum structures.

6. The device according to claim 1, wherein
the device is an optical emitter emitting in one of the visible, near ultraviolet and near infrared regions of the electromagnetic spectrum.

7. The device according to claim 1, wherein
the substrate is lattice mismatched to the first wurtzite semiconductor.

8. The device according to claim 1, further comprising
a layer of $SiO_X$ of predetermined thickness disposed upon the substrate upon which the at least one semiconductor nanostructure of a plurality of semiconductor nanostructures is grown.

9. The device according to claim 1, wherein
the first wurtzite semiconductor is selected from the group comprising gallium nitride, indium nitride and aluminum nitride.

10. The device according to claim 1, wherein
the at least one quantum structure of a plurality of quantum structures comprises at least one of:
at least one of a binary, a ternary and a quaternary semiconductor alloy of gallium, aluminum, indium, and nitrogen; and
at least one of a binary, a ternary and a quaternary semiconductor alloy of gallium, aluminum, indium, and phosphorous.

11. The device according to claim 1, wherein
the device is a solar cell absorbing in at least one of the visible, near ultraviolet and near infrared regions of the electromagnetic spectrum.

12. The device according to claim 1, further comprising
a plurality of quantum dots colloidally distributed, wherein a predetermined portion of the plurality of vertically aligned quantum structures emit within a predetermined wavelength range to optically pump the colloidally distributed plurality of quantum dots.

13. The device according to claim 1, wherein
the plurality of barrier layers enhance the hole injection and transport in the plurality of vertically aligned quantum structures.

14. The device according to claim 1, further comprising
a quantum well disposed between the uppermost quantum structure of the plurality of vertically aligned quantum structures.

15. The device according to claim 1, further comprising
an electron barrier layer disposed above the uppermost quantum structure of the plurality of vertically aligned quantum structures but below the second wurtzite semiconductor; and
a quantum well disposed between the electron barrier layer and the second wurtzite semiconductor.

* * * * *